(12) United States Patent
Lee

(10) Patent No.: US 8,017,860 B2
(45) Date of Patent: Sep. 13, 2011

(54) METHOD AND STRUCTURE FOR THIN FILM PHOTOVOLTAIC MATERIALS USING BULK SEMICONDUCTOR MATERIALS

(75) Inventor: Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 734 days.

(21) Appl. No.: 11/804,019

(22) Filed: May 15, 2007

(65) Prior Publication Data
US 2008/0092953 A1 Apr. 24, 2008

Related U.S. Application Data

(60) Provisional application No. 60/800,801, filed on May 15, 2006.

(51) Int. Cl.
*H01L 31/0264* (2006.01)
(52) U.S. Cl. ........................ 136/252; 136/265
(58) Field of Classification Search ........... 136/243–265
See application file for complete search history.

(56) References Cited

U.S. PATENT DOCUMENTS

| | | |
|---|---|---|
| 4,335,266 A | 6/1982 | Mickelsen et al. |
| 4,441,113 A | 4/1984 | Madan |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |

(Continued)

FOREIGN PATENT DOCUMENTS
AU 7865198 2/1999
(Continued)

OTHER PUBLICATIONS

Huang et al., Photoluminescence and Electroluminescence of ZnS:Cu Nanocrystals in Polymeric Networks, Applied Physics, Lett. 70 (18), May 5, 1997, pp. 2335-2337.

(Continued)

*Primary Examiner* — Jessica L Ward
*Assistant Examiner* — Kevin E Yoon
(74) *Attorney, Agent, or Firm* — Kilpatrick Townsend & Stockton LLP

(57) ABSTRACT

A photovoltaic device and related methods. The device has a structured material positioned between an electron collecting electrode and a hole collecting electrode. An electron transporting/hole blocking material is positioned between the electron collecting electrode and the structured material. In a specific embodiment, negatively charged carriers generated by optical absorption by the structured material are preferentially separated into the electron transporting/hole blocking material. In a specific embodiment, the structured material has an optical absorption coefficient of at least $10^3$ cm$^{-1}$ for light comprised of wavelengths within the range of about 400 nm to about 700 nm.

7 Claims, 21 Drawing Sheets

U.S. PATENT DOCUMENTS

| | | | |
|---|---|---|---|
| 4,661,370 A | 4/1987 | Tarrant | |
| 4,663,495 A | 5/1987 | Berman et al. | |
| 4,724,011 A | 2/1988 | Turner et al. | |
| 4,751,149 A | 6/1988 | Vijayakumar et al. | |
| 4,775,425 A | 10/1988 | Guha et al. | |
| 4,798,660 A | 1/1989 | Ermer et al. | |
| 4,816,082 A | 3/1989 | Guha et al. | |
| 4,915,745 A | 4/1990 | Pollock et al. | |
| 4,950,615 A | 8/1990 | Basol et al. | |
| 4,996,108 A | 2/1991 | Divigalpitiya et al. | |
| 5,008,062 A | 4/1991 | Anderson et al. | |
| 5,028,274 A | 7/1991 | Basol et al. | |
| 5,039,353 A | 8/1991 | Schmitt | |
| 5,045,409 A | 9/1991 | Eberspacher et al. | |
| 5,078,803 A | 1/1992 | Pier et al. | |
| 5,125,984 A | 6/1992 | Kruehler et al. | |
| 5,133,809 A | 7/1992 | Sichanugrist et al. | |
| 5,137,835 A | 8/1992 | Karg | |
| 5,180,686 A | 1/1993 | Banerjee et al. | |
| 5,211,824 A | 5/1993 | Knapp | |
| 5,231,047 A | 7/1993 | Ovshinsky et al. | |
| 5,248,345 A | 9/1993 | Sichanugrist et al. | |
| 5,261,968 A | 11/1993 | Jordan | |
| 5,298,086 A | 3/1994 | Guha et al. | |
| 5,336,623 A | 8/1994 | Sichanugrist et al. | |
| 5,346,853 A | 9/1994 | Guha et al. | |
| 5,474,939 A | 12/1995 | Pollock et al. | |
| 5,501,744 A | 3/1996 | Albright et al. | |
| 5,512,107 A | 4/1996 | Van den Berg | |
| 5,536,333 A | 7/1996 | Foote et al. | |
| 5,578,503 A | 11/1996 | Karg et al. | |
| 5,665,175 A | 9/1997 | Safir | |
| 5,676,766 A | 10/1997 | Probst et al. | |
| 5,977,476 A | 11/1999 | Guha et al. | |
| 5,981,868 A | 11/1999 | Kushiya et al. | |
| 5,985,691 A | 11/1999 | Basol et al. | |
| 6,040,521 A | 3/2000 | Kushiya et al. | |
| 6,048,442 A | 4/2000 | Kushiya et al. | |
| 6,092,669 A | 7/2000 | Kushiya et al. | |
| 6,127,202 A | 10/2000 | Kapur et al. | |
| 6,166,319 A | 12/2000 | Matsuyama | |
| 6,310,281 B1 | 10/2001 | Wendt et al. | |
| 6,328,871 B1 | 12/2001 | Ding et al. | |
| 6,372,538 B1 | 4/2002 | Wendt et al. | |
| 6,690,041 B2 | 2/2004 | Armstrong et al. | |
| 6,784,492 B1 | 8/2004 | Morishita | |
| 6,852,920 B2 | 2/2005 | Sager et al. | |
| 6,878,871 B2 | 4/2005 | Scher et al. | |
| 7,194,197 B1 | 3/2007 | Wendt et al. | |
| 7,319,190 B2 | 1/2008 | Tuttle | |
| 2002/0063065 A1 | 5/2002 | Sonoda | |
| 2003/0075717 A1 | 4/2003 | Kondo et al. | |
| 2004/0084080 A1* | 5/2004 | Sager et al. | 136/263 |
| 2004/0095658 A1 | 5/2004 | Buretea et al. | |
| 2004/0110393 A1 | 6/2004 | Munzer et al. | |
| 2004/0245912 A1 | 12/2004 | Thurk et al. | |
| 2004/0252488 A1 | 12/2004 | Thurk | |
| 2005/0098205 A1* | 5/2005 | Roscheisen et al. | 136/263 |
| 2005/0164432 A1 | 7/2005 | Lieber et al. | |
| 2005/0287717 A1 | 12/2005 | Heald et al. | |
| 2006/0034065 A1 | 2/2006 | Thurk | |
| 2006/0040103 A1 | 2/2006 | Whiteford et al. | |
| 2006/0051505 A1 | 3/2006 | Kortshagen et al. | |
| 2006/0096536 A1 | 5/2006 | Tuttle | |
| 2006/0096537 A1 | 5/2006 | Tuttle | |
| 2006/0096635 A1 | 5/2006 | Tuttle | |
| 2006/0102230 A1 | 5/2006 | Tuttle | |
| 2006/0219288 A1 | 10/2006 | Tuttle | |
| 2006/0219547 A1 | 10/2006 | Tuttle | |
| 2006/0220059 A1 | 10/2006 | Satoh et al. | |
| 2006/0249202 A1* | 11/2006 | Yoo et al. | 136/263 |
| 2007/0089782 A1 | 4/2007 | Scheuten et al. | |
| 2007/0116892 A1 | 5/2007 | Zwaap | |
| 2007/0116893 A1 | 5/2007 | Zwaap | |
| 2007/0151596 A1 | 7/2007 | Nasuno et al. | |
| 2007/0169810 A1 | 7/2007 | Van Duern et al. | |
| 2007/0264488 A1* | 11/2007 | Lee | 428/323 |
| 2007/0283998 A1 | 12/2007 | Kuriyagawa et al. | |
| 2007/0289624 A1 | 12/2007 | Kuriyagawa et al. | |
| 2008/0032044 A1 | 2/2008 | Kuriyagawa et al. | |
| 2008/0041446 A1 | 2/2008 | Wu et al. | |
| 2008/0092945 A1 | 4/2008 | Munteanu et al. | |
| 2008/0092953 A1 | 4/2008 | Lee | |
| 2008/0105294 A1 | 5/2008 | Kushiya et al. | |
| 2008/0110495 A1 | 5/2008 | Onodera et al. | |

FOREIGN PATENT DOCUMENTS

| | | |
|---|---|---|
| AU | 2001/40599 A1 | 8/2001 |
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | WO 01/57932 A1 | 8/2001 |
| WO | WO 2005011002 | 2/2005 |
| WO | WO 2007/077171 A2 | 7/2007 |
| WO | WO 2008/025326 A2 | 3/2008 |

OTHER PUBLICATIONS

Huang et al., Preparation of ZnxCd1_xS Nanocomposites in Polymer Matrices and their Photophysical Properties, Langmuir 1998, 14, pp. 4342-4344.

Yang et al., Fabrication and Characteristics of ZnS Nanocrystals/ Polymer Composite Doped with Tetraphenylbenzidine Single Layer Structure Light-emitting Diode, Applied Physics Lett. vol. 69 (3), Jul. 15, 1996, pp. 377-379.

Yang et al., Preparation, Characterization and Electroluminescence of ZnS Nanocrystals in a Polymer Matrix, J. Mater. Chem., 1997, 7(1), pp. 131-133.

Yang et al., Electroluminescence from ZnS/CdS Nanocrystals/Polymer Composite, Synthetic Metals 91, (1997) 347-349.

International Solar Electric Technology, Inc. (ISET) "Thin Film CIGS", http://www.isetinc.com/cigs.html, Oct. 1, 2008.

Kapur et al., "Fabrication of Light Weight Flexible CIGS Solar Cells for Space Power Applications", Mat. Res. Soc. Proc. vol. 668, (2001) pp. H3.5.1-H3.5.6, Materials Research Society, Warrendale, PA 15086.

Kapur et al., Non-Vacuum Printing Process for CIGS Solar Cells on Rigid and Flexible Substrates 29th IEEE Photovoltaic Specialists Conf., New Orleans, LA, IEEE, (2002) p. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43 (2003).

Kapur et al., "Non-Vacuum Processing of CuIn$_{1-x}$Ga$_x$Se$_2$ Solar Cells on Rigid and Flexible Substrates using Nanoparticle Inks", Thin Solid Films, vol. 431-432 (2003) pp. 53-57 Proceedings of Symposium B, European Materials Research Society, Strasbourg, France.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Nanoparticle Oxides Precursor Inks for Thin Film Copper Indium Gallium Selenide (CIGS) Solar Cells", Mat. Res. Soc. Proc. vol. 668, (2001) pp. H2.6.1-H2.6.7, Materials Research Society, Warrendale, PA 15086.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Onuma et al., Preparation and Characterization of CuInS Thin Films Solar Cells with Large Grain, Elsevier Science B.V; Solar Energy Materials & Solar Cells 69 (2001) pp. 261-269.

* cited by examiner

Methods of Deposition Nanostructured Materials (NSM)

A. Solution Phase Deposition (SPD)

Methods of Deposition
Nanostructured Materials (NSM)

Methods of Deposition Nanostructured Materials (NSM)

D. Solution Phase Growth (SPG)

E. Vapor Phase Deposition (VPD)

* Evaporation     * Sputtering

METHOD AND STRUCTURE FOR THIN FILM PHOTOVOLTAIC MATERIALS USING BULK SEMICONDUCTOR MATERIALS

CROSS REFERENCES TO RELATED APPLICATIONS

This application claims priority to U.S. Provisional Application No. 60/800,801, filed on May 15, 2006; commonly owned and in the name of Howard W. H. Lee, of which is hereby incorporated by reference for all purposes.

BACKGROUND OF THE INVENTION

The present invention relates generally to photovoltaic materials. More particularly, the present invention provides a method and structure for manufacture of photovoltaic materials using a thin film process including Group IV materials (e.g., silicon, germanium) and metal oxides, such as copper oxide and the like. Merely by way of example, the present method and structure have been implemented using a nano-structure configuration, but it would be recognized that the invention may have other configurations such as bulk materials and the like.

From the beginning of time, human beings have been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles Calif. Other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to the present invention, techniques related to photovoltaic materials are provided. More particularly, the present invention provides a method and structure for manufacture of photovoltaic materials using a thin film process including Group IV materials (e.g., silicon, germanium, silicon-germanium alloys) and metal oxides, such as copper oxide and the like. Merely by way of example, the present method and structure have been implemented using a nanostructure configuration, but it would be recognized that the invention may have other configurations such as bulk materials and the like.

In a specific embodiment, the present invention provides a photovoltaic composite structured material. In a specific embodiment, the material includes a first structured material and a second structured material. The terms "first" and "second" should be interpreted by their ordinary meanings and are not intended to be limiting. An intermixed region is provided by the first structured material and the second structured material. In a specific embodiment, the term "intermixed region" should be interpreted by its ordinary meaning and should not be construed to be limiting. A first electron affinity and a first ionization potential characterize the first structured material. A second electron affinity and a second ionization potential characterize the second structured material. The first electron affinity is less than the second electron affinity and the first ionization potential is less than the second ionization potential according to a preferred embodiment. In a specific embodiment, the second electron affinity is less than the first ionization potential. The material also has an optical absorption coefficient of at least $10^3$ cm$^{-1}$ for light comprised of wavelengths within the range of about 400 nm to about 700 nm characterizing at least one or both of the first structured material and the second structured material.

In an alternative specific embodiment, the present invention provides a photovoltaic composite material In a specific embodiment, the material includes a first structured material and a second structured material. A first electron affinity and a first ionization potential characterize the first structured material. A second electron affinity and a second ionization potential characterize the second structured material. In a preferred embodiment, the first ionization potential is less than the second ionization potential and the first electron affinity is less than the second electron affinity. In a specific embodiment, the second electron affinity is less than the first ionization potential. An optical absorption coefficient of at least $10^3$ cm$^{-1}$ for light comprised of wavelengths within the range of about 400 nm to about 700 nm characterizes at least one or both of the first structured material and the second structured material.

In yet an alternative embodiment, the present invention provides a photovoltaic composite material The material includes a first structured material, a second structured material, and a third structured material. In a preferred embodiment, an intermixed region is provided by the first structured material, the second structured material and the third structured material. A first electron affinity and a first ionization potential characterize the first structured material. A second electron affinity and a second ionization potential characterize the second structured material. A third electron affinity and a third ionization potential characterize the third structured material. The first electron affinity is less than the second electron affinity, which is less than the third electron affinity. The first ionization potential is less than the second ionization potential, which is less than the third ionization potential. The third electron affinity is less than the first ionization potential. An optical absorption coefficient of at least $10^3$ cm$^{-1}$ for light comprised of wavelengths within the range of about 400 nm to about 700 nm characterizes at least one, two or all three of the first structured material, the second structured material, and the third structured material.

In yet an alternative specific embodiment, the present invention provides a photovoltaic composite material An electron transporting/hole blocking material is positioned on one side of the structured material according to a specific embodiment. A hole transporting/electron blocking material is positioned on the side of the structured material opposite from the electron transporting/hole blocking material. An intermixed region is provided by the structured material and the electron transporting/hole blocking material. An intermixed region is provided by the structured material and the hole transporting/electron blocking material. In a specific embodiment, negatively charged carriers are generated by optical absorption by the structured material are preferentially separated into the electron transporting/hole blocking material. In a specific embodiment, positively charged carriers are generated by optical absorption by the structured material are preferentially separated into the hole transporting/electron blocking material. The structured material has an optical absorption coefficient of at least $10^3$ cm$^{-1}$ for light comprised of wavelengths within the range of about 400 nm to about 700 nm according to a specific embodiment.

In yet an alternative specific embodiment, the present invention provides a photovoltaic composite material An electron transporting/hole blocking material is positioned on one side of the structured material according to a specific embodiment. An intermixed region is provided by the structured material and the electron transporting/hole blocking material. In a specific embodiment, negatively charged carriers are generated by optical absorption by the structured material are preferentially separated into the electron transporting/hole blocking material. The structured material has an optical absorption coefficient of at least $10^3$ cm$^{-1}$ for light comprised of wavelengths within the range of about 400 nm to about 700 nm according to a specific embodiment.

In yet an alternative specific embodiment, the present invention provides a photovoltaic composite material A hole transporting/electron blocking material is positioned on one side of the structured material according to a specific embodiment. An intermixed region is provided by the structured material and the hole transporting/electron blocking material. In a specific embodiment, positively charged carriers are generated by optical absorption by the structured material are preferentially separated into the hole transporting/electron blocking material. The structured material has an optical absorption coefficient of at least $10^3$ cm$^{-1}$ for light comprised of wavelengths within the range of about 400 nm to about 700 nm according to a specific embodiment.

Still further, the present invention provides a photovoltaic device. In a specific embodiment, the present device has an electron collecting electrode; a hole collecting electrode; a structured material positioned between the electron collecting electrode and the hole collecting electrode. The structured material has a first structured material and a second structured material. An intermixed region is provided by the first structured material and the second structured material. A first electron affinity and a first ionization potential characterize the first structured material. A second electron affinity and a second ionization potential characterize the second structured material. In a preferred embodiment, the first electron affinity is less than the second electron affinity and the first ionization potential is less than the second ionization potential, and the second electron affinity is less than the first ionization potential. An optical absorption coefficient of at least $10^3$ cm−1 for light comprised of wavelengths within the range of about 400 nm to about 700 nm characterizes at least one or both of the first structured material and the second structured material.

Still further, the present invention provides a photovoltaic device. In a specific embodiment, the present device has an electron collecting electrode; a hole collecting electrode; a structured material positioned between the electron collecting electrode and the hole collecting electrode. The structured material has a first structured material and a second structured material. An intermixed region is provided by the first structured material and the second structured material. A first electron affinity and a first ionization potential characterize the first structured material. A second electron affinity and a second ionization potential characterize the second structured material. In a preferred embodiment, the first electron affinity is less than the second electron affinity, and the first ionization potential is less than the second ionization potential. In a specific embodiment, the second electron affinity is less than the first ionization potential. An electron transporting/hole blocking material is positioned between the electron collecting electrode and the structured material according to a specific embodiment. A hole transporting/electron blocking material is positioned between the hole collecting electrode and the structured material. In a specific embodiment, negatively charged carriers are generated by optical absorption by the structured material are preferentially separated into the electron transporting/hole blocking material. In a specific embodiment, positively charged carriers that are generated by optical absorption by the structured material are preferentially separated into the hole transporting/electron blocking material. An optical absorption coefficient of at least $10^3$ cm$^{-1}$ for light comprised of wavelengths within the range of about 400 nm to about 700 nm characterizes at least one or both of the first structured material and the second structured material.

Still further, the present invention provides a photovoltaic device. In a specific embodiment, the present device has an electron collecting electrode; a hole collecting electrode; a structured material positioned between the electron collecting electrode and the hole collecting electrode. The structured material has a first structured material and a second structured material. An intermixed region is provided by the first structured material and the second structured material. A first electron affinity and a first ionization potential characterize the first structured material. A second electron affinity and a second ionization potential characterize the second structured material. In a preferred embodiment, the first electron affinity is less than the second electron affinity and the first ionization potential is less than the second ionization potential. In a specific embodiment, the second electron affinity is less than the first ionization potential. An electron transporting/hole blocking material is positioned between the electron collecting electrode and the structured material according to a specific embodiment. In a specific embodiment, negatively charged carriers generated by optical absorption by the structured material are preferentially separated into the electron transporting/hole blocking material. An optical absorption coefficient of at least $10^3$ cm$^{-1}$ for light comprised of wavelengths within the range of about 400 nm to about 700 nm characterizes at least one or both of the first structured material and the second structured material.

Still further, the present invention provides a photovoltaic device. In a specific embodiment, the present device has an electron collecting electrode; a hole collecting electrode; a structured material positioned between the electron collecting electrode and the hole collecting electrode. The structured material has a first structured material and a second structured material. An intermixed region is provided by the first structured material and the second structured material. A first electron affinity and a first ionization potential characterize the first structured material. A second electron affinity and a second ionization potential characterize the second structured material. In a preferred embodiment, the first electron affinity is less than the second electron affinity and the first ionization potential is less than the second ionization potential. In a specific embodiment, the second electron affinity is less than the first ionization potential. A hole transporting/electron blocking material is positioned between the hole collecting electrode and the structured material according to a specific embodiment. In a specific embodiment, positively charged carriers generated by optical absorption by the structured material are preferentially separated into the hole transporting/electron blocking material. An optical absorption coefficient of at least $10^3$ cm$^{-1}$ for light comprised of wavelengths within the range of about 400 nm to about 700 nm characterizes at least one or both of the first structured material and the second structured material.

Still further, the present invention provides a photovoltaic device comprised of a structured material positioned between an electron collecting electrode and a hole collecting electrode An electron transporting/hole blocking material is positioned between the electron collecting electrode and the structured material according to a specific embodiment. A hole transporting/electron blocking material is positioned between the hole collecting electrode and the structured material. In a specific embodiment, negatively charged carriers generated by optical absorption by the structured material are preferentially separated into the electron transporting/hole blocking material. In a specific embodiment, positively charged carriers generated by optical absorption by the structured material are preferentially separated into the hole transporting/electron blocking material. The structured material has an optical absorption coefficient of at least $10^3$ cm$^{-1}$ for light comprised of wavelengths within the range of about 400 nm to about 700 nm according to a specific embodiment.

In still an alternative embodiment, the present invention provides a photovoltaic device, e.g., solar cell. The device has a structured material positioned between an electron collecting electrode and a hole collecting electrode. An electron transporting/hole blocking material is positioned between the electron collecting electrode and the structured material. In a specific embodiment, negatively charged carriers generated by optical absorption by the structured material are preferentially separated into the electron transporting/hole blocking material. In a specific embodiment, the structured material has an optical absorption coefficient of at least $10^3$ cm$^{-1}$ for light comprised of wavelengths within the range of about 400 nm to about 700 nm.

In a specific embodiment, the present invention provides a photovoltaic device comprised of a structured material positioned between an electron collecting electrode and a hole collecting electrode. A hole transporting/electron blocking material is positioned between the hole collecting electrode and the structured material. In a specific embodiment, positively charged carriers generated by optical absorption by the structured material are preferentially separated into the hole transporting/electron blocking material. In a specific embodiment, the structured material has an optical absorption coefficient of at least $10^3$ cm$^{-1}$ for light comprised of wavelengths within the range of about 400 nm to about 700 nm.

In yet a further embodiment, the present invention provides a photovoltaic device, e.g., solar cell. The device has a substrate having a substrate surface region. The device has a plurality of structures overlying the surface region. The plurality of structures have a feature size ranging from about a nanometer to about 200 nanometers. The feature size characterizes a distance between two or more of the plurality of structures. Two or more of the plurality of structures have a height ranging from about 25 to about 500 nanometers. A semiconductor material is overlying a surface region of the plurality of structures and substantially fills the distance between the two or more plurality of structures to form a thickness of semiconductor material. The device has a semiconductor material surface region formed from the thickness of semiconductor material and has a separation distance from the height of the two or more plurality of structures to substantially cover the plurality of structures. The device has a thickness ranging from about 50 nanometers to about 2000 nanometers characterizing a sandwiched structure including the plurality of structures and semiconductor material.

In an alternative specific embodiment, the present invention provides a method for forming a photovoltaic composite material. The method includes providing a first structured material, which has a plurality of first structures thereon. The method includes subjecting the plurality of first structures to a fluid having a plurality of second structures having a fluidic characteristic to cause formation of an intermixed region provided by the plurality of first structures and a second structured material formed from the fluid such that the intermixed region is characterized by the plurality of first structures being in substantial contact with the second structured material. The method includes processing the first structured material and the second structured material including the intermixed region using one or more processes to provide a first electron affinity and a first ionization potential characterizing the first structured material and a second electron affinity and a second ionization potential characterizing the second structured material. In a specific embodiment, the first electron affinity is less than the second electron affinity and the first ionization potential is less than the second ionization potential. In a specific embodiment, the second electron affinity is less than the first ionization potential. An optical absorption coefficient of at least $10^3$ cm$^{-1}$ for light comprised of wavelengths is within the range of about 400 nm to about 700 nm characterizing at least one or both of the first structured material and the second structured material.

In an alternative embodiment, the present invention provides a method for forming a photovoltaic composite material. In a specific embodiment, the present invention includes providing a transparent substrate member, which has a surface region. The method includes forming a transparent electrode member overlying the surface region. The method also includes forming a first structured material overlying the transparent electrode member. In a specific embodiment, the first structured material has a plurality of first structures thereon and a first surface region of the first structured material. The method also includes subjecting the first surface region of first structured material to one or more fluids having a plurality of second structures having a fluidic characteristic to cause formation of an intermixed region provided by the plurality of first structures and a second structured material formed from the one or more fluids such that the intermixed region is characterized by the plurality of first structures being in substantial contact with the second structured material. In a specific embodiment, the method also includes processing the first structured material and the second structured material including the intermixed region using one or more processes to provide a first electron affinity and a first ionization potential characterizing the first structured material and a second electron affinity and a second ionization potential characterizing the second structured material. In a preferred embodiment, the first ionization potential is less than the second ionization potential and the first electron affinity is less than the second electron affinity. In a preferred embodiment, the second electron affinity is less than the first ionization potential. In a preferred embodiment, at least one or each of the first structured material and the second structured material is characterized by an optical absorption coefficient of at least $10^3$ cm$^{-1}$ for light comprised of wavelengths within the range of about 400 nm to about 700 nm. The method includes forming an electrode overlying the second structured material.

Depending upon the specific embodiment, one or more of these features may also be included. The present technique provides an easy to use process that relies upon conventional technology that is nanotechnology based, but may also include bulk materials. Such nanotechnology based materials and process lead to higher conversion efficiencies and improved processing according to a specific embodiment. In some embodiments, the method may provide higher efficiencies in converting sunlight into electrical power. Depending upon the embodiment, the efficiency can be about 10 percent or 20 percent or greater for the resulting solar cell according to the present invention. In other application using bulk materials, like efficiencies can also be achieved. Additionally, the method provides a process that is compatible with conventional process technology without substantial modifications to conventional equipment and processes. In a specific embodiment, the present method and structure can also be provided using large scale manufacturing techniques, which reduce costs associated with the manufacture of the photovoltaic devices. In another specific embodiment, the present method and structure can also be provided using solution based processing. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to embodiments of the present invention, techniques related to photovoltaic materials are provided. More particularly, the present invention provides a method and structure for manufacture of photovoltaic materials using a thin film process including Group IV materials (e.g., silicon, germanium, silicon-germanium alloys), metal oxides, and metal sulfides. Merely by way of example, the present method and structure have been implemented using a nanostructured morphology, but it would be recognized that the invention may have other morphologies such as bulk materials and the like. Further details of the embodiments of the present invention can be found throughout the present specification and more particularly below.

Figure 1:
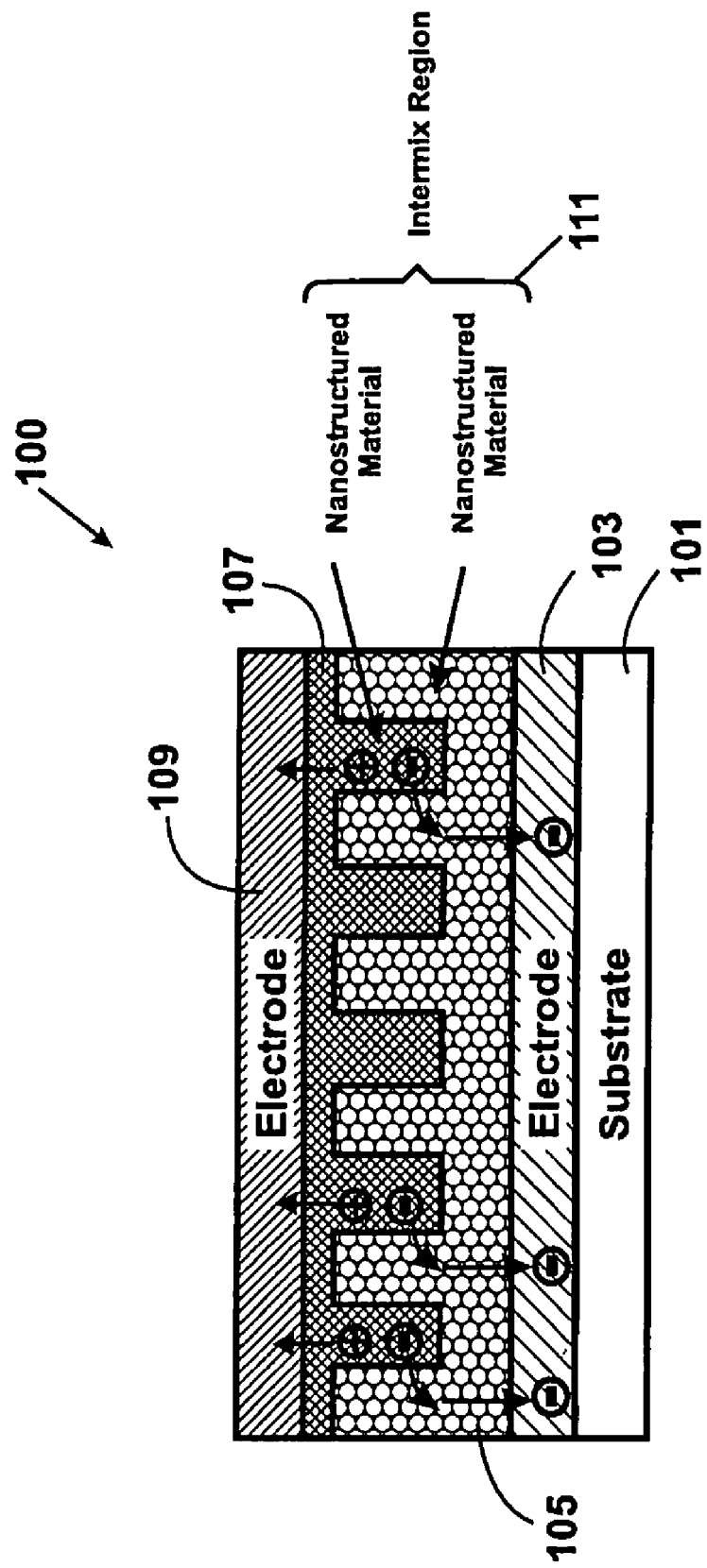
FIG. 1 is a simplified diagram illustrating a nanostructured material for a photovoltaic device according to an embodiment of the present invention.

FIG. 1 is a simplified diagram 100 illustrating a nanostructured material for a photovoltaic device according to an embodiment of the present invention. This diagram is merely an example, which should not unduly limit the scope of the claims herein. One of ordinary skill would recognize other variations, modifications, and alternatives. As shown is a photovoltaic device made of a nanocomposite nanostructured material comprised of, e.g., nanoparticles, quantum dots, quantum wires, nano-columns, nanorods, nanotubes, quantum wells, nanoshells, nanobelts, nanoporous materials. In a specific embodiment, the device includes a substrate member 101. The substrate member includes an overlying surface region. In a specific embodiment, the substrate member can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, or any combination of these, and the like. Alternatively, the substrate member can be a semiconductor material, such as silicon, silicon-germanium alloys, Group III/V, or Group II/VI materials, and the like. Of course, there can be other variations, modifications, and alternatives.

In a specific embodiment, the photovoltaic device includes an electrode structure 103 overlying the surface region of the substrate member. In a specific embodiment, the electrode structure 103 can be made of a suitable material or combination of materials. The suitable material can be a metal, an organic material, or a combination of these, and the like. Depending upon the embodiment, the electrode layer 103 can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be carbon based such as graphite or polymer species. In a specific embodiment, the metal can be encased between barrier metal layers or other suitable layers that may have lower resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

In a specific embodiment, the photovoltaic device includes a first nanostructured material 105 overlying the surface region of the electrode member. In a preferred embodiment, the first nanostructured material is physically and electrically coupled and connected to the surface region of the electrode member. The device also includes a second nanostructured material 107 overlying the first nanostructured material according to a specific embodiment. In a specific embodiment, the first and second nanostructured materials form an intermixed region, which has been described throughout the present specification and more particularly below. The second nanostructured material has a planar surface region according to a specific embodiment. Depending upon the embodiment, the first nanostructured material and the second nanostructured material are comprised of a plurality of nanostructures selected from nanoparticles, quantum dots, quantum wires, nano-columns, nanorods, nanotubes, quantum wells, nanoshells, nanobelts, nanoporous materials, any combination of these, and the like. Of course, there can be other variations, modifications, and alternatives.

In a specific embodiment, each of the nanostructured materials is made of a suitable composite, homogeneous material, or heterogeneous material, including layered materials, graded materials, and the like. In a specific embodiment, the first nanostructured material and the second nanostructured material are comprised of semiconductor materials, e.g., Group IV (e.g., silicon, silicon-germanium alloys, germanium) Group II/VI, Group III/V, combinations of these, and the like. Depending upon the embodiment, the semiconductor material can be an inorganic semiconductor or organic semiconductor material. In other embodiments, either one or both of these nanostructured materials can be made of a metal oxide species. As an example, the metal oxide for the first nanostructure material can be $CuO$, $Cu_2O$, $FeO$, $Fe_2O_3$, combinations of these, and the like. In an alternative embodiment, the first nanostructure material can be metal sulfide species. As merely an example, the metal sulfide species can include $FeS_2$, $SnS$, $Cu_2S$, a combination, and the like. In a yet alternative embodiment, the first nanostructure material can be a semiconductor material comprises of a Group IV semiconductor species. An example of which can be a metal silicide such as $FeSi_2$ and the like. Of course, there can be variations, alternatives, and modifications.

In a specific embodiment, the second nanostructured material is comprised of metal oxides, e.g., $ZnO$, $TiO_2$, $SnO_2$, $WO_3$, $Fe_2O_3$. In an alternative embodiments, the second nanostructured material may comprise metal sulfides such as $SnS_2$, $ZnS$. In other embodiments, the first nanostructured material can be selected from $Si$, $Ge$, $ZnO$, $TiO_2$, $SnO_2$, $WO_3$, $CuO$, $Cu_2O$, $FeO$, $Fe_2O_3$, $Fe_3O_4$, $Cu_2S$, $FeS$, including combinations, and the like. In other general embodiments, the first nanostructured material is selected from metal sulfides, e.g., $Cu_2S$, $FeS$, $FeS_2$, or $SnS$. Of course, there can be variations, alternatives, and modifications.

In other embodiments, the nanostructured materials can have a certain spatial morphology using one or more materials. As an example, the first nanostructured material is comprised of nano-columns selected from Group IV semiconductor materials, Group IV-IV semiconductor materials, and metal oxides, and the like. In an alternative embodiment, the first nanostructured material is comprised of nano-columns selected from $Si$, $Ge$, $SiGe$ alloys. In other embodiments, the first nanostructured material is comprised of nano-columns selected from $ZnO$, $FeO$, $Fe_2O_3$, $CuO$, $Cu_2O$. In certain embodiments, the first nanostructure material can comprise of nanostructured metal sulfides such as $FeS_2$, $SnS$, $Cu_2S$, or others. Alternatively, the first nanostructure material may comprise of a semiconductor material containing a Group IV semiconductor species such as $FeSi_2$, and the like. In yet other embodiments, the first nanostructured material is comprised of nano-tubes selected from Group IV semiconductor materials, Group IV-IV semiconductor materials, and metal oxides. In other embodiments, the first nanostructured material is comprised of nano-tubes comprised of $TiO_2$. In other alternative embodiments, the first nanostructured material is selected from Group IV semiconductor materials, Group IV-IV semiconductor materials, and the second nanostructured material is comprised of nano-columns comprised of metal oxides. Of course, there can be other variations, modifications, and alternatives.

In other embodiments, the first nanostructured material is selected from $Si$, $Ge$, $SiGe$ alloys, and the second nanostructured material is comprised of nano-columns comprised of $ZnO$. In other embodiments, the first nanostructured material is selected from Group IV semiconductor materials, Group IV-IV semiconductor materials, and the second nanostructured material is comprised of nano-tubes comprised of metal oxides. The first nanostructured material is selected from $Si$, $Ge$, $SiGe$ alloys, and the second nanostructured material is comprised of nano-tubes comprised of $TiO_2$ according to a specific embodiment. Alternatively, the first nanostructured material is selected from $Si$, $Ge$, $SiGe$ alloys, and the second nanostructured material is comprised of nanostructured metal sulfides such as $SnS_2$, $ZnS$. In an alternative embodiment, the first nanostructured material is comprised of inorganic semiconductor, and the second nanostructured material is comprised of organic semiconductor. Of course, there can be other variations, modifications, and alternatives.

In a specific embodiment, the photovoltaic device also has an intermixed region 111, which may include the first and second nanostructured materials provided between the first nanostructured material and the second nanostructured material. Depending upon the embodiment, the intermixed region can have certain spatial dimensions. As an example, the thickness of the intermixed region ranges from about 1 nm to about 5000 nm, and the spatial distance characterizing the intermixing ranges from about 1 nm to about 5000 nm. In an alternative embodiment, the thickness of the intermixed region ranges from about 1 nm to about 1000 nm, and the spatial distance characterizing the intermixing ranges from about 1 nm to about 1000 nm. Still further, the thickness of the intermixed region ranges from about 1 nm to about 500 nm, and the spatial distance characterizing the intermixing ranges from about 1 nm to about 500 nm. Alternatively, the thickness of the intermixed region ranges from about 1 nm to about 100 nm, and the spatial distance characterizing the intermixing ranges from about 1 nm to about 100 nm. In other embodiments, the thickness of the intermixed region ranges from about 1 nm to about 50 nm, and the spatial distance characterizing the intermixing ranges from about 1 nm to about 50 nm. Alternatively, the thickness of the intermixed region ranges from about 1 nm to about 50 nm, and the spatial distance characterizing the intermixing ranges from about 1 nm to about 10 nm. In other embodiments, the thickness of the intermixed region ranges from about 1 nm to about 50 nm, and the spatial distance characterizing the intermixing ranges from about 1 nm to about 5 nm. Of course, there can be other variations, modifications, and alternatives.

In a specific embodiment, the intermixed region has an interface region including the first and second nanostructured materials. That is, the interface region substantially contacts physically and electrically the first and second nanostructure materials, as shown, according to a specific embodiment. In a preferred embodiment, the interface region can be an integrated structure including first and second nanostructured materials. Alternatively, the interface region can be two separate structures that are contacting each other according to an alternative embodiment. Of course, there can be other variations, modifications, and alternatives.

Figure 1A:
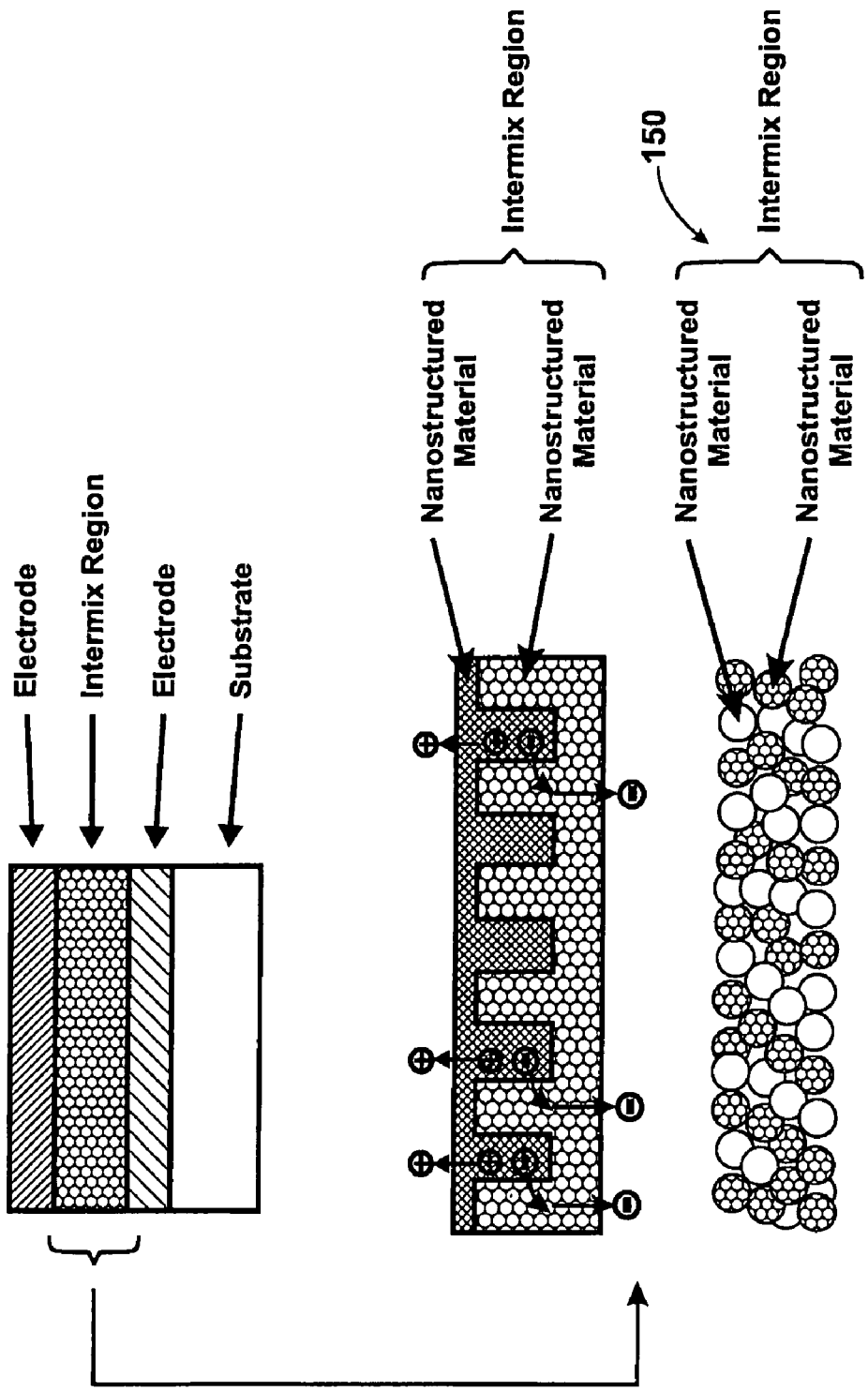
FIG. 1A is a simplified diagram illustrating an intermixed region of the device of FIG. 1 according to an embodiment of the present invention.
Figure 2:
FIGS. 2 through 6 are simplified diagrams of an illustration of a method of fabricating a nanostructured material for a photovoltaic device according to an embodiment of the present invention.

Referring to FIG. 1A, an intermixed region of the photovoltaic device of FIG. 1 according to an embodiment of the present invention is illustrated. This diagram is merely an example, which should not unduly limit the scope of the claims herein. One of ordinary skill in the art would recognize many variations, alternatives, and modifications. As shown, the intermixed region 150 includes nanostructured materials from each of the first and second nanostructured materials. In a specific embodiment, the intermixed region actually includes intermixed nanostructures from each of the nanostructured materials. Alternatively, the intermixed region can include an interface region that separates each of the nanostructured materials according to a specific embodiment. That is, the intermixed region can include one or more portions of each of the nanostructured materials and/or be an entirety of each of the nanostructured materials according to a specific embodiment. Of course, one or ordinary skill in the art would recognize many variations, modifications, and alternatives. Additionally, the interface region described herein may be implemented in one or more or all of the embodiments described herein and throughout the present patent specification.

In a specific embodiment, the photovoltaic device also has first electron affinity and a first ionization potential that characterize the first nanostructured material. A second electron affinity and a second ionization potential characterize the second nanostructured material according to a specific embodiment. In a preferred embodiment, the first electron affinity is less than the second electron affinity, and the first ionization potential is less than the second ionization potential, and the second electron affinity is less than the first ionization potential according to a preferred embodiment. In a preferred embodiment, the material also has an optical absorption coefficient of at least $10^3$ cm$^{-1}$ for light comprised of wavelengths within the range of about 400 nm to about 700 nm characterizing at least one or both of the first nanostructured material and the second nanostructured material. Of course, there can be other variations, modifications, and alternatives.

In a specific embodiment, the photovoltaic device has certain electron affinity and ionization potentials characterizing each of the nanostructured materials. In a specific embodiment, the electron affinity and the ionization potential of first nanostructured material is less than the electron affinity and the ionization potential of second nanostructured material, respectively, by at least 100 meV. In other embodiments, the electron affinity and the ionization potential of the first nanostructured material is less than the electron affinity and the ionization potential of the second nanostructured material, respectively, by at least 300 meV. In other embodiments, the electron affinity and the ionization potential of the first nanostructured material is less than the electron affinity and the ionization potential of the second nanostructured material, respectively, by at least 500 meV. Of course, there can be other variations, modifications, and alternatives.

The nanostructured materials are characterized by a bandgap according to a specific embodiment. The bandgap of at least one or both of the nanostructured materials is within the range of about 1.0 eV to about 2.0 eV according to a specific embodiment. In an alternative specific embodiment, the bandgap of at least one or both of the nanostructured materials is within the range of about 1.2 eV to about 1.8 eV. Alternatively, the bandgap of at least one or both of nanostructured materials is within the range of about 1.3 eV to about 1.6 eV. Of course, there can be other variations, modifications, and alternatives.

The nanostructured materials also have a carrier mobility according to a specific embodiment. The carrier mobility of one the nanostructured material is within the range of about $10^{-6}$ cm$^2$/V-s to about 5000 cm$^2$/V-s according to a specific embodiment. In another embodiment, the carrier mobility of one of the nanostructured material is within the range of about $10^{-3}$ cm$^2$/V-s to about 1000 cm$^2$/V-s. In other embodiments, the carrier mobility of one the nanostructured material is within the range of about 1 cm$^2$/V-s to about 100 cm$^2$/V-s. Of course, there can be other variations, modifications, and alternatives.

As shown, the photovoltaic device has positive charge carriers and negative charge carriers generated by optical absorption by the nanostructured material separate at the interface between the first nanostructured material and the second nanostructured material according to a specific embodiment. The negative charge carriers transport in the nanostructured material with the larger electron affinity and the positive charge carriers transport in the nanostructured material with the smaller ionization potential. In a specific embodiment, the charge carriers undergo majority carrier transport within the first nanostructured material and the second nanostructured material. Of course, there can be other variations, modifications, and alternatives.

In a specific embodiment, the photovoltaic device includes an electrode structure 109 overlying the surface region of the second nanostructured material. In a specific embodiment, the electrode structure can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be a carbon based such as graphite or polymer species. In a specific embodiment, the metal can be encased between barrier metal layers or other suitable layers that may have lower resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives. Further details of way of making the present device can be found throughout the present specification and more particularly below.

A method according to an embodiment of the present invention for forming a nanocomposite nanostructured material for a photovoltaic device is briefly describe below.

1. Provide a substrate (e.g., glass) including a surface region;
2. Clean (e.g., RCA, sonic, ultrasonic) the surface region;
3. Form an electrode layer overlying the surface region;
4. Form a first nanostructured material (e.g., nanoparticles, quantum dots, quantum wires, nano-columns, nanorods, nanotubes, quantum wells, nanoshells, nanobelts, nanoporous materials) overlying the electrode layer;
5. Form a second nanostructured material (e.g., nanoparticles, quantum dots, quantum wires, nano-columns, nanorods, nanotubes, quantum wells, nanoshells, nanobelts, nanoporous materials) overlying the first nanostructured material such that the first nanostructured material is intermixed with the second nanostructured material;
6. Cause formation of an intermixed region provided between the first nanostructured material and the second nanostructured material;
7. Process at least the intermixed region to provide the first nanostructured material to be at a first electron affinity and a first ionization potential;
8. Process at least the intermixed region to provide the second nanostructured material to be at a second electron affinity and a second ionization (step 7 and 8 may be concurrent and/or overlap depending upon the specific embodiment);
9. Form an electrode structure overlying the second nanostructured material;
10. Perform other steps, as desired; and
11. Provide a photovoltaic device including the intermixed region such that the first electron affinity is less than the second electron affinity and the first ionization potential is less than the second ionization potential and such that an optical absorption coefficient of at least $10^3$ cm$^{-1}$ for light comprised of wavelengths within the range of about 400 nm to about 700 nm characterizes at least one or both of the first nanostructured material and the second nanostructured material.

The above sequence of steps provides a method according to an embodiment of the present invention. As shown, the method uses a combination of steps including a way of forming a nanocomposite nanostructured material for photovoltaic applications according to an embodiment of the present invention. Other alternatives can also be provided where steps are added, one or more steps are removed, or one or more steps are provided in a different sequence without departing from the scope of the claims herein. Further details of the present method according to a specific embodiment can be found throughout the present specification and more particularly below.

FIGS. 2 through 6 are simplified diagrams of an illustration of a method of fabricating a nanostructured material for a photovoltaic device according to an embodiment of the present invention. This diagram is merely an example, which should not unduly limit the scope of the claims herein. One of ordinary skill would recognize other variations, modifications, and alternatives. As shown, the present method begins by providing a substrate member 200. The substrate member includes an overlying surface region 201. In a specific embodiment, the substrate member can be an insulator, a conductor, or a semiconductor, including any combination of these, composites, and layered, and the like. In a specific embodiment, the insulator can be a glass, quartz, plastic, ceramic, or other type of homogeneous and/or composite and/or layered material. In a specific embodiment, the conductor can be a metal, a metal alloy, an organic material, or any combination of these, and the like. Alternatively, the substrate member can be a semiconductor material, such as silicon, silicon-germanium alloy, germanium, Group III/V, or Group II/VI materials, and the like. Of course, there can be other variations, modifications, and alternatives.

Referring again to FIG. 2, the method includes a cleaning process to clean the surface region using one or more suitable techniques. In a specific embodiment, the cleaning process can include a wet and/or dry cleaning technique. Examples of such wet cleaning technique include, among others, an RCA clean, a wet dip, an organic wash with solvents such as acetone and/or alcohols, such as isopropyl alcohol, ethanol, any combinations of these and the like. The cleaning process can also include ultra clean water such as deionized water and/or substantially particle free water. In other embodiments, the cleaning process can include a plasma clean using an oxide and/or inert gas species, such as nitrogen, argon, and other suitable gases, and the like. Once cleaning has occurred, the surface region is substantially free from particulates, organic contaminants, metals, and other chemicals, including combinations of these. Of course, one of ordinary skill in the art would recognize other variations, modifications, and alternatives.

Figure 3:
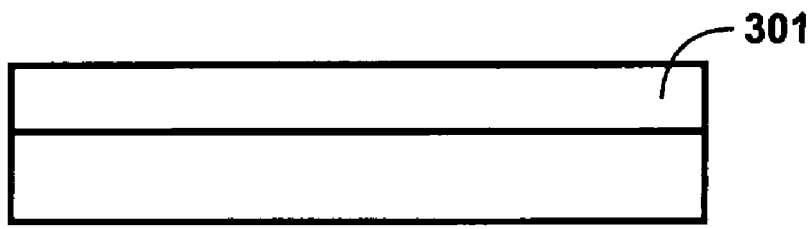
Figure 4:
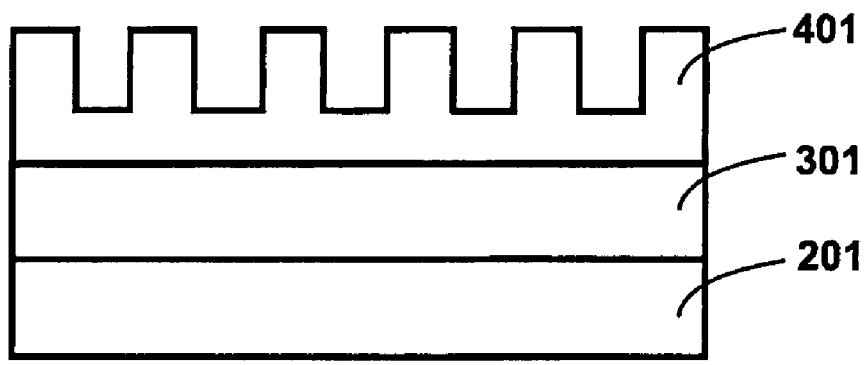

Referring now to FIG. 3, the method includes forming an electrode layer 301 overlying the surface region. In some embodiments, the electrode layer may be formed by conventional deposition methods such as sputtering, evaporation, and solution deposition. As shown, the electrode layer is overlying the surface region of the substrate member. In a specific embodiment, the electrode layer can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, aluminum, platinum, palladium, nickel, cobalt, other suitable metals, including combinations (e.g., alloys), and multilayered structures, and the like. Alternatively, the electrode layer can be a carbon based such as graphite or polymer species. In a specific embodiment, the metal can be encased between barrier metal layers or other suitable layers that may have lower (or higher) resistivity and can also prevent any diffusion of any metal species that can lead to reliability and/or operational failures. For an optically transparent electrode layer, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

Optionally, the present method may include a cleaning process after formation of the electrode layer. In a specific embodiment, the cleaning process can include a wet and/or dry cleaning technique. Examples of such wet cleaning technique include, among others, an RCA clean, a wet dip, an organic wash with solvents such as acetone and/or alcohols, such as isopropyl alcohol, ethanol, any combinations of these and the like. The clean can also include ultra clean water such as deionized water and/or substantially particle free water. In other embodiments, the cleaning process can include a plasma clean using an oxide and/or inert gas species, such as nitrogen, argon, and other suitable gases, and the like. Once cleaning has occurred, the surface region is substantially free from particulates, organic contaminants, metals, and other chemicals, including combinations of these. In a preferred embodiment, the method performs a subsequent deposition process before any contamination of the electrode layer takes place. Of course, one of ordinary skill in the art would recognize other variations, modifications, and alternatives.

Figure 5:
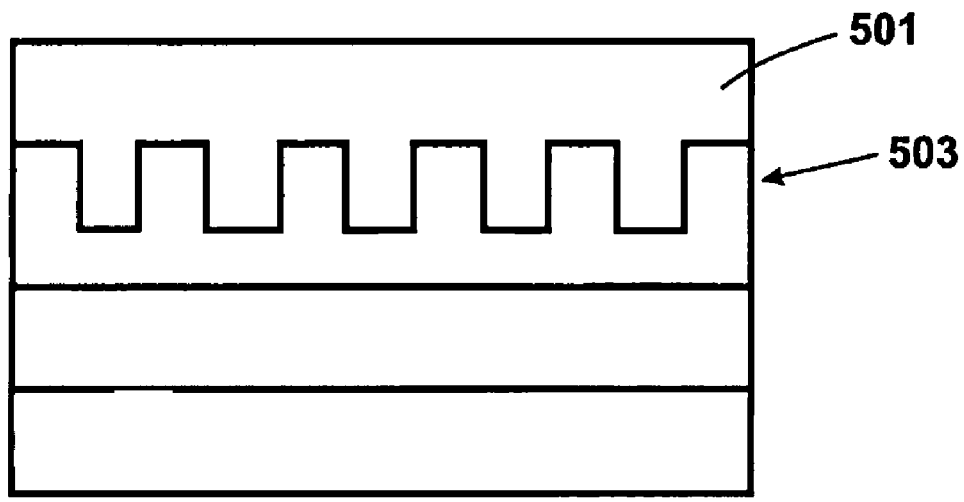

In a specific embodiment, the method forms a first nanostructured material 401 overlying the electrode layer. In a specific embodiment, the first nanostructured material is on and in contact with the electrode layer, physically and electrically. Referring now to FIG. 5, the method forms a second nanostructured material 501 (e.g., nanoparticles, quantum dots, quantum wires, nano-columns, nanorods, nanotubes, quantum wells, nanoshells, nanobelts, nanoporous materials, and others) overlying the first nanostructured material such that the first nanostructured material is intermixed with the second nanostructured material.

In a specific embodiment, the nanostructured material can have a certain geometric shape and/or size. The material can include, among others, nanoparticles, quantum dots, quantum wires, nano-columns, nanorods, nanotubes, quantum wells, nanoshells, nanobelts, nanoporous materials, including combinations of these, and the like. In a specific embodiment, the method can form nanostructured materials in certain categories such as nanopores, nanocolumns, nanotubes, nanoparticles, any combinations of these, and others. Further details of ways of forming these nanostructured materials can be found throughout the present specification and more particularly below.

Referring to FIG. 5 again, the method forms an intermixed region 503 provided between the first nanostructured material and the second nanostructured material. In a specific embodiment, the intermixed region is processed to provide the first nanostructured material to be at a first electron affinity and a first ionization potential and the second nanostructured material to be at a second electron affinity and a second ionization. Depending upon the embodiment, the method can processes these two structures separately or concurrently to provide a photovoltaic device including the intermixed region such that the first electron affinity is less than the second electron affinity. In a preferred embodiment, the first ionization potential is less than the second ionization potential. In a preferred embodiment, the second electron affinity is less than the first ionization potential. Additionally, the photovoltaic device has an optical absorption coefficient of at least $10^3$ cm$^{-1}$ for light comprised of wavelengths within the range of about 400 nm to about 700 nm characterizes at least one or both of the first nanostructured material and the second nanostructured material according to a preferred embodiment.

Figure 6:
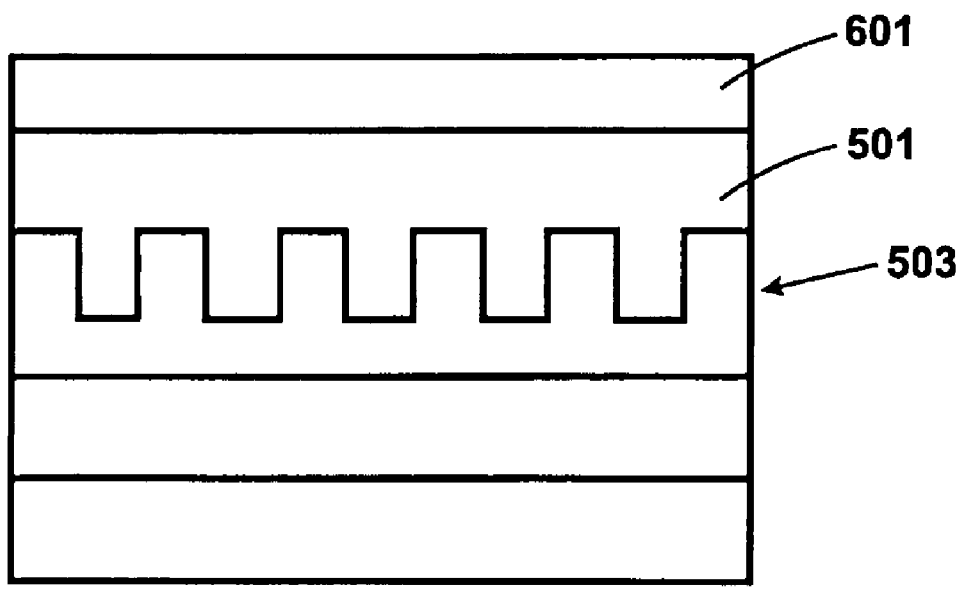

Referring to FIG. 6, the method forms an electrode layer 601 overlying the second nanostructured material. As shown, the electrode structure is overlying a surface region of the second nanostructured material. In a specific embodiment, the electrode structure can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be carbon based such as graphite or polymer species. In a specific embodiment, the metal can be encased between barrier metal layers or other suitable layers that may have lower (or higher) resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Depending upon the embodiment, other steps can be performed. Of course, there can be other variations, modifications, and alternatives.

The above sequence of steps provides a method according to an embodiment of the present invention. As shown, the method uses a combination of steps including a way of forming a nanocomposite nanostructured material for photovoltaic applications according to an embodiment of the present invention. Other alternatives can also be provided where steps are added, one or more steps are removed, or one or more steps are provided in a different sequence without departing from the scope of the claims herein. Further details of the present method and structures according to alternative specific embodiments can be found throughout the present specification and more particularly below.

Figure 7:
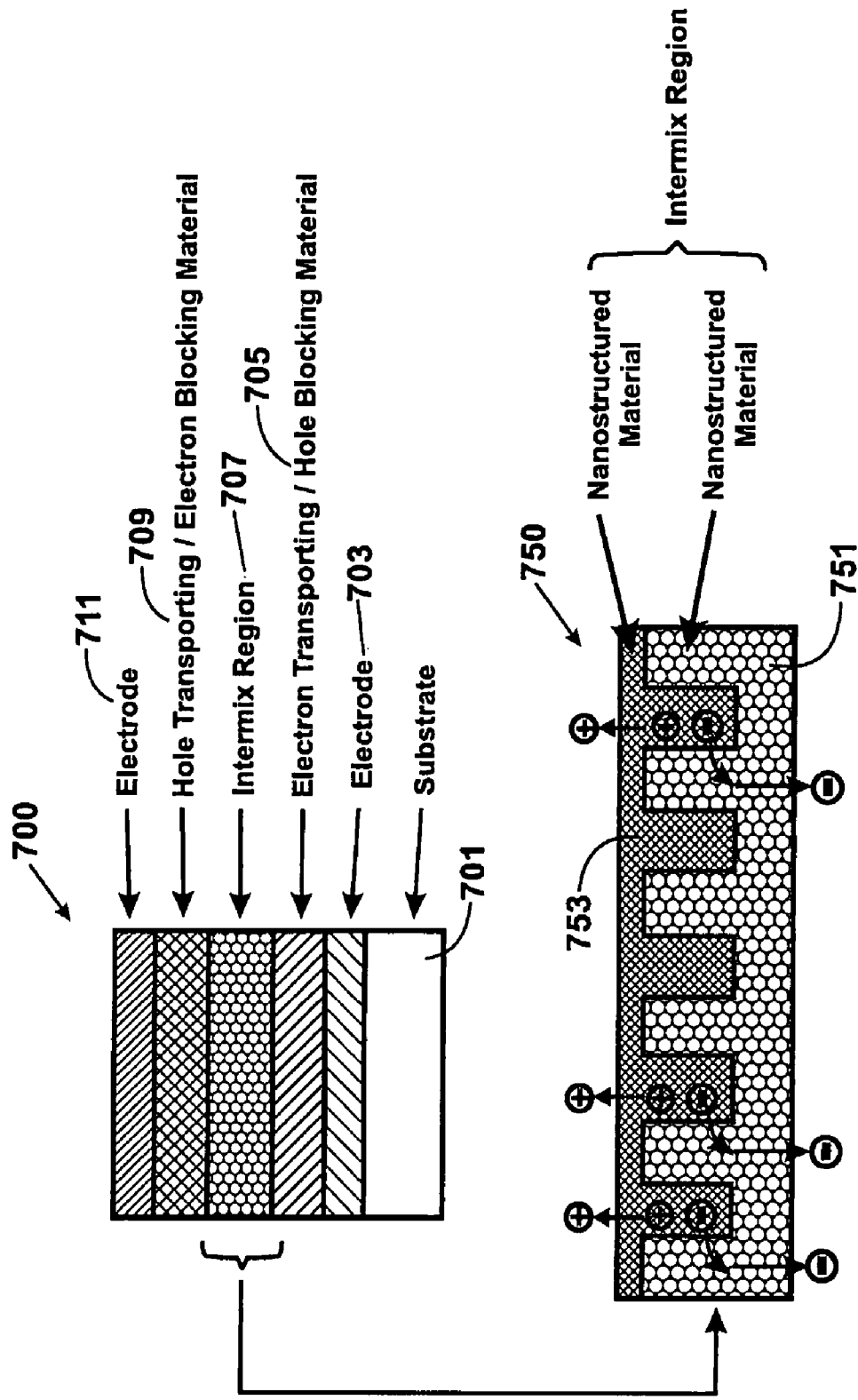
FIG. 7 is a simplified diagram illustrating an alternative nanostructured material for a photovoltaic device according to an embodiment of the present invention.
Figure 8:
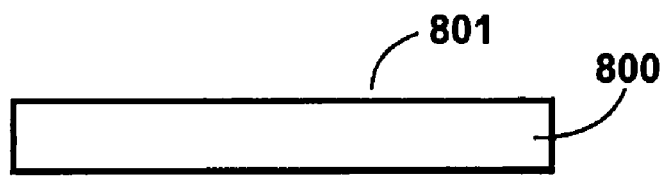
FIGS. 8 through 13 are simplified diagrams of an illustration of an alternative method of fabricating a nanostructured material for a photovoltaic device according to an alternative embodiment of the present invention.

FIG. 7 is a simplified diagram illustrating an alternative nanostructured material 700 for a photovoltaic device according to an embodiment of the present invention. This diagram is merely an example, which should not unduly limit the scope of the claims herein. One of ordinary skill would recognize other variations, modifications, and alternatives. As shown is a photovoltaic device made of a nanostructured material, e.g., nanoparticles, quantum dots, quantum wires, nano-columns, nanorods, nanotubes, quantum wells, nanoshells, nanobelts, nanoporous materials. In a specific embodiment, the device includes a substrate member 701. The substrate member includes an overlying surface region. In a specific embodiment, the substrate member can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, or any combination of these, and the like. Alternatively, the substrate member can be a semiconductor material, such as silicon, silicon-germanium alloys, germanium, Group III/V, or Group II/VI materials, and the like. Of course, there can be other variations, modifications, and alternatives.

In a specific embodiment, the photovoltaic device includes an electrode structure 703 overlying the surface region of the substrate member. In a specific embodiment, the electrode structure can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be carbon based such as graphite or polymer species. In a specific embodiment, the metal can be encased between barrier metal layers or other suitable layers that may have lower (or higher) resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

In a preferred embodiment, the photovoltaic device has an overlying electron transporting/hole blocking material 705. In a specific embodiment, the electron transporting/hole blocking material has suitable properties that facilitate transport of electrons, while also blocking transport of holes. As shown, the electron transporting/hole blocking material is overlying the electrode 703, which is preferably transparent. Additionally, the substrate is also optically transparent according to a specific embodiment. Alternatively, the electrode and substrate are not transparent and may also include reflective materials, which allow for electromagnetic radiation to reflect back toward an active region of the photovoltaic device according to a specific embodiment. As merely an example, the electron transporting/hole blocking material can be an inorganic semiconductor, a metal oxide, organic semiconductors, or any other suitable material, including combinations of materials, layered materials, and the like. In a specific embodiment, the electron transporting/hole blocking material can be a metal oxide including, but not limited to, $ZnO$, $TiO_2$, $SnO_2$, $WO_3$, $Fe_2O_3$, other metal oxides, and the like. Of course, there can be other variations, modifications, and alternatives.

In a specific embodiment, the photovoltaic device includes a first nanostructured material 751 overlying the electron transporting/hole blocking material 705, see also reference numeral 750, which expands intermixed region 709. In a preferred embodiment, the first nanostructured material is electrically coupled to the surface region of the electrode member. The photovoltaic device also includes a second nanostructured material 753 overlying the first nanostructured material according to a specific embodiment. In a specific embodiment, the first and second nanostructured materials form an intermixed region, which has been described throughout the present specification and more particularly below. The second nanostructured material has a planar surface region according to a specific embodiment. Depending upon the embodiment, the first nanostructured material and the second nanostructured material are comprised of a plurality of nanostructures selected from nanoparticles, quantum dots, quantum wires, nano-columns, nanorods, nanotubes, quantum wells, nanoshells, nanobelts, nanoporous materials, any combination of these, and the like. Of course, there can be other variations, modifications, and alternatives.

In a specific embodiment, each of the nanostructured materials is made of a suitable composite, homogeneous material, or heterogeneous material, including layered materials, graded materials, and the like. In a specific embodiment, the first nanostructured material and the second nanostructured material are comprised of semiconductor materials, e.g., Group IV (e.g., silicon, silicon-germanium alloys, germanium), Group II/VI, Group III/V, combinations of these, and the like. Depending upon the embodiment, the semiconductor material can be an inorganic semiconductor or organic semiconductor material. In other embodiments, either one or both of these nanostructured materials can be made of a metal oxide species. As an example, the metal oxide for the first nanostructure material can be $CuO$, $Cu_2O$, $FeO$, $Fe_2O_3$, combinations of these, and the like. Alternatively, the first nanostructure material can be made of metal sulfide species. For example, the metal sulfide species can be $FeS_2$, $Cu_2S$, $SnS$, a combination of these, or the like. In an alternative embodiment, the first nano structure material can be a semiconductor material comprising a Group IV semiconductor species, for example, $FeSi_2$. Of course, there can be variations, alternatives, and modifications.

In a specific embodiment, the second nanostructured material is comprised of metal oxides, e.g., $ZnO$, $TiO_2$, $SnO_2$, $WO_3$, $Fe_2O_3$. In an alternative embodiment, the second nanostructured material can comprise of metal sulfides, for example, $SnS_2$, $ZnS$ and the like. In other embodiments, the first nanostructured material can be selected from Si, Ge, $ZnO$, $TiO_2$, $SnO_2$, $WO_3$, $CuO$, $Cu_2O$, $FeO$, $Fe_2O_3$, $Fe_3O_4$, $Cu_2S$, $FeS$, including combinations, and the like. In other general embodiments, the first nanostructured material is selected from metal sulfides, e.g., $Cu_2S$, $FeS$, $FeS_2$, $SnS$. In certain embodiments, the first nanostructures material can be a semiconductor comprising Group IV semiconductor species, for example, $FeSi_2$. Of course, there can be variations, alternatives, and modifications.

In other embodiments, the nanostructured materials can have a certain spatial morphology using one or more materials. As an example, the first nanostructured material is comprised of nano-columns selected from Group IV semiconductor materials, Group IV-IV semiconductor materials, and metal oxides, and the like. In an alternative embodiment, the first nanostructured material is comprised of nano-columns selected from Si, Ge, SiGe alloys. In other embodiments, the first nanostructured material is comprised of nano-columns selected from ZnO, FeO, $Fe_2O_3$, CuO, $Cu_2O$. The first nanostructured material may comprise of nanostructured metal sulfides such as $FeS_2$, $Cu_2S$, SnS. Alternatively, the first nanostructured material may include a semiconductor material comprising a Group IV semiconductor species such as $FeSi_2$. In yet other embodiments, the first nanostructured material is comprised of nano-tubes selected from Group IV semiconductor materials, Group IV-IV semiconductor materials, and metal oxides. In other embodiments, the first nanostructured material is comprised of nano-tubes comprised of $TiO_2$. In other alternative embodiments, the first nanostructured material is selected from Group IV semiconductor materials, Group IV-IV semiconductor materials, and the second nanostructured material is comprised of nano-columns comprised of metal oxides. Of course, there can be other variations, modifications, and alternatives.

In other embodiments, the first nanostructured material is selected from Si, Ge, SiGe alloys, and the second nanostructured material is comprised of nano-columns comprised of ZnO. In other embodiments, the first nanostructured material is selected from Group IV semiconductor materials, Group IV-IV semiconductor materials, and the second nanostructured material is comprised of nano-tubes comprised of metal oxides. The first nanostructured material is selected from Si, Ge, SiGe alloys, and the second nanostructured material is comprised of nano-tubes comprised of $TiO_2$ according to a specific embodiment. Alternatively, the first nanostructured material is selected from Si, Ge, SiGe alloys, and the second nanostructured material is comprised of nanostructured metal sulfides such as $SnS_2$, ZnS. In an alternative embodiment, the first nanostructured material is comprised of inorganic semiconductor, and the second nanostructured material is comprised of organic semiconductor. Of course, there can be other variations, modifications, and alternatives.

In a specific embodiment, the device also has an intermixed region 707, which may include the first and second nanostructured materials, is provided between the first nanostructured material and the second nanostructured material. Depending upon the embodiment, the intermixed region can have certain spatial dimensions. As an example, the thickness of the intermixed region ranges from about 1 nm to about 5000 nm, and the spatial distance characterizing the intermixing ranges from about 1 nm to about 5000 nm. In an alternative embodiment, the thickness of the intermixed region ranges from about 1 nm to about 1000 nm, and the spatial distance characterizing the intermixing ranges from about 1 nm to about 1000 nm. Still further, the thickness of the intermixed region ranges from about 1 nm to about 500 nm, and the spatial distance characterizing the intermixing ranges from about 1 nm to about 500 nm. Alternatively, the thickness of the intermixed region ranges from about 1 nm to about 100 nm, and the spatial distance characterizing the intermixing ranges from about 1 nm to about 100 nm. In other embodiments, the thickness of the intermixed region ranges from about 1 nm to about 50 nm, and the spatial distance characterizing the intermixing ranges from about 1 nm to about 50 nm. Alternatively, the thickness of the intermixed region ranges from about 1 nm to about 50 nm, and the spatial distance characterizing the intermixing ranges from about 1 nm to about 10 nm. In other embodiments, the thickness of the intermixed region ranges from about 1 nm to about 50 nm, and the spatial distance characterizing the intermixing ranges from about 1 nm to about 5 nm. Of course, there can be other modifications, and alternatives.

In a specific embodiment, the intermixed region 707 has an interface region including the first and second nanostructured materials. That is, the interface region substantially contacts physically and electrically the first and second nanostructure materials, as shown, according to a specific embodiment. In a preferred embodiment, the interface region can be an integrated structure including first and second nanostructured materials. Alternatively, the interface region can be two separate structures that are contacting each other according to an alternative embodiment. Of course, there can be other variations, modifications, and alternatives.

In a specific embodiment, the device also has first electron affinity and a first ionization potential that characterize the first nanostructured material. A second electron affinity and a second ionization potential characterize the second nanostructured material according to a specific embodiment. In a preferred embodiment, the first electron affinity is less than the second electron affinity and the first ionization potential is less than the second ionization potential according to a preferred embodiment. In a preferred embodiment, the second electron affinity is less than the first ionization potential. In a preferred embodiment, the material also has an optical absorption coefficient of at least $10^3$ $cm^{-1}$ for light comprised of wavelengths within the range of about 400 nm to about 700 nm characterizing at least one or both of the first nanostructured material and the second nanostructured material. Of course, there can be other variations, modifications, and alternatives.

In a specific embodiment, the photovoltaic device has certain electron affinity and ionization potentials characterizing each of the nanostructured materials. In a specific embodiment, the electron affinity and the ionization potential of first nanostructured material is less than the electron affinity and the ionization potential of second nanostructured material, respectively, by at least 100 meV. In other embodiments, the electron affinity and the ionization potential of the first nanostructured material is less than the electron affinity and the ionization potential of the second nanostructured material, respectively, by at least 300 meV. In other embodiments, the electron affinity and the ionization potential of the first nanostructured material is less than the electron affinity and the ionization potential of the second nanostructured material, respectively, by at least 500 meV. Of course, there can be other variations, modifications, and alternatives.

The nanostructured materials are characterized by a bandgap according to a specific embodiment. The band gap of at least one or both of the nanostructured materials is within the range of about 1.0 eV to about 2.0 eV according to a specific embodiment. In an alternative specific embodiment, the bandgap of at least one or both of the nanostructured materials is within the range of about 1.2 eV to about 1.8 eV. Alternatively, the bandgap of at least one or both of nanostructured materials is within the range of about 1.3 eV to about 1.6 eV. Of course, there can be other variations, modifications, and alternatives.

The nanostructured materials also have a carrier mobility according to a specific embodiment. The carrier mobility of one the nanostructured material is within the range of about $10^{-6}$ $cm^2/V$-s to about 5000 $cm^2/V$-s according to a specific embodiment. In another embodiment, the carrier mobility of one of the nanostructured material is within the range of about $10^{-3}$ $cm^2/V$-s to about 1000 $cm^2/V$-s. In other embodiments, the carrier mobility of one the nanostructured material is within the range of about 1 $cm^2/V$-s to about 100 $cm^2/V$-s. Of course, there can be other variations, modifications, and alternatives.

As shown, device has positive charge carriers and negative charge carriers generated by optical absorption by the nanostructured material separate at the interface between the first nanostructured material and the second nanostructured material according to a specific embodiment. The negative charge carriers transport in the nanostructured material with the larger electron affinity, and the positive charge carriers transport in the nanostructured material with the smaller ionization potential. In a specific embodiment, the charge carriers undergo majority carrier transport within the first nanostructured material and the second nanostructured material. Of course, there can be other variations, modifications, and alternatives.

In a preferred embodiment, the photovoltaic device has an overlying hole transporting/electron blocking material 709. In a specific embodiment, the hole transporting/electron blocking material has suitable properties that facilitate transport of holes, while also blocking transport of electrons. As shown, the hole transporting/electron blocking material is overlying the intermixed region and in particular the second nanostructured material according to a specific embodiment. In a specific embodiment, the hole transporting/electron blocking material can be selected from metal oxides, Group IV semiconductor materials, Group IV-IV semiconductor materials, metal sulfides, copper compounds, organic semiconductors, combinations of these, which may be composites and/or layered, and the like. In a specific embodiment, the hole transporting/electron blocking material is selected from NiO, $Cu_2O$, Si, Ge, SiGe alloys, $Cu_2S$, CuI, CuSCN, CuPc, ZnPc, combinations of these, which may be composites and/or layered, and the like. Of course, there can be other variations, modifications, and alternatives.

In a specific embodiment, the electron transporting/hole blocking material is positioned between the nanostructured material and the electron collecting electrode, which will be described more fully below. Negatively charged carriers generated by optical absorption by the nanostructured material are preferentially separated into the electron transporting/hole blocking material and transport within the electron transporting/hole blocking material in a specific embodiment. In an alternative embodiment, the hole transporting/electron blocking material is positioned between the nanostructured material and the hole collecting electrode; which has been previously described. Positively charged carriers generated by optical absorption by the nanostructured material are preferentially separated into the hole transporting/electron blocking material and transport within the hole transporting/electron blocking material according to a specific embodiment. Of course, there can be other variations, modifications, and alternatives.

In a specific embodiment, the photovoltaic device includes an electrode structure 711 overlying the surface region of the hole transporting/electron blocking material. In a specific embodiment, the electrode structure can be made of a suitable material or combination of materials. The suitable material can be a metal, an organic material, or a combination of these, and the like. Depending upon the embodiment, the electrode structure can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be carbon based such as graphite or polymer species. In a specific embodiment, the metal can be encased between barrier metal layers or other suitable layers that may have lower (or higher) resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives. Further details of way of making the present device can be found throughout the present specification and more particularly below.

A method according to an alternative embodiment of the present invention for forming a nanocomposite material for a photovoltaic device is briefly described below.

1. Provide a substrate (e.g., glass) including a surface region;
2. Clean (e.g., RCA, sonic, ultrasonic) the surface region;
3. Form an electrode layer overlying the surface region;
4. Form an electron transporting/hole blocking material overlying the electrode layer;
5. Form a first nanostructured material (e.g., nanoparticles, quantum dots, quantum wires, nano-columns, nanorods, nanotubes, quantum wells, nanoshells, nanobelts, nanoporous materials) overlying the electron transporting/hole blocking material;
6. Form a second nanostructured material (e.g., nanoparticles, quantum dots, quantum wires, nano-columns, nanorods, nanotubes, quantum wells, nanoshells, nanobelts, nanoporous materials) overlying the first nanostructured material such that the first nanostructured material is intermixed with the second nanostructured material;
7. Cause formation of an intermixed region provided between the first nanostructured material and the second nanostructured material;
8. Process at least the intermixed region to provide the first nanostructured material to be at a first electron affinity and a first ionization potential;
9. Process at least the intermixed region to provide the second nanostructured material to be at a second electron affinity and a second ionization (steps 8 and 9 may be concurrent and/or overlap depending upon the specific embodiment);
10. Form a hole transporting/electron blocking material overlying the second nanostructured material;
11. Form an electrode structure overlying the second nanostructured material;
12. Perform other steps, as desired; and
13. Provide a photovoltaic device including the intermixed region such that the first electron affinity is less than the second electron affinity and the first ionization potential is less than the second ionization potential and such that an optical absorption coefficient of at least $10^3$ $cm^{-1}$ for light comprised of wavelengths within the range of about 400 nm to about 700 nm characterizes at least one or both of the first nanostructured material and the second nanostructured material.

The above sequence of steps provides a method according to an embodiment of the present invention. As shown, the method uses a combination of steps including a way of forming a nanocomposite nanostructured material and hole transporting/blocking and electron transporting/blocking materials for photovoltaic applications according to an embodiment of the present invention. Other alternatives can also be provided where steps are added, one or more steps are removed, or one or more steps are provided in a different sequence without departing from the scope of the claims herein. Further details of the present method according to a specific embodiment can be found throughout the present specification and more particularly below.

FIGS. 8 through 13 are simplified diagrams of an illustration of an alternative method of fabricating a nanostructured material for a photovoltaic device according to an alternative embodiment of the present invention. This diagram is merely an example, which should not unduly limit the scope of the claims herein. One of ordinary skill would recognize other variations, modifications, and alternatives. As shown, the present method begins by providing a substrate member 800. The substrate member includes an overlying surface region 801. In a specific embodiment, the substrate member can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, an organic material, or any combination of these, and the like. Alternatively, the substrate member can be a semiconductor material, such as silicon, silicon-germanium alloys, germanium, Group III/V, or Group II/VI materials, and the like. Of course, there can be other variations, modifications, and alternatives.

Referring again to FIG. 8, the method includes a cleaning process to clean the surface region using one or more suitable techniques. In a specific embodiment, the cleaning process can include a wet and/or dry cleaning technique. Examples of such wet cleaning technique include, among others, an RCA clean, a wet dip, an organic wash with solvents such as acetone and/or alcohols, such as isopropyl alcohol, ethanol, any combinations of these and the like. The cleaning process can also include using ultra clean water such as deionized water and/or substantially particle free water. In other embodiments, the cleaning process can include a plasma clean using an oxide and/or inert gas species, such as nitrogen, argon, and other suitable gases, and the like. Once cleaning has occurred, the surface region is substantially free from particulates, organic contaminants, metals, and other chemicals, including combinations of these. Of course, one of ordinary skill in the art would recognize other variations, modifications, and alternatives.

Figure 9:
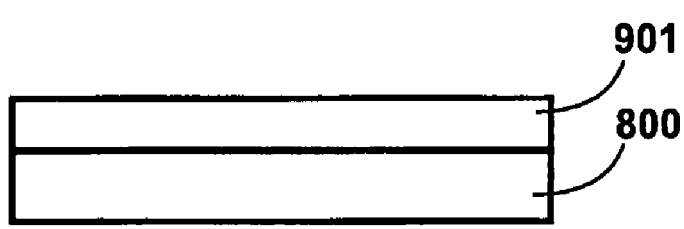

Referring now to FIG. 9, the method includes forming an electrode layer 901 overlying the surface region. In some embodiments, the electrode layer may be formed by conventional deposition methods such as sputtering, evaporation, and solution deposition. As shown, the electrode structure is overlying the surface region of the substrate member. In a specific embodiment, the electrode structure can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode layer is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

Optionally, the present method may include a cleaning process after formation of the electrode layer. In a specific embodiment, the cleaning process can include a wet and/or dry cleaning technique. Examples of such wet cleaning technique include, among others, an RCA clean, a wet dip, an organic wash with solvents such as acetone and/or alcohols, such as isopropyl alcohol, ethanol, any combinations of these and the like. The cleaning process can also include using ultra clean water such as deionized water and/or substantially particle free water. In other embodiments, the cleaning process can include a plasma clean using an oxide and/or inert gas species, such as nitrogen, argon, and other suitable gases, and the like. Once cleaning has occurred, the electrode layer has a surface region that is substantially free from particulates, organic contaminants, metals, and other chemicals, including combinations of these. In a preferred embodiment, the method performs a subsequent deposition process before any contamination of the electrode layer takes place. Of course, one of ordinary skill in the art would recognize other variations, modifications, and alternatives.

Figure 10:
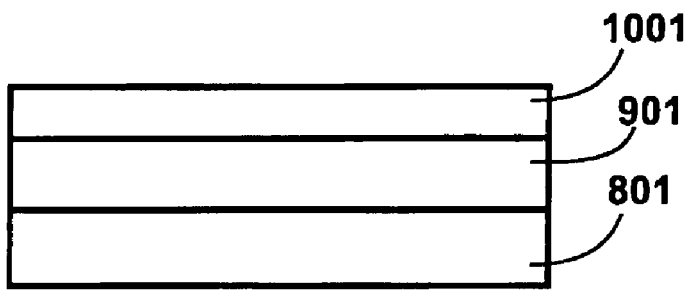

In a preferred embodiment, the method forms an overlying electron transporting/hole blocking material 1001, as illustrated by FIG. 10. In a specific embodiment, the electron transporting/hole blocking material has suitable properties that facilitate transport of electrons, while also blocking transport of holes. As shown, the electron transporting/hole blocking material is overlying the electrode 901, which is preferably transparent. Additionally, the substrate member is also optically transparent according to a specific embodiment. Alternatively, the electrode layer and the substrate member are not transparent and may also include reflective materials, which allow for electromagnetic radiation to reflect back toward an active region of the photovoltaic materials according to a specific embodiment. As merely an example, the electron transporting/hole blocking material can be inorganic semiconductors, metal oxides, organic semiconductors, or any other suitable material, including combinations of materials, layered materials, and the like. In a specific embodiment, the electron transporting/hole blocking material can be a metal oxide including, but not limited to, ZnO, $TiO_2$, $SnO_2$, $WO_3$, $Fe_2O_3$, other metal oxide, and the like. Of course, there can be other variations, modifications, and alternatives.

Figure 11:
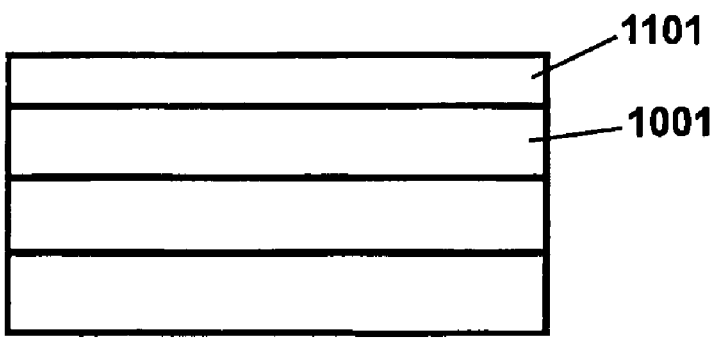
Figure 12:
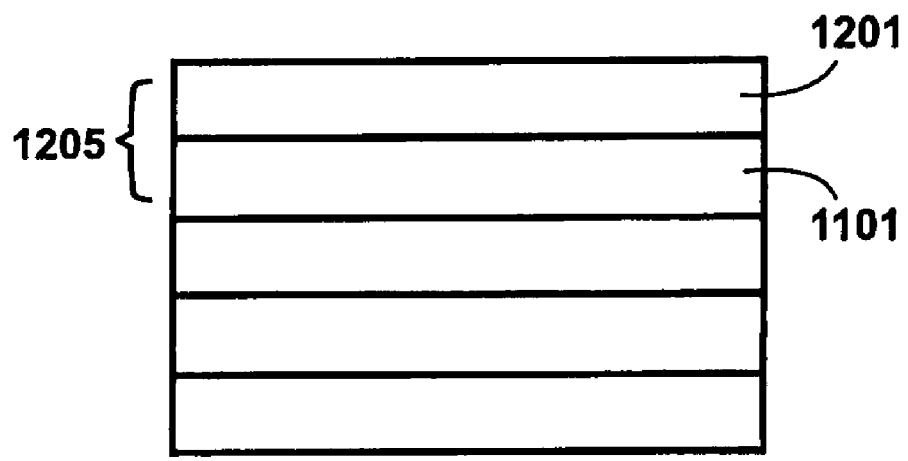

In a specific embodiment, the method forms a first nanostructured material 1101 (e.g., nanoparticles, quantum dots, quantum wires, nano-columns, nanorods, nanotubes, quantum wells, nanoshells, nanobelts, nanoporous materials) overlying the electrode layer, as illustrated by FIG. 11. In a specific embodiment, the first nanostructured material is on and in contact with the electrode layer, physically and electrically. Referring now to FIG. 12, the method forms a second nanostructured material 1201 (e.g., nanoparticles, quantum dots, quantum wires, nano-columns, nanorods, nanotubes, quantum wells, nanoshells, nanobelts, nanoporous materials)

overlying the first nanostructured material such that the first nanostructured material is intermixed with the second nanostructured material.

In a specific embodiment, the nanostructured materials can have a certain geometric shape and/or size. The nanostructured materials can include, among others, nanoparticles, quantum dots, quantum wires, nano-columns, nanorods, nanotubes, quantum wells, nanoshells, nanobelts, nanoporous materials, including combinations of these, and the like. In a specific embodiment, the method can form nanostructured materials in certain categories such as nanopores, nanocolumns, nanotubes, nanoparticles, any combinations of these, and others. Further details of ways of forming these nanostructured materials can be found throughout the present specification and more particularly below.

Referring to FIG. 12 again, the method forms an intermixed region 1205 provided by the first nanostructured material and the second nanostructured material. In a specific embodiment, the intermixed region is processed to provide the first nanostructured material to be at a first electron affinity and a first ionization potential and the second nanostructured material to be at a second electron affinity and a second ionization. Depending upon the embodiment, the method can processes these two nanostructured materials separately or concurrently to provide a photovoltaic device including the intermixed region such that the first electron affinity is less than the second electron affinity. In a preferred embodiment, the first ionization potential is less than the second ionization potential. In a preferred embodiment, the second electron affinity is less than the first ionization potential. Additionally, the photovoltaic device has an optical absorption coefficient of at least $10^3$ cm$^{-1}$ for light comprised of wavelengths within the range of about 400 nm to about 700 nm characterizes at least one or both of the first nanostructured material and the second nanostructured material according to a preferred embodiment.

Figure 13:
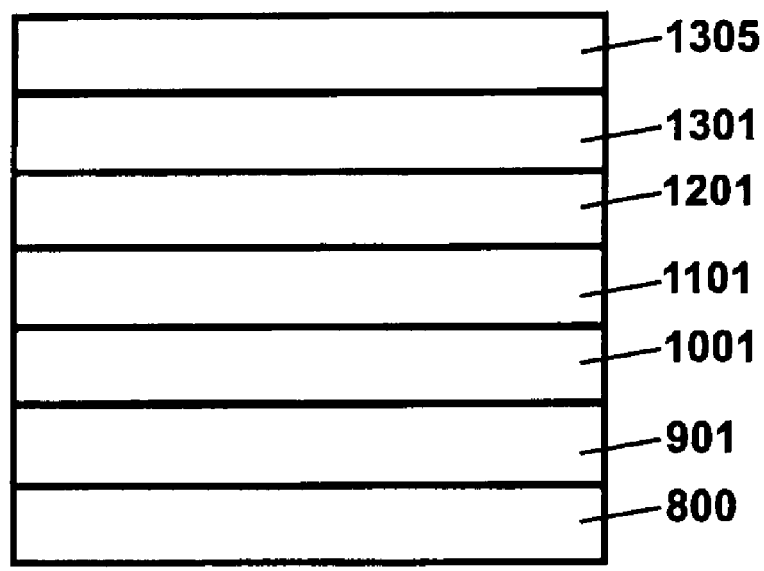

In a preferred embodiment, the method forms an overlying hole transporting/electron blocking material 1301, as illustrated by FIG. 13. In a specific embodiment, the hole transporting/electron blocking material has suitable properties that facilitate transport of holes, while also blocking transport of electrons. As shown, the hole transporting/electron blocking material is overlying the intermixed region and in particular the second nanostructured material according to a specific embodiment. In a specific embodiment, the hole transporting/ electron blocking material can be selected from metal oxides, Group IV semiconductor materials, Group IV-IV semiconductor materials, metal sulfides, copper compounds, organic semiconductors, combinations of these, which may be composites and/or layered, and the like. In a specific embodiment, the hole transporting/electron blocking material is selected from NiO, Cu$_2$O, Si, Ge, SiGe alloys, Cu$_2$S, CuI, CuSCN, CuPc, ZnPc, combinations of these, which may be composites and/or layered, and the like. Of course, there can be other variations, modifications, and alternatives.

In a specific embodiment, the electron transporting/hole blocking material is positioned between the nanostructured material and the electron collecting electrode, which will be described more fully below. Negatively charged carriers generated by optical absorption by the nanostructured material are preferentially separated into the electron transporting/ hole blocking material and transport within the electron transporting/hole blocking material in a specific embodiment. In an alternative embodiment, the hole transporting/electron blocking material is positioned between the nanostructured material and the hole collecting electrode; which has been previously described. Positively charged carriers generated by optical absorption by the nanostructured material are preferentially separated into the hole transporting/electron blocking material and transport within the hole transporting/electron blocking material according to a specific embodiment. Of course, there can be other variations, modifications, and alternatives.

Referring again to FIG. 13, the method forms an electrode structure 1305 overlying the second nanostructured material. As shown, the electrode structure is overlying the surface region of the hole transporting/electron blocking material according to a specific embodiment. In a specific embodiment, the electrode structure can be made of a suitable material or combination of materials. The suitable material can be a metal, an organic material, or a combination of these, and the like. Depending upon the embodiment, the electrode structure can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be a carbon based such as graphite or polymer species. In a specific embodiment, the metal can be encased between barrier metal layers or other suitable layers that may have lower (or higher) resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Depending upon the embodiment, other steps can be performed. Of course, there can be other variations, modifications, and alternatives.

The above sequence of steps provides a method according to an embodiment of the present invention. As shown, the method uses a combination of steps including a way of forming a nanocomposite material for photovoltaic applications according to an embodiment of the present invention. Other alternatives can also be provided where steps are added, one or more steps are removed, or one or more steps are provided in a different sequence without departing from the scope of the claims herein. Further details of the present method and structures according to alternative specific embodiments can be found throughout the present specification and more particularly below.

Figure 14:
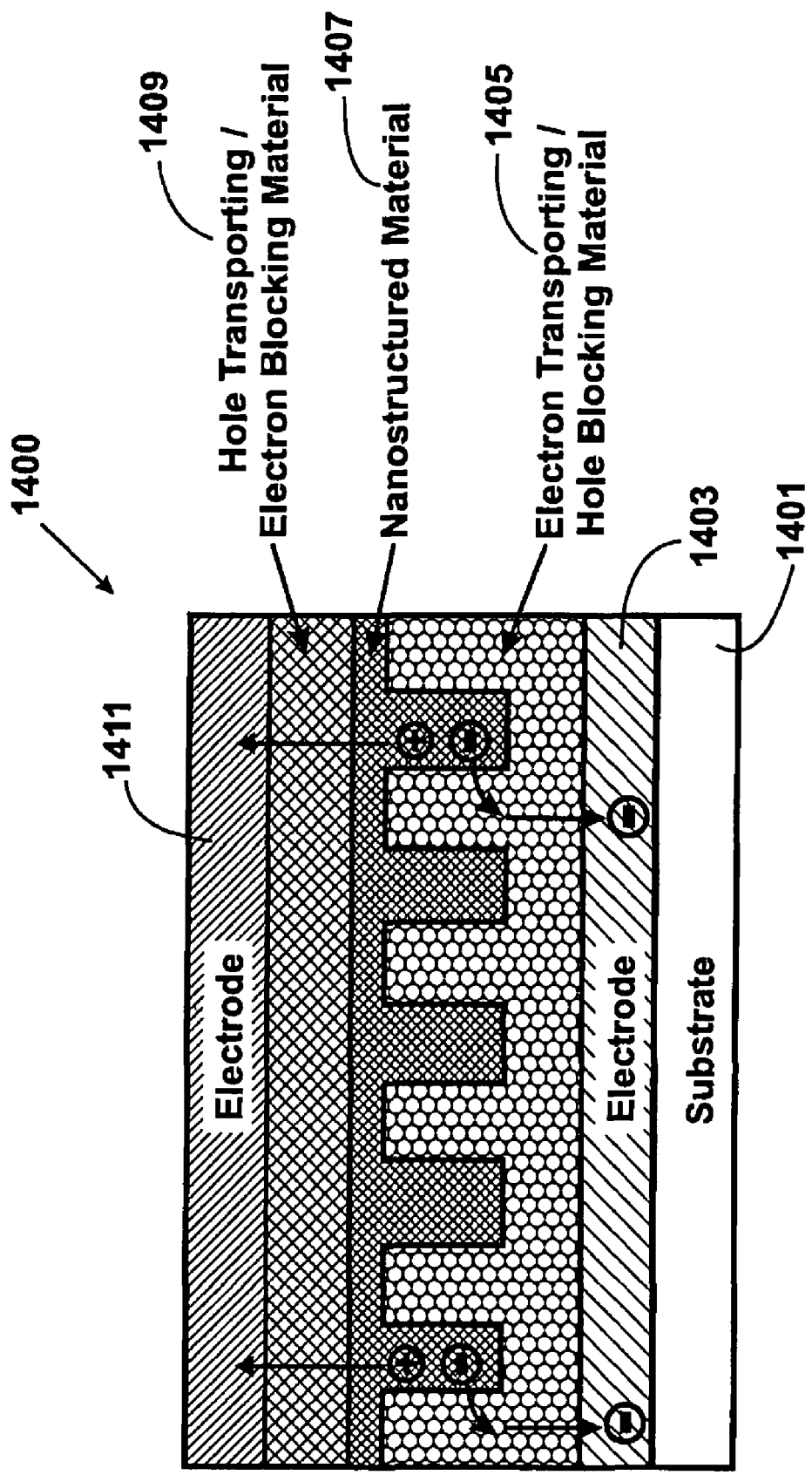
FIG. 14 is a simplified diagram illustrating yet an alternative nanostructured material for a photovoltaic device according to an embodiment of the present invention.

FIG. 14 is a simplified diagram illustrating yet an alternative nanostructured material 1400 for a photovoltaic device according to an embodiment of the present invention. This diagram is merely an example, which should not unduly limit the scope of the claims herein. One of ordinary skill would recognize other variations, modifications, and alternatives. As shown is a photovoltaic device made of a nanostructured material comprised of, e.g., nanoparticles, quantum dots, quantum wires, nano-columns, nanorods, nanotubes, quantum wells, nanoshells, nanobelts, nanoporous materials. In a specific embodiment, the photovoltaic device includes a substrate member 1401. The substrate member includes an overlying surface region. In a specific embodiment, the substrate member can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, or any combination of these, and the like. Alternatively, the substrate member can be a semiconductor material, such as silicon, silicon-germanium alloys, germanium, Group III/V, or Group II/VI materials, and the like. Of course, there can be other variations, modifications, and alternatives.

In a specific embodiment, the photovoltaic device includes an electrode layer 1403 overlying the surface region of the substrate member. In a specific embodiment, the electrode layer can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be carbon based such as graphite or polymer species. In a specific embodiment, the metal can be encased between barrier metal layers or other suitable layers that may have lower (or higher) resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode layer is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

In a preferred embodiment, the photovoltaic device has an electron transporting/hole blocking material 1405. In a specific embodiment, the electron transporting/hole blocking material has suitable properties that facilitate transport of electrons, while also blocking transport of holes. As shown, the electron transporting/hole blocking material is overlying the electrode 1403, which is preferably transparent. Additionally, the substrate member is also optically transparent according to a specific embodiment. Alternatively, the electrode layer and the substrate member are not transparent and may also include reflective materials, which allow for electromagnetic radiation to reflect back toward an active region of the photovoltaic device according to a specific embodiment. In a preferred embodiment, the electron transporting/hole blocking material is nanostructured based. That is, the electron transporting hole blocking material can be made of physical structures including, but not limited to, nanoparticles, quantum dots, quantum wires, nano-columns, nanorods, nanotubes, quantum wells, nanoshells, nanobelts, nanoporous materials, including combinations, multilayered structures, and the like. Of course, there can be variations, modifications, and alternatives.

Additionally, the electron transporting/hole blocking material can be made of a suitable species. As merely an example, the electron transporting/hole blocking material can be inorganic semiconductors, metal oxides, organic semiconductors, or any other suitable material, including combinations of materials, layered materials, and the like. In a specific embodiment, the electron transporting/hole blocking material can be a metal oxide including, but not limited to, ZnO, $TiO_2$, $SnO_2$, $WO_3$, $Fe_2O_3$, other metal oxide, and the like. Of course, there can be other variations, modifications, and alternatives.

In a specific embodiment, the photovoltaic device includes a nanostructured material 1407 overlying the electron transporting/hole blocking material 1405. In a preferred embodiment, the nanostructured material is electrically coupled to the electrode layer. The nanostructured material has a planar surface region according to a specific embodiment. Depending upon the embodiment, the nanostructured material is comprised of a plurality of nanostructures selected from nanoparticles, quantum dots, quantum wires, nano-columns, nanorods, nanotubes, quantum wells, nanoshells, nanobelts, nanoporous materials, any combination of these, and the like. Of course, there can be other variations, modifications, and alternatives.

In a specific embodiment, the nanostructured material is made of a suitable composite, homogeneous material, or heterogeneous material, including layered materials, graded materials, and the like. In a specific embodiment, the nanostructured material is comprised of semiconductor materials, e.g., Group IV (e.g., silicon, silicon-germanium alloys, germanium) Group II/VI, Group III/V, combinations of these, and the like. Depending upon the embodiment, the semiconductor material can be an inorganic semiconductor or organic semiconductor material. In other embodiments, the material can be made of a metal oxide species. As an example, the metal oxide can be ZnO, $TiO_2$, $SnO_2$, $WO_3$, CuO, $Cu_2O$, FeO, $Fe_2O_3$, combinations of these, and the like. In other general embodiments, the nanostructured material is selected from metal sulfides, e.g., $Cu_2S$, FeS, $FeS_2$, SnS, $SnS_2$, ZnS, combinations of these, and the like. Alternatively, the nanostructured material can be a semiconductor material comprises of a Group IV semiconductor species such as $FeSi_2$. Of course, there can be variations, alternatives, and modifications.

In other embodiments, the nanostructured material can have a certain spatial morphology using one or more materials. As an example, the nanostructured material is comprised of nano-columns selected from Group IV semiconductor materials, Group IV-IV semiconductor materials, and metal oxides, and the like. In an alternative embodiment, the nanostructured material is comprised of nano-columns selected from Si, Ge, SiGe alloys. In other embodiments, the nanostructured material is comprised of nano-columns selected from ZnO, FeO, $Fe_2O_3$, CuO, $Cu_2O$. In yet other embodiments, the nanostructured material is comprised of nano-tubes selected from Group IV semiconductor materials, Group IV-IV semiconductor materials, and metal oxides. In other embodiments, the nanostructured material is comprised of nano-tubes comprised of $TiO_2$. Alternatively, the nanostructured material can comprise of nanostructure metal sulfides such as $FeS_2$, SnS, $SnS_2$, ZnS, $Cu_2S$, and others. Yet alternatively, the nanostructured material may include a semiconductor material comprising a Group IV semiconductor species such as $FeSi_2$. Of course, there can be other variations, modifications, and alternatives.

Depending upon the embodiment, the nanostructured material can have certain spatial dimensions. As an example, the thickness of the nanostructured material ranges from about 1 nm to about 5000 nm. In an alternative embodiment, the thickness of the nanostructured material ranges from about 1 nm to about 1000 nm. Still further, the thickness of the nanostructured material ranges from about 1 nm to about 500 nm. Alternatively, the thickness of the nanostructured material ranges from about 1 nm to about 100 nm. In other embodiments, the thickness of the nanostructured material ranges from about 1 nm to about 50 nm. Of course, there can be other variations, modifications, and alternatives.

In a specific embodiment, the photovoltaic device also has a first electron affinity and a first ionization potential that characterize the nanostructured material. A second electron affinity and a second ionization potential characterize the electron transporting/hole blocking material, and a third electron affinity and a third ionization potential characterize the hole transporting/electron blocking material according to a specific embodiment. In a preferred embodiment, the third electron affinity and the third ionization potential are less than the first electron affinity and the first ionization potential, respectively, and the first electron affinity and the first ionization potential are less than the second electron affinity and the second ionization potential, respectively. In a preferred embodiment, the second electron affinity is less than the third ionization potential. In a preferred embodiment, the nanostructured material has an optical absorption coefficient of at least $10^3$ cm$^{-1}$ for light comprised of wavelengths within the range of about 400 nm to about 700 nm. Of course, there can be other variations, modifications, and alternatives.

In a specific embodiment, the photovoltaic device has certain electron affinities and ionization potentials characterizing the nanostructure materials and each of the carrier transporting/carrier blocking materials. In a specific embodiment, the electron affinity and the ionization potential of the electron transporting/hole blocking material are greater than the electron affinity and the ionization potential of the nanostructured material, respectively, by at least 100 meV, and the electron affinity and the ionization potential of the nanostructured material are greater than the electron affinity and the ionization potential of the hole transporting/electron blocking material, respectively, by at least 100 meV. In other embodiments, the electron affinity and the ionization potential of the electron transporting/hole blocking material are greater than the electron affinity and the ionization potential of the nanostructured material, respectively, by at least 300 meV, and the electron affinity and the ionization potential of the nanostructured material are greater than the electron affinity and the ionization potential of the hole transporting/electron blocking material, respectively, by at least 300 meV. In other embodiments, the electron affinity and the ionization potential of the electron transporting/hole blocking material are greater than the electron affinity and the ionization potential of the nanostructured material, respectively, by at least 500 meV, and the electron affinity and the ionization potential of the nanostructured material are greater than the electron affinity and the ionization potential of the hole transporting/electron blocking material, respectively, by at least 500 meV. Of course, there can be other variations, modifications, and alternatives.

The nanostructured material is characterized by a bandgap according to a specific embodiment. The bandgap of the nanostructured material is within the range of about 1.0 eV to about 2.0 eV according to a specific embodiment. In an alternative specific embodiment, the bandgap of the nanostructured material is within the range of about 1.2 eV to about 1.8 eV. Alternatively, the bandgap of the nanostructured material is within the range of about 1.3 eV to about 1.6 eV. Of course, there can be other variations, modifications, and alternatives.

The nanostructured material, the electron transporting/hole blocking material, and the hole transporting/electron blocking material each has a carrier mobility according to a specific embodiment. The carrier mobility of the nanostructured material, the electron mobility of the electron transporting/hole blocking material, and the hole mobility of the hole transporting/electron blocking material are within the range of about $10^{-6}$ cm$^2$/V-s to about 5000 cm$^2$/V-s according to a specific embodiment. In another embodiment, carrier mobility of the nanostructured material, the electron mobility of the electron transporting/hole blocking material, and the hole mobility of the hole transporting/electron blocking material are within the range of about $10^{-3}$ cm$^2$/V-s to about 1000 cm$^2$/V-s. In other embodiments, carrier mobility of the nanostructured material, the electron mobility of the electron transporting/hole blocking material, and the hole mobility of the hole transporting/electron blocking material are within the range of about 1 cm$^2$/V-s to about 100 cm$^2$/V-s. Of course, there can be other variations, modifications, and alternatives.

As shown, the photovoltaic device has positive charge carriers and negative charge carriers generated by optical absorption by the nanostructured material that separate at the interface between the nanostructured material and the electron transporting/hole blocking material, and separate at the interface between the nanostructured material and the hole transporting/electron blocking material according to a specific embodiment. The negative charge carriers transport in the nanostructured material with the larger electron affinity, and the positive charge carriers transport in the nanostructured material with the smaller ionization potential. In a specific embodiment, the charge carriers undergo majority carrier transport within the electron transporting/hole blocking material and the hole transporting/electron blocking material. Of course, there can be other variations, modifications, and alternatives.

In a preferred embodiment, the device has an overlying hole transporting/electron blocking material 1409. In a specific embodiment, the hole transporting/electron blocking material has suitable properties that facilitate transport of holes, while also blocking transport of electrons. As shown, the hole transporting/electron blocking material is overlying the nanostructured material according to a specific embodiment. In a specific embodiment, the hole transporting/electron blocking material can be selected from metal oxides, Group IV semiconductor materials, Group IV-IV semiconductor materials, metal sulfides, copper compounds, organic semiconductors, combinations of these, which may be composites and/or layered, and the like. In a specific embodiment, the hole transporting/electron blocking material is selected from NiO, Cu$_2$O, Si, Ge, SiGe alloys, Cu$_2$S, CuI, CuSCN, CuPc, ZnPc, combinations of these, which may be composites and/or layered, and the like. Of course, there can be other variations, modifications, and alternatives.

In a specific embodiment, the electron transporting/hole blocking material is positioned between the nanostructured material and the electron collecting electrode, which will be described more fully below. Negatively charged carriers generated by optical absorption by the nanostructured material are preferentially separated into the electron transporting/hole blocking material and transport within the electron transporting/hole blocking material in a specific embodiment. In an alternative embodiment, the hole transporting/electron blocking material is positioned between the nanostructured material and the hole collecting electrode; which has been previously described. Positively charged carriers generated by optical absorption by the nanostructured material are preferentially separated into the hole transporting/electron blocking material and transport within the hole transporting/electron blocking material according to a specific embodiment. Of course, there can be other variations, modifications, and alternatives.

In a specific embodiment, the photovoltaic device includes an electrode structure 1411 overlying the surface region of the hole transporting/electron blocking material. In a specific embodiment, the electrode structure can be made of a suitable material or combination of materials. The suitable material can be a metal, an organic material, or a combination of these, and the like. Depending upon the embodiment, the electrode structure can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be a carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives. Further details of way of making the present device can be found throughout the present specification and more particularly below.

A method according to an alternative embodiment of the present invention for forming a nanocomposite material for a photovoltaic device is briefly describe below.

1. Provide a substrate (e.g., glass) including a surface region;
2. Clean (e.g., RCA, sonic, ultrasonic) the surface region;
3. Form an electrode layer overlying the surface region;
4. Form an electron transporting/hole blocking material overlying the electrode layer;
5. Form a nanostructured material (e.g., nanoparticles, quantum dots, quantum wires, nano-columns, nanorods, nanotubes, quantum wells, nanoshells, nanobelts, nanoporous materials) overlying the electron transporting/hole blocking material;
6. Form a hole transporting/electron blocking material overlying the nanostructured material;
7. Form an electrode structure overlying the hole transporting/electron blocking material;
8. Perform other steps, as desired; and
9. Provide a photovoltaic device having an optical absorption coefficient of at least $10^3$ cm$^{-1}$ for light comprised of wavelengths within the range of about 400 nm to about 700 nm characterizes at least the nanostructured material.

The above sequence of steps provides a method according to an embodiment of the present invention. As shown, the method uses a combination of steps including a way of forming a nanostructured material and hole transporting/blocking and electron transporting/blocking materials for photovoltaic applications according to an embodiment of the present invention. Other alternatives can also be provided where steps are added, one or more steps are removed, or one or more steps are provided in a different sequence without departing from the scope of the claims herein. Further details of the present method according to a specific embodiment can be found throughout the present specification and more particularly below.

FIGS. 15 through 18 are simplified diagrams of an illustration of yet an alternative method of fabricating a nanostructured material for a photovoltaic device according to an alternative embodiment of the present invention. These diagrams are merely examples, which should not unduly limit the scope of the claims herein. One of ordinary skill would recognize other variations, modifications, and alternatives. As shown, the present method begins by providing a substrate member 1501. The substrate member includes an overlying surface region 1502. In a specific embodiment, the substrate member can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, an organic material, or any combination of these, and the like. Alternatively, the substrate member can be a semiconductor material, such as silicon, silicon-germanium alloys, germanium, Group III/V, or Group II/VI materials, and the like. Of course, there can be other variations, modifications, and alternatives.

In a specific embodiment, the method includes a cleaning process to clean the surface region using one or more suitable techniques. In a specific embodiment, the cleaning process can include a wet and/or dry cleaning technique. Examples of such wet cleaning technique include, among others, an RCA clean, a wet dip, an organic wash with solvents such as acetone and/or alcohols, such as isopropyl alcohol, ethanol, any combinations of these and the like. The cleaning process can also include using ultra clean water such as deionized water and/or substantially particle free water. In other embodiments, the cleaning process can include a plasma clean using an oxide and/or inert gas species, such as nitrogen, argon, and other suitable gases, and the like. Once cleaning has occurred, the surface region is substantially free from particulates, organic contaminants, metals, and other chemicals, including combinations of these. Of course, one of ordinary skill in the art would recognize other variations, modifications, and alternatives.

Referring to FIG. 15 again, the method includes forming an electrode layer 1503 overlying the surface region. In some embodiments, the electrode layer may be formed by conventional deposition methods such as sputtering, evaporation, and solution deposition. As shown, the electrode layer is overlying the surface region of the substrate member. In a specific embodiment, the electrode layer can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be a carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode layer is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

Optionally, the present method may include a cleaning process after formation of the electrode layer. In a specific embodiment, the cleaning process can include a wet and/or dry cleaning technique. Examples of such wet cleaning technique include, among others, an RCA clean, a wet dip, an organic wash with solvents such as acetone and/or alcohols, such as isopropyl alcohol, ethanol, any combinations of these and the like. The cleaning process can also include using ultra clean water such as deionized water and/or substantially particle free water. In other embodiments, the cleaning process can include a plasma clean using an oxide and/or inert gas species, such as nitrogen, argon, and other suitable gases, and the like. Once cleaning has occurred, the electrode layer is substantially free from particulates, organic contaminants, metals, and other chemicals, including combinations of these. In a preferred embodiment, the method performs a subsequent deposition process before any contamination of the electrode layer takes place. Of course, one of ordinary skill in the art would recognize other variations, modifications, and alternatives.

Figure 15:
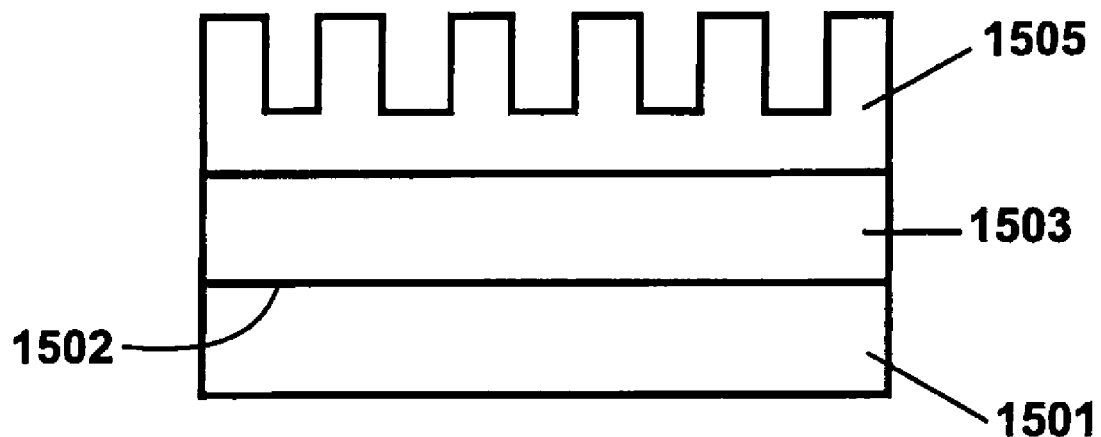
FIGS. 15 through 18 are simplified diagrams of an illustration of yet an alternative method of fabricating a nanostructured material for a photovoltaic device according to an alternative embodiment of the present invention.

In a preferred embodiment, the method forms an electron transporting/hole blocking material 1505, as illustrated again by FIG. 15. In a specific embodiment, the material has suitable properties that facilitate transport of electrons, while also blocking transport of holes. As shown, the electron transporting/hole blocking material is overlying the electrode layer 1503, which is preferably transparent. Additionally, the substrate is also optically transparent according to a specific embodiment. Alternatively, the electrode layer and the substrate member are not transparent and may also include reflective materials, which allow for electromagnetic radiation to reflect back toward an active region of the photovoltaic device according to a specific embodiment. As merely an example, the electron transporting/hole blocking material can be inorganic semiconductors, metal oxides, organic semiconductors, or any other suitable material, including combinations of materials, layered materials, and the like. In a specific embodiment, the electron transporting/hole blocking material can be a metal oxide including, but not limited to, ZnO, $TiO_2$, $SnO_2$, $WO_3$, $Fe_2O_3$, other metal oxide, and the like. Of course, there can be other variations, modifications, and alternatives.

Figure 16:
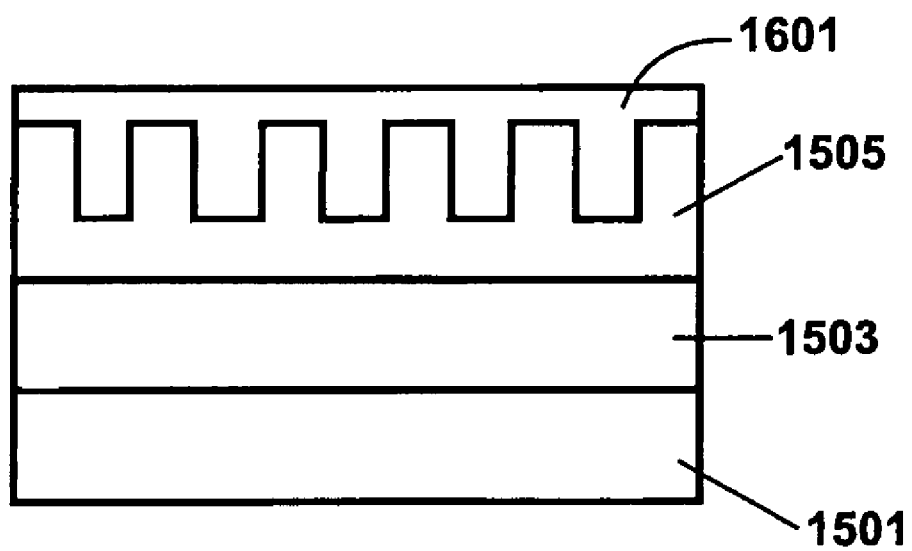

In a specific embodiment, the photovoltaic device includes a nanostructured material 1601 overlying the electron transporting/hole blocking material 1505, as illustrated by FIG. 16. In a preferred embodiment, the nanostructured material is electrically coupled to the surface region of the electrode layer. The nanostructured material has a planar surface region according to a specific embodiment. Depending upon the embodiment, the nanostructured material is comprised of a plurality of nanostructures selected from nanoparticles, quantum dots, quantum wires, nano-columns, nanorods, nano-tubes, quantum wells, nanoshells, nanobelts, nanoporous materials, any combination of these, and the like. Of course, there can be other variations, modifications, and alternatives.

In a specific embodiment, the nanostructured material is made of a suitable composite, homogeneous material, or heterogeneous material, including layered materials, graded materials, and the like. In a specific embodiment, the nanostructured material is comprised of semiconductor materials, e.g., Group IV (e.g., silicon, silicon-germanium alloys, germanium) Group II/VI, Group III/V, combinations of these, and the like. Depending upon the embodiment, the semiconductor material can be an inorganic semiconductor or organic semiconductor material. In other embodiments, the material can be made of a metal oxide species. As an example, the metal oxide can be ZnO, $TiO_2$, $SnO_2$, $WO_3$, CuO, $Cu_2O$, FeO, $Fe_2O_3$, combinations of these, and the like. In other general embodiments, the nanostructured material is selected from metal sulfides, e.g., $Cu_2S$, FeS, $FeS_2$, SnS, $SnS_2$, ZnS, Alternatively, the nanostructure material can be a semiconductor material comprises a Group IV semiconductor species such as $FeSi_2$, and the like. Of course, there can be variations, alternatives, and modifications.

In other embodiments, the nanostructured material can have a certain spatial morphology using one or more materials. As an example, the nanostructured material is comprised of nano-columns selected from Group IV semiconductor materials, Group IV-IV semiconductor materials, and metal oxides, and the like. In an alternative embodiment, the nanostructured material is comprised of nano-columns selected from Si, Ge, SiGe alloys. In other embodiments, the nanostructured material is comprised of nano-columns selected from ZnO, FeO, $Fe_2O_3$, CuO, $Cu_2O$. In yet other embodiments, the nanostructured material is comprised of nano-tubes selected from Group IV semiconductor materials, Group IV-IV semiconductor materials, and metal oxides. In other embodiments, the nanostructured material is comprised of nano-tubes comprised of $TiO_2$. Alternatively, the nanostructured material can comprise of nanostructured metal sulfides such as $FeS_2$, SnS, $SnS_2$, ZnS, $Cu_2S$ and the like. In certain embodiments, the nanostructured material can include a semiconductor material comprising Group IV semiconductor species such as $FeSi_2$. Of course, there can be other variations, modifications, and alternatives.

Depending upon the embodiment, the nanostructured material can have certain spatial dimensions. As an example, the thickness of the nanostructured material ranges from about 1 nm to about 5000 nm. In an alternative embodiment, the thickness of the nanostructured material ranges from about 1 nm to about 1000 nm. Still further, the thickness of the nanostructured material ranges from about 1 nm to about 500 nm. Alternatively, the thickness of the nanostructured material ranges from about 1 nm to about 100 nm. In other embodiments, the thickness of the nanostructured material ranges from about 1 nm to about 50 nm. Of course, there can be other variations, modifications, and alternatives.

In a specific embodiment, the photovoltaic device also has a first electron affinity and a first ionization potential that characterize the nanostructured material. A second electron affinity and a second ionization potential characterize the electron transporting/hole blocking material, and a third electron affinity and a third ionization potential characterize the hole transporting/electron blocking material according to a specific embodiment. In a preferred embodiment, the third electron affinity and the third ionization potential are less than the first electron affinity and the first ionization potential, respectively, and the first electron affinity and the first ionization potential are less than the second electron affinity and the second ionization potential, respectively. In a preferred embodiment, the second electron affinity is less than the third ionization potential. In a preferred embodiment, the nanostructured material has an optical absorption coefficient of at least $10^3$ $cm^{-1}$ for light comprised of wavelengths within the range of about 400 nm to about 700 nm. Of course, there can be other variations, modifications, and alternatives.

In a specific embodiment, the photovoltaic device has certain electron affinities and ionization potentials characterizing the nanostructure materials and each of the carrier transporting/carrier blocking materials. In a specific embodiment, the electron affinity and the ionization potential of the electron transporting/hole blocking material are greater than the electron affinity and the ionization potential of the nanostructured material, respectively, by at least 100 meV, and the electron affinity and the ionization potential of the nanostructured material are greater than the electron affinity and the ionization potential of the hole transporting/electron blocking material, respectively, by at least 100 meV. In other embodiments, the electron affinity and the ionization potential of the electron transporting/hole blocking material are greater than the electron affinity and the ionization potential of the nanostructured material, respectively, by at least 300 meV, and the electron affinity and the ionization potential of the nanostructured material are greater than the electron affinity and the ionization potential of the hole transporting/electron blocking material, respectively, by at least 300 meV. In other embodiments, the electron affinity and the ionization potential of the electron transporting/hole blocking material are greater than the electron affinity and the ionization potential of the nanostructured material, respectively, by at least 500 meV, and the electron affinity and the ionization potential of the nanostructured material are greater than the electron affinity and the ionization potential of the hole transporting/electron blocking material, respectively, by at least 500 meV. Of course, there can be other variations, modifications, and alternatives.

The nanostructured material is characterized by a bandgap according to a specific embodiment. The bandgap of the nanostructured material is within the range of about 1.0 eV to about 2.0 eV according to a specific embodiment. In an alternative specific embodiment, the bandgap of the nanostructured material is within the range of about 1.2 eV to about 1.8 eV. Alternatively, the bandgap of the nanostructured material is within the range of about 1.3 eV to about 1.6 eV. Of course, there can be other variations, modifications, and alternatives.

The nanostructured material, the hole transporting/electron blocking material, and the electron transporting/hole blocking material each has a carrier mobility according to a specific embodiment. The carrier mobility of the nanostructured material, the electron mobility of the electron transporting/hole blocking material, and the hole mobility of the hole transporting/electron blocking material are within the range of about $10^{-6}$ cm$^2$/V-s to about 5000 cm$^2$/V-s according to a specific embodiment. In another embodiment, carrier mobility of the nanostructured material, the electron mobility of the electron transporting/hole blocking material, and the hole mobility of the hole transporting/electron blocking material are within the range of about $10^{-3}$ cm$^2$/V-s to about 1000 cm$^2$/V-s. In other embodiments, carrier mobility of the nanostructured material, the electron mobility of the electron transporting/hole blocking material, and the hole mobility of the hole transporting/electron blocking material are within the range of about 1 cm$^2$/V-s to about 100 cm$^2$/V-s. Of course, there can be other variations, modifications, and alternatives.

In a specific embodiment, the photovoltaic device has positive charge carriers and negative charge carriers generated by optical absorption by the nanostructured material that separate at the interface between the nanostructured material and the electron transporting/hole blocking material, and separate at the interface between the nanostructured material and the hole transporting/electron blocking material according to a specific embodiment. The negative charge carriers transport in the nanostructured material with the larger electron affinity, and the positive charge carriers transport in the nanostructured material with the smaller ionization potential. In a specific embodiment, the charge carriers undergo majority carrier transport within the electron transporting/hole blocking material and the hole transporting/electron blocking material. Of course, there can be other variations, modifications, and alternatives.

Figure 17:
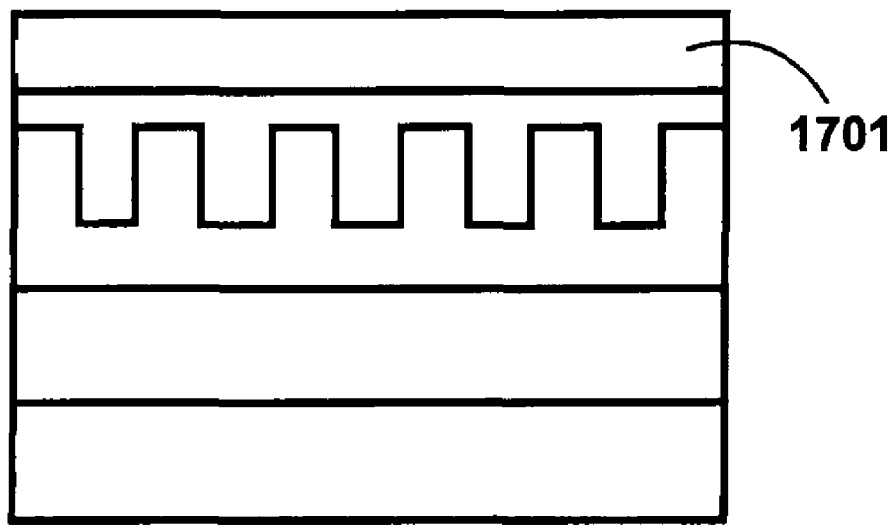

In a preferred embodiment, the method forms an overlying hole transporting/electron blocking material 1701, as illustrated by FIG. 17. In a specific embodiment, the hole transporting/electron blocking material has suitable properties that facilitate transport of holes, while also blocking transport of electrons. As shown, the hole transporting/electron blocking material is overlying the nanostructured material according to a specific embodiment. In a specific embodiment, the hole transporting/electron blocking material can be selected from metal oxides, Group IV semiconductor materials, Group IV-IV semiconductor materials, metal sulfides, copper compounds, organic semiconductors, combinations of these, which may be composites and/or layered, and the like. In a specific embodiment, the hole transporting/electron blocking material is selected from NiO, Cu$_2$O, Si, Ge, SiGe alloys, Cu$_2$S, CuI, CuSCN, CuPc, ZnPc, combinations of these, which may be composites and/or layered, and the like. Of course, there can be other variations, modifications, and alternatives.

In a specific embodiment, the electron transporting/hole blocking material is positioned between the nanostructured material and the electron collecting electrode, which will be described more fully below. Negatively charged carriers generated by optical absorption by the nanostructured material are preferentially separated into the electron transporting/hole blocking material and transport within the electron transporting/hole blocking material in a specific embodiment. In an alternative embodiment, the hole transporting/electron blocking material is positioned between the nanostructured material and the hole collecting electrode; which has been previously described. Positively charged carriers generated by optical absorption by the nanostructured material are preferentially separated into the hole transporting/electron blocking material and transport within the hole transporting/electron blocking material according to a specific embodiment. Of course, there can be other variations, modifications, and alternatives.

Figure 18:
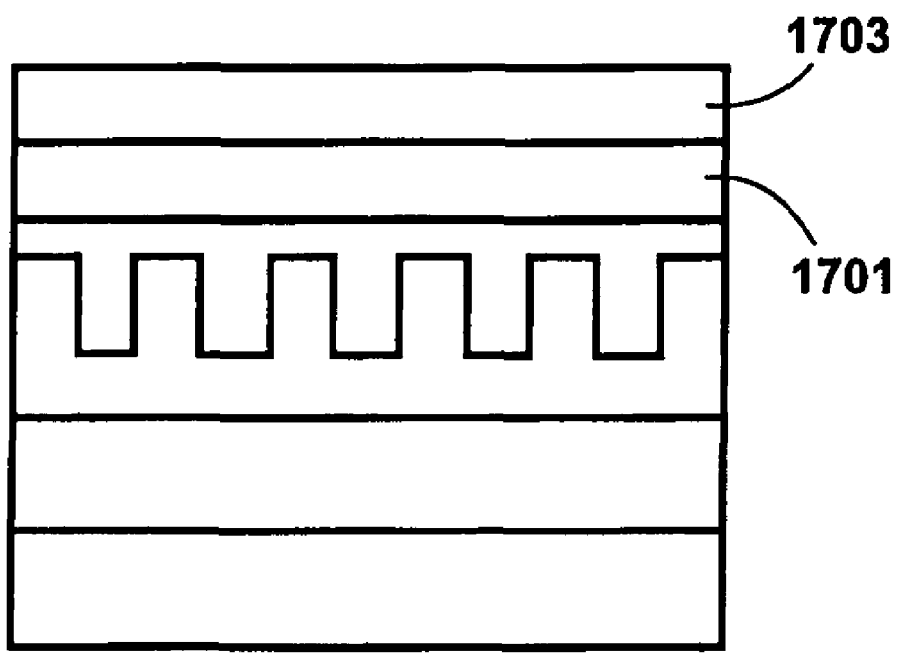

Referring to FIG. 18, the method forms an electrode structure 1703 overlying the surface region of the hole transporting/electron blocking material. In a specific embodiment, the electrode structure can be made of a suitable material or combination of materials. The suitable material can be a metal, an organic material, or a combination of these, and the like. Depending upon the embodiment, the electrode structure can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be a carbon based such as graphite or polymer species. In a specific embodiment, the metal can be encased between barrier metal layers or other suitable layers that may have lower resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

The above sequence of steps provides a method according to an embodiment of the present invention. As shown, the method uses a combination of steps including a way of forming a nanostructured material and hole transporting/blocking and electron transporting/blocking materials for photovoltaic applications according to an embodiment of the present invention. Other alternatives can also be provided where steps are added, one or more steps are removed, or one or more steps are provided in a different sequence without departing from the scope of the claims herein. Further details of the present method according to a specific embodiment can be found throughout the present specification and more particularly below.

Figure 19:
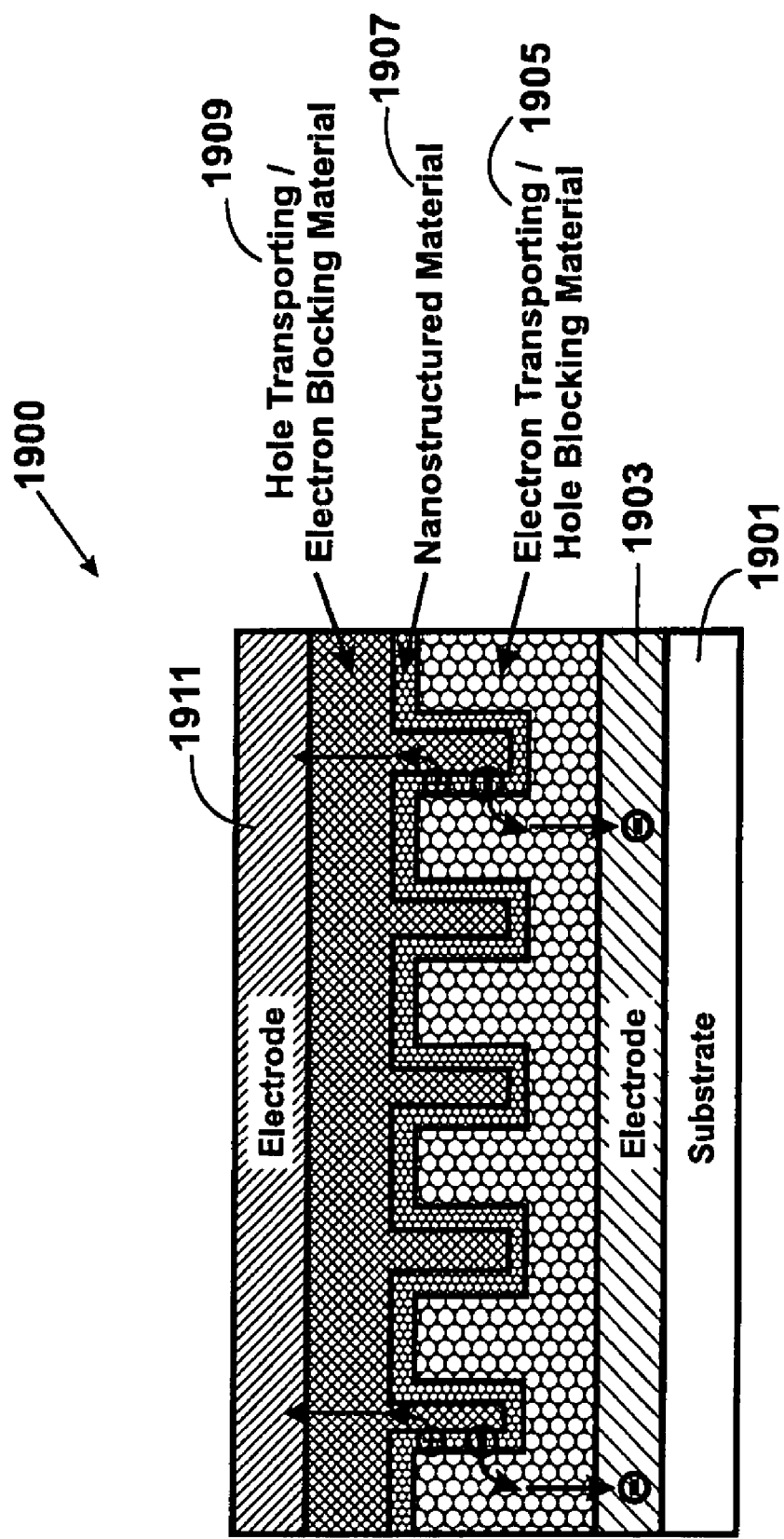
FIG. 19 is a simplified diagram illustrating yet an alternative nanostructured material for a photovoltaic device according to an embodiment of the present invention.

FIG. 19 is a simplified diagram illustrating yet an alternative nanostructured material 1900 for a photovoltaic device according to an embodiment of the present invention. This diagram is merely an example, which should not unduly limit the scope of the claims herein. One of ordinary skill would recognize other variations, modifications, and alternatives. As shown is a photovoltaic device made of a nanostructured material comprised of, e.g., nanoparticles, quantum dots, quantum wires, nano-columns, nanorods, nanotubes, quantum wells, nanoshells, nanobelts, nanoporous materials. In a specific embodiment, the device includes a substrate member 1901. The substrate member includes an overlying surface region. In a specific embodiment, the substrate member can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, or any combination of these, and the like. Alternatively, the substrate member can be a semiconductor material, such as silicon, silicon-germanium alloys, germanium, Group III/V, or Group II/VI materials, and the like. Of course, there can be other variations, modifications, and alternatives.

In a specific embodiment, the photovoltaic device includes an electrode layer 1903 overlying the surface region of the substrate member. In a specific embodiment, the electrode layer can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be a carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode layer is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

In a preferred embodiment, the photovoltaic device has an electron transporting/hole blocking material 1905. In a specific embodiment, the electron transporting/hole blocking material has suitable properties that facilitate transport of electrons, while also blocking transport of holes. As shown, the electron transporting/hole blocking material is overlying the electrode 1903, which is preferably transparent. Additionally, the substrate member is also optically transparent according to a specific embodiment. Alternatively, the electrode layer and the substrate member are not transparent and may also include reflective materials, which allow for electromagnetic radiation to reflect back toward an active region of the photovoltaic device according to a specific embodiment. In a preferred embodiment, the electron transporting/hole blocking material is nanostructured based. That is, the electron transporting hole blocking material can be made of physical structures including, but not limited to, nanoparticles, quantum dots, quantum wires, nano-columns, nanorods, nanotubes, quantum wells, nanoshells, nanobelts, nanoporous materials, including combinations, multilayered structures, and the like. Of course, there can be variations, modifications, and alternatives.

Additionally, the electron transporting/hole blocking material can be made of a suitable species. As merely an example, the electron transporting/hole blocking material can be inorganic semiconductors, metal oxides, organic semiconductors, or any other suitable material, including combinations of materials, layered materials, and the like. In a specific embodiment, the electron transporting/hole blocking material can be a metal oxide including, but not limited to, ZnO, $TiO_2$, $SnO_2$, $WO_3$, $Fe_2O_3$, other metal oxide, and the like. Of course, there can be other variations, modifications, and alternatives.

In a specific embodiment, the photovoltaic device includes a nanostructured material 1907 overlying the electron transporting/hole blocking material 1905. In a preferred embodiment, the nanostructured material is electrically coupled to a surface region of the electrode layer. The nanostructured material has a planar surface region according to a specific embodiment. Depending upon the embodiment, the nanostructured material is comprised of a plurality of nanostructures selected from nanoparticles, quantum dots, quantum wires, nano-columns, nanorods, nanotubes, quantum wells, nanoshells, nanobelts, nanoporous materials, any combination of these, and the like. In a preferred embodiment, the nanostructured material is thin and conforms to the surfaces of the electron transporting/hole blocking material. In a specific embodiment, the nanostructured material is less than about 50 nm for a semiconductor material, e.g., silicon, silicon germanium. Of course, there can be other variations, modifications, and alternatives.

In a specific embodiment, the nanostructured material is made of a suitable composite, homogeneous material, or heterogeneous material, including layered materials, graded materials, and the like. In a specific embodiment, the nanostructured material is comprised of semiconductor materials, e.g., Group IV (e.g., silicon, silicon-germanium alloys, germanium) Group II/VI, Group III/V, combinations of these, and the like. Depending upon the embodiment, the semiconductor material can be an inorganic semiconductor or organic semiconductor material. In other embodiments, the material can be made of a metal oxide species. As an example, the metal oxide can be ZnO, $TiO_2$, $SnO_2$, $WO_3$, CuO, $Cu_2O$, FeO, $Fe_2O_3$, combinations of these, and the like. In other general embodiments, the nanostructured material is selected from metal sulfides, e.g., $Cu_2S$, $FeS$, $FeS_2$, $SnS$, $SnS_2$, $ZnS$ and the like. Alternatively, the nanostructured material can be a semiconductor material comprises a Group IV semiconductor species, for example, $FeSi_2$. Of course, there can be variations, alternatives, and modifications.

In other embodiments, the nanostructured materials can have a certain spatial morphology using one or more materials. As an example, the nanostructured material is comprised of nano-columns selected from Group IV semiconductor materials, Group IV-IV semiconductor materials, and metal oxides, and the like. In an alternative embodiment, the nanostructured material is comprised of nano-columns selected from Si, Ge, SiGe alloys. In other embodiments, the nanostructured material is comprised of nano-columns selected from ZnO, FeO, $Fe_2O_3$, CuO, $Cu_2O$. In yet other embodiments, the nanostructured material is comprised of nano-tubes selected from Group IV semiconductor materials, Group IV-IV semiconductor materials, and metal oxides. In other embodiments, the nanostructured material is comprised of nano-tubes comprised of $TiO_2$. In a yet alternative embodiment, the nanostructured material may comprise of a nanostructured metal sulfide, for example, $Cu_2S$, $FeS_2$, SnS, $SnS_2$, ZnS, among others. Yet alternatively, the nanostructure material may include a semiconductor material comprises of Group IV semiconductor species, for example, $FeSi_2$, and the like. Of course, there can be other variations, modifications, and alternatives.

Depending upon the embodiment, the nanostructured material conforms to the features of the electron blocking/hole transporting material and can have certain spatial dimensions. As an example, the thickness of the nanostructured material ranges from about 1 nm to about 100 nm. In an alternative embodiment, the thickness of the nanostructured material ranges from about 1 nm to about 75 nm. Still further, the thickness of the nanostructured material ranges from about 1 nm to about 50 nm. Alternatively, the thickness of the nanostructured material ranges from about 1 nm to about 25 nm. Of course, there can be other variations, modifications, and alternatives.

In a specific embodiment, the photovoltaic device also has a first electron affinity and a first ionization potential that characterize the nanostructured material. A second electron affinity and a second ionization potential characterize the electron transporting/hole blocking material, and a third electron affinity and a third ionization potential characterize the hole transporting/electron blocking material according to a specific embodiment. In a preferred embodiment, the third electron affinity and the third ionization potential are less than the first electron affinity and the first ionization potential, respectively, and the first electron affinity and the first ionization potential are less than the second electron affinity and the second ionization potential, respectively, and the second electron affinity is less than the third ionization potential. In a preferred embodiment, the nanostructured material has an optical absorption coefficient of at least $10^3$ cm$^{-1}$ for light comprised of wavelengths within the range of about 400 nm to about 700 nm. Of course, there can be other variations, modifications, and alternatives.

In a specific embodiment, the photovoltaic device has certain electron affinities and ionization potentials characterizing the nanostructure materials and each of the carrier transporting/carrier blocking materials. In a specific embodiment, the electron affinity and the ionization potential of the electron transporting/hole blocking material are greater than the electron affinity and the ionization potential of the nanostructured material, respectively, by at least 100 meV, and the electron affinity and the ionization potential of the nanostructured material are greater than the electron affinity and the ionization potential of the hole transporting/electron blocking material, respectively, by at least 100 meV. In other embodiments, the electron affinity and the ionization potential of the electron transporting/hole blocking material are greater than the electron affinity and the ionization potential of the nanostructured material, respectively, by at least 300 meV, and the electron affinity and the ionization potential of the nanostructured material are greater than the electron affinity and the ionization potential of the hole transporting/electron blocking material, respectively, by at least 300 meV. In other embodiments, the electron affinity and the ionization potential of the electron transporting/hole blocking material is greater than the electron affinity and the ionization potential of the nanostructured material by at least 500 meV, and the electron affinity and the ionization potential of the nanostructured material are greater than the electron affinity and the ionization potential of the hole transporting/electron blocking material, respectively, by at least 500 meV. Of course, there can be other variations, modifications, and alternatives.

The nanostructured material is characterized by a bandgap according to a specific embodiment. The bandgap of the nanostructured material is within the range of about 1.0 eV to about 2.0 eV according to a specific embodiment. In an alternative specific embodiment, the band gap of the nanostructured material is within the range of about 1.2 eV to about 1.8 eV. Alternatively, the bandgap of the nanostructured material is within the range of about 1.3 eV to about 1.6 eV. Of course, there can be other variations, modifications, and alternatives.

The nanostructured material, the electron transporting/hole blocking material, the hole transporting/electron blocking material each has a carrier mobility according to a specific embodiment. The carrier mobility of the nanostructured material, the electron mobility of the electron transporting/hole blocking material, and the hole mobility of the hole transporting/electron blocking material are within the range of about $10^{-6}$ cm$^2$/V-s to about 5000 cm$^2$/V-s according to a specific embodiment. In another embodiment, carrier mobility of the nanostructured material, the electron mobility of the electron transporting/hole blocking material, and the hole mobility of the hole transporting/electron blocking material are within the range of about $10^{-3}$ cm$^2$/V-s to about 1000 cm$^2$/V-s. In other embodiments, carrier mobility of the nanostructured material, the electron mobility of the electron transporting/hole blocking material, and the hole mobility of the hole transporting/electron blocking material are within the range of about 1 cm$^2$/V-s to about 100 cm$^2$/V-s. Of course, there can be other variations, modifications, and alternatives.

As shown, the photovoltaic device has positive charge carriers and negative charge carriers generated by optical absorption by the nanostructured material that separate at the interface between the nanostructured material and the electron transporting/hole blocking material, and separate at the interface between the nanostructured material and the hole transporting/electron blocking material according to a specific embodiment. The negative charge carriers transport in the nanostructured material with the larger electron affinity, and the positive charge carriers transport in the nanostructured material with the smaller ionization potential. In a specific embodiment, the charge carriers undergo majority carrier transport within the electron transporting/hole blocking material and the hole transporting/electron blocking material. Of course, there can be other variations, modifications, and alternatives.

In a preferred embodiment, the photovoltaic device has a hole transporting/electron blocking material 1909. In a specific embodiment, the hole transporting/electron blocking material has suitable properties that facilitate transport of holes, while also blocking transport of electrons. As shown, the hole transporting/electron blocking material is overlying the nanostructured material according to a specific embodiment. In a specific embodiment, the hole transporting/electron blocking material can be selected from metal oxides, Group IV semiconductor materials, Group IV-IV semiconductor materials, metal sulfides, copper compounds, organic semiconductors, combinations of these, which may be composites and/or layered, and the like. In a specific embodiment, the hole transporting/electron blocking material is selected from NiO, $Cu_2O$, Si, Ge, SiGe alloys, $Cu_2S$, CuI, CuSCN, CuPc, ZnPc, combinations of these, which may be composites and/or layered, and the like. Of course, there can be other variations, modifications, and alternatives.

In a specific embodiment, the electron transporting/hole blocking material is positioned between the nanostructured material and the electron collecting electrode, which will be described more fully below. Negatively charged carriers generated by optical absorption by the nanostructured material are preferentially separated into the electron transporting/hole blocking material and transport within the electron transporting/hole blocking material in a specific embodiment. In an alternative embodiment, the hole transporting/electron blocking material is positioned between the nanostructured material and the hole collecting electrode; which has been previously described. Positively charged carriers generated by optical absorption by the nanostructured material are preferentially separated into the hole transporting/electron blocking material and transport within the hole transporting/electron blocking material according to a specific embodiment. Of course, there can be other variations, modifications, and alternatives.

In a specific embodiment, the photovoltaic device includes an electrode structure 1911 overlying the surface region of the hole transporting/electron blocking material. In a specific embodiment, the electrode structure can be made of a suitable material or combination of materials. The suitable material can be a metal, an organic material, or a combination of these, and the like. Depending upon the embodiment, the electrode structure can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode structure can be a carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For optically transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives. Further details of way of making the present device can be found throughout the present specification and more particularly below.

A method according to an alternative embodiment of the present invention for forming a nanocomposite material for a photovoltaic device is briefly describe below.

1. Provide a substrate (e.g., glass) including a surface region;
2. Clean (e.g., RCA, sonic, ultrasonic) the surface region;
3. Form an electrode layer overlying the surface region;
4. Form an electron transporting/hole blocking material overlying the electrode layer;
5. Form a conformal nanostructured material (e.g., nanoparticles, quantum dots, quantum wires, nano-columns, nanorods, nanotubes, quantum wells, nanoshells, nanobelts, nanoporous materials) overlying the electron transporting/hole blocking material;
6. Form a hole transporting/electron blocking material overlying the nanostructured material;
7. Form an electrode structure overlying the hole transporting/electron blocking material;
8. Perform other steps, as desired; and
9. Provide a photovoltaic device having an optical absorption coefficient of at least $10^3$ cm$^{-1}$ for light comprised of wavelengths within the range of about 400 nm to about 700 nm characterizes at least the nanostructured material.

The above sequence of steps provides a method according to an embodiment of the present invention. As shown, the method uses a combination of steps including a way of forming a nanostructured material and hole transporting/blocking and electron transporting/blocking materials for photovoltaic applications according to an embodiment of the present invention. Other alternatives can also be provided where steps are added, one or more steps are removed, or one or more steps are provided in a different sequence without departing from the scope of the claims herein. Further details of the present method according to a specific embodiment can be found throughout the present specification and more particularly below.

Figure 20:
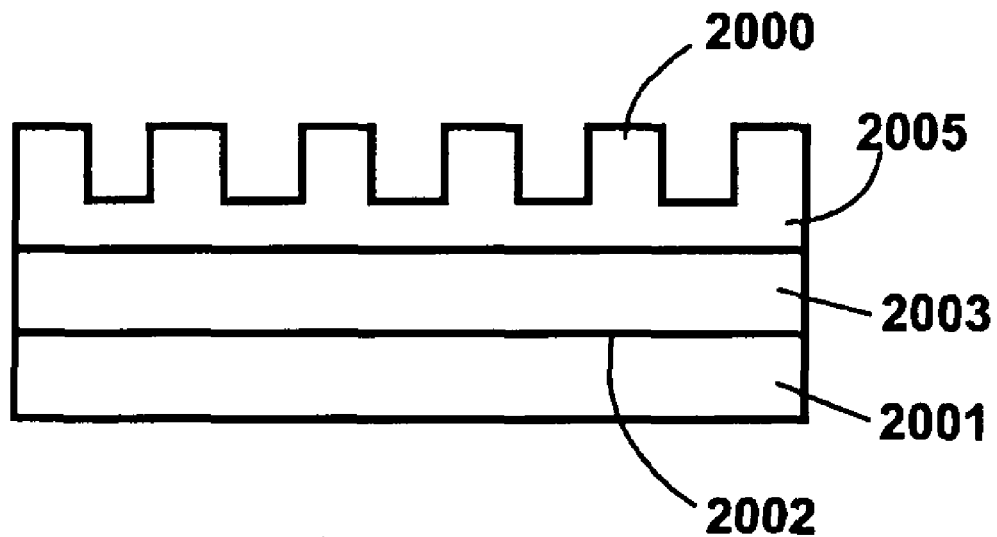
FIGS. 20 through 22 are simplified diagrams of an illustration of yet an alternative method of fabricating a nanostructured material for a photovoltaic device according to an alternative embodiment of the present invention.
Figure 21:
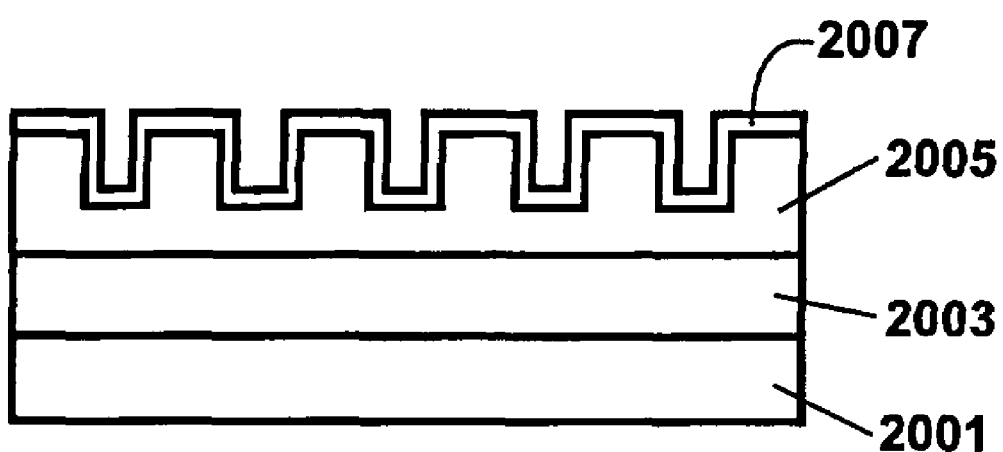
Figure 22:
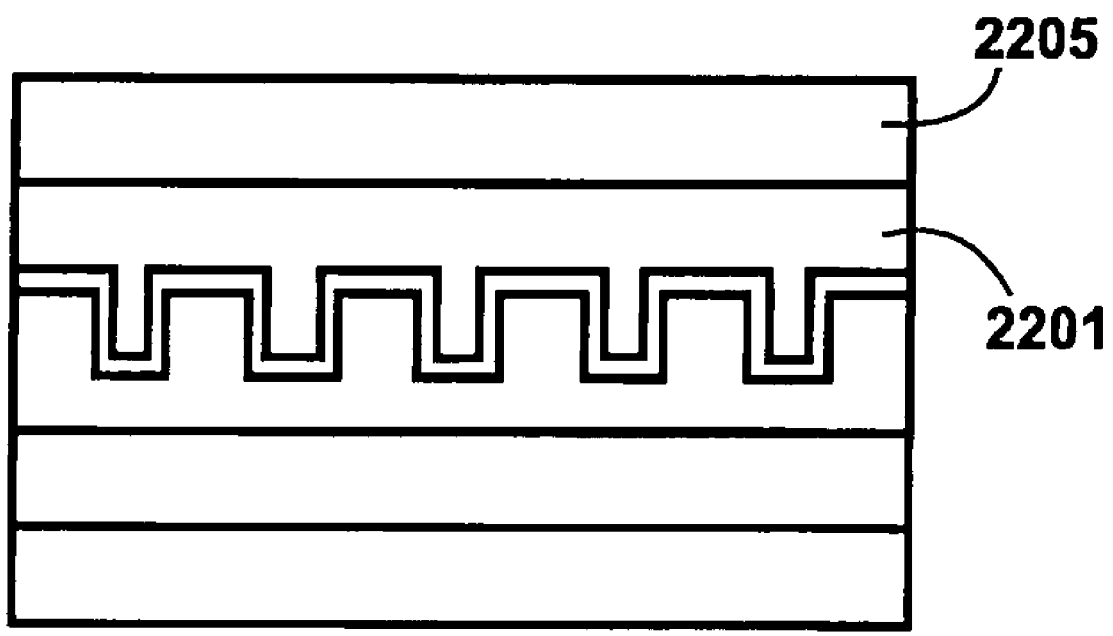

FIGS. 20 through 22 are simplified diagrams of an illustration of yet an alternative method of fabricating a nanostructured material for a photovoltaic device according to an alternative embodiment of the present invention. These diagrams are merely examples, which should not unduly limit the scope of the claims herein. One of ordinary skill would recognize other variations, modifications, and alternatives. As shown, the present method begins by providing a substrate member 2001 including a overlying surface region 2002. In a specific embodiment, the substrate member can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, an organic material, or any combination of these, and the like. Alternatively, the substrate member can be a semiconductor material, such as silicon, silicon-germanium alloys, germanium, Group III/V, or Group II/VI materials, and the like. Of course, there can be other variations, modifications, and alternatives.

In a specific embodiment, the method includes a cleaning process to clean the surface region using one or more suitable techniques. In a specific embodiment, the cleaning process can include a wet and/or dry cleaning technique. Examples of such wet cleaning technique include, among others, an RCA clean, a wet dip, an organic wash with solvents such as acetone and/or alcohols, such as isopropyl alcohol, ethanol, any combinations of these and the like. The cleaning process can also include using ultra clean water such as deionized water and/or substantially particle free water. In other embodiments, the cleaning process can include a plasma clean using an oxide and/or inert gas species, such as nitrogen, argon, and other suitable gases, and the like. Once cleaning has occurred, the surface region is substantially free from particulates, organic contaminants, metals, and other chemicals, including combinations of these. Of course, one of ordinary skill in the art would recognize other variations, modifications, and alternatives.

Referring to FIG. 20 again, the method includes forming an electrode layer 2003 overlying the surface region. In some embodiments, the electrode layer may be formed by conventional deposition methods such as sputtering, evaporation, and solution deposition. As shown, the electrode layer is overlying the surface region of the substrate member. In a specific embodiment, the electrode structure can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For optically transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode layer is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

Optionally, the present method may include a cleaning process after formation of the electrode layer. In a specific embodiment, the cleaning process can include a wet and/or a dry cleaning technique. Examples of such wet cleaning technique include, among others, an RCA clean, a wet dip, an organic wash with solvents such as acetone and/or alcohols, such as isopropyl alcohol, ethanol, any combinations of these and the like. The cleaning process can also include using ultra clean water such as deionized water and/or substantially particle free water. In other embodiments, the cleaning process can include a plasma clean using an oxide and/or inert gas species, such as nitrogen, argon, and other suitable gases, and the like. Once cleaning has occurred, the electrode layer is substantially free from particulates, organic contaminants, metals, and other chemicals, including combinations of these. In a preferred embodiment, the method performs a subsequent deposition process before any contamination of the electrode layer takes place. Of course, one of ordinary skill in the art would recognize other variations, modifications, and alternatives.

In a preferred embodiment, the method forms an electron transporting/hole blocking material 2005, as illustrated again by FIG. 20. In a specific embodiment, the electron transporting/hole blocking material has suitable properties that facilitate transport of electrons, while also blocking transport of holes. As shown, the electron transporting/hole blocking material is overlying the electrode layer 2003, which is preferably transparent. In a specific embodiment, the electron transporting/hole blocking material is a nanostructured material, which includes surface topography 2006, as shown. Additionally, the substrate member is also optically transparent according to a specific embodiment. Alternatively, the electrode layer and substrate member are not transparent and may also include reflective materials, which allow for electromagnetic radiation to reflect back toward an active region of the photovoltaic device according to a specific embodiment. As merely an example, the electron transporting/hole blocking material can be inorganic semiconductors, metal oxides, organic semiconductors, or any other suitable material, including combinations of materials, layered materials, and the like. In a specific embodiment, the electron transporting/hole blocking material can be a metal oxide including, but not limited to, ZnO, $TiO_2$, $SnO_2$, $WO_3$, $Fe_2O_3$, other metal oxides, and the like. Of course, there can be other variations, modifications, and alternatives.

In a specific embodiment, the photovoltaic device includes a nanostructured material 2007 overlying the electron transporting/hole blocking material 2005, as illustrated by FIG. 21. In a preferred embodiment, the nanostructured material is electrically coupled to a surface region of the electrode layer. The nanostructured material has a non-planar surface region according to a specific embodiment. Depending upon the embodiment, the nanostructured material is comprised of a plurality of nanostructures selected from nanoparticles, quantum dots, quantum wires, nano-columns, nanorods, nanotubes, quantum wells, nanoshells, nanobelts, nanoporous materials, any combination of these, and the like. In a specific embodiment, the nanostructured material confirms to the surface of the electron transporting/hole blocking material and does not fill voids within the nanostructured material of the electron transporting/hole blocking material. Of course, there can be other variations, modifications, and alternatives.

In a specific embodiment, the nanostructured material is made of a suitable composite, homogeneous material, or heterogeneous material, including layered materials, graded materials, and the like. In a specific embodiment, the nanostructured material is comprised of semiconductor materials, e.g., Group IV (e.g., silicon, silicon-germanium alloys, germanium) Group II/VI, Group III/V, combinations of these, and the like. Depending upon the embodiment, the semiconductor material can be an inorganic semiconductor or organic semiconductor material. In other embodiments, the material can be made of a metal oxide species. As an example, the metal oxide can be ZnO, $TiO_2$, $SnO_2$, $WO_3$, CuO, $Cu_2O$, FeO, $Fe_2O_3$, combinations of these, and the like. In other general embodiments, the nanostructured material is selected from metal sulfides, e.g., $Cu_2S$, FeS, $FeS_2$, SnS, $SnS_2$, ZnS, a combination of these, and the like. Alternatively, the nanostructured material may be a semiconductor material comprises of a Group IV semiconductor species, from example, $FeSi_2$. Of course, there can be variations, alternatives, and modifications.

In other embodiments, the nanostructured materials can have a certain spatial morphology using one or more materials. As an example, the nanostructured material is comprised of nano-columns selected from Group IV semiconductor materials, Group IV-IV semiconductor materials, and metal oxides, and the like. In an alternative embodiment, the nanostructured material is comprised of nano-columns selected from Si, Ge, SiGe alloys. In other embodiments, the nanostructured material is comprised of nano-columns selected from ZnO, FeO, $Fe_2O_3$, CuO, $Cu_2O$. In yet other embodiments, the nanostructured material is comprised of nanotubes selected from Group IV semiconductor materials, Group IV-IV semiconductor materials, and metal oxides. In other embodiments, the nanostructured material is comprised of nano-tubes comprised of $TiO_2$. In a yet alternative embodiment, the nanostructured material may comprise of nanostructured metal sulfides such as $FeS_2$, SnS, $SnS_2$, ZnS, $Cu_2S$, among others. Alternatively, the nanostructured material may include a semiconductor material comprises of a Group IV semiconductor species such as $FeSi_2$, and the like. Of course, there can be other variations, modifications, and alternatives.

Depending upon the embodiment, the nanostructured material can have certain spatial dimensions. As an example, the thickness of the nanostructured material ranges from about 1 nm to about 5000 nm. In an alternative embodiment, the thickness of the nanostructured material ranges from about 1 nm to about 1000 nm. Still further, the thickness of the nanostructured material ranges from about 1 nm to about 500 nm. Alternatively, the thickness of the nanostructured material ranges from about 1 nm to about 100 nm. In other embodiments, the thickness of the nanostructured material ranges from about 1 nm to about 50 nm. Of course, there can be other variations, modifications, and alternatives.

In a specific embodiment, the photovoltaic device also has a first electron affinity and a first ionization potential that characterize the nanostructured material. A second electron affinity and a second ionization potential characterize the electron transporting/hole blocking material, and a third electron affinity and a third ionization potential characterize the hole transporting/electron blocking material according to a specific embodiment. In a preferred embodiment, the third electron affinity and the third ionization potential are less than the first electron affinity and the first ionization potential, respectively, and the first electron affinity and the first ionization potential are less than the second electron affinity and the second ionization potential, respectively. In a preferred embodiment, the second electron affinity is less than the third ionization potential. In a preferred embodiment, the nanostructured material has an optical absorption coefficient of at least $10^3$ cm$^{-1}$ for light comprised of wavelengths within the range of about 400 nm to about 700 nm. Of course, there can be other variations, modifications, and alternatives.

In a specific embodiment, the photovoltaic device has certain electron affinities and ionization potentials characterizing the nanostructure materials and each of the carrier transporting/carrier blocking materials. In a specific embodiment, the electron affinity and the ionization potential of the electron transporting/hole blocking material are greater than the electron affinity and the ionization potential of the nanostructured material, respectively, by at least 100 meV, and the electron affinity and the ionization potential of the nanostructured material are greater than the electron affinity and the ionization potential of the hole transporting/electron blocking material, respectively, by at least 100 meV. In other embodiments, the electron affinity and the ionization potential of the electron transporting/hole blocking material are greater than the electron affinity and the ionization potential of the nanostructured material, respectively, by at least 300 meV, and the electron affinity and the ionization potential of the nanostructured material are greater than the electron affinity and the ionization potential of the hole transporting/electron blocking material, respectively, by at least 300 meV. In other embodiments, the electron affinity and the ionization potential of the electron transporting/hole blocking material are greater than the electron affinity and the ionization potential of the nanostructured material, respectively, by at least 500 meV, and the electron affinity and the ionization potential of the nanostructured material are greater than the electron affinity and the ionization potential of the hole transporting/electron blocking material, respectively, by at least 500 meV. Of course, there can be other variations, modifications, and alternatives.

The nanostructured material is characterized by a bandgap according to a specific embodiment. The bandgap of the nanostructured material is within the range of about 1.0 eV to about 2.0 eV according to a specific embodiment. In an alternative specific embodiment, the bandgap of the nanostructured material is within the range of about 1.2 eV to about 1.8 eV. Alternatively, the bandgap of the nanostructured material is within the range of about 1.3 eV to about 1.6 eV. Of course, there can be other variations, modifications, and alternatives.

The nanostructured material, the electron transporting/hole blocking material, the hole transporting/electron blocking material can each have a carrier mobility according to a specific embodiment. The carrier mobility of the nanostructured material, the electron mobility of the electron transporting/hole blocking material, and the hole mobility of the hole transporting/electron blocking material are within the range of about $10^{-6}$ cm$^2$/V-s to about 5000 cm$^2$/V-s according to a specific embodiment. In another embodiment, carrier mobility of the nanostructured material, the electron mobility of the electron transporting/hole blocking material, and the hole mobility of the hole transporting/electron blocking material are within the range of about $10^{-3}$ cm$^2$/V-s to about 1000 cm$^2$/V-s. In other embodiments, carrier mobility of the nanostructured material, the electron mobility of the electron transporting/hole blocking material, and the hole mobility of the hole transporting/electron blocking material are within the range of about 1 cm$^2$/V-s to about 100 cm$^2$/V-s. Of course, there can be other variations, modifications, and alternatives.

In a specific embodiment, the photovoltaic device has positive charge carriers and negative charge carriers generated by optical absorption by the nanostructured material that separate at the interface between the nanostructured material and the electron transporting/hole blocking material, and separate at the interface between the nanostructured material and the hole transporting/electron blocking material according to a specific embodiment. The negative charge carriers transport in the nanostructured material with the larger electron affinity, and the positive charge carriers transport in the nanostructured material with the smaller ionization potential. In a specific embodiment, the charge carriers undergo majority carrier transport within the electron transporting/hole blocking material and the hole transporting/electron blocking material. Of course, there can be other variations, modifications, and alternatives.

In a preferred embodiment, the method forms an overlying hole transporting/electron blocking material 22011, as illustrated by FIG. 22. In a specific embodiment, the hole transporting/electron blocking material has suitable properties that facilitate transport of holes, while also blocking transport of electrons. As shown, the hole transporting/electron blocking material is overlying the nanostructured material according to a specific embodiment. In a specific embodiment, the hole transporting/electron blocking material has a planar surface region, and fills an entirety of any voids within the nanostructured material. In a specific embodiment, the hole transporting/electron blocking material can be selected from metal oxides, Group IV semiconductor materials, Group IV-IV semiconductor materials, metal sulfides, copper compounds, organic semiconductors, combinations of these, which may be composites and/or layered, and the like. In a specific embodiment, the hole transporting/electron blocking material is selected from NiO, $Cu_2O$, Si, Ge, SiGe alloys, $Cu_2S$, CuI, CuSCN, CuPc, ZnPc, combinations of these, which may be composites and/or layered, and the like. Of course, there can be other variations, modifications, and alternatives.

In a specific embodiment, the electron transporting/hole blocking material is positioned between the nanostructured material and the electron collecting electrode, which will be described more fully below. Negatively charged carriers generated by optical absorption by the nanostructured material are preferentially separated into the electron transporting/hole blocking material and transport within the electron transporting/hole blocking material in a specific embodiment. In an alternative embodiment, the hole transporting/electron blocking material is positioned between the nanostructured material and the hole collecting electrode; which has been previously described. Positively charged carriers generated by optical absorption by the nanostructured material are preferentially separated into the hole transporting/electron blocking material and transport within the hole transporting/electron blocking material according to a specific embodiment. Of course, there can be other variations, modifications, and alternatives.

Referring to FIG. 22, the method forms an electrode structure 2205 overlying the surface region of the hole transporting/electron blocking material. In a specific embodiment, the electrode structure can be made of a suitable material or combination of materials. The suitable material can be a metal, an organic material, or a combination of these, and the like. Depending upon the embodiment, the electrode structure can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode structure can be a carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

The above sequence of steps provides a method according to an embodiment of the present invention. As shown, the method uses a combination of steps including a way of forming a nanostructured material and hole transporting/blocking and electron transporting/blocking materials for photovoltaic applications according to an embodiment of the present invention. Other alternatives can also be provided where steps are added, one or more steps are removed, or one or more steps are provided in a different sequence without departing from the scope of the claims herein. Further details of the present method and devices according to a specific embodiment can be found throughout the present specification and more particularly below.

Figure 23:
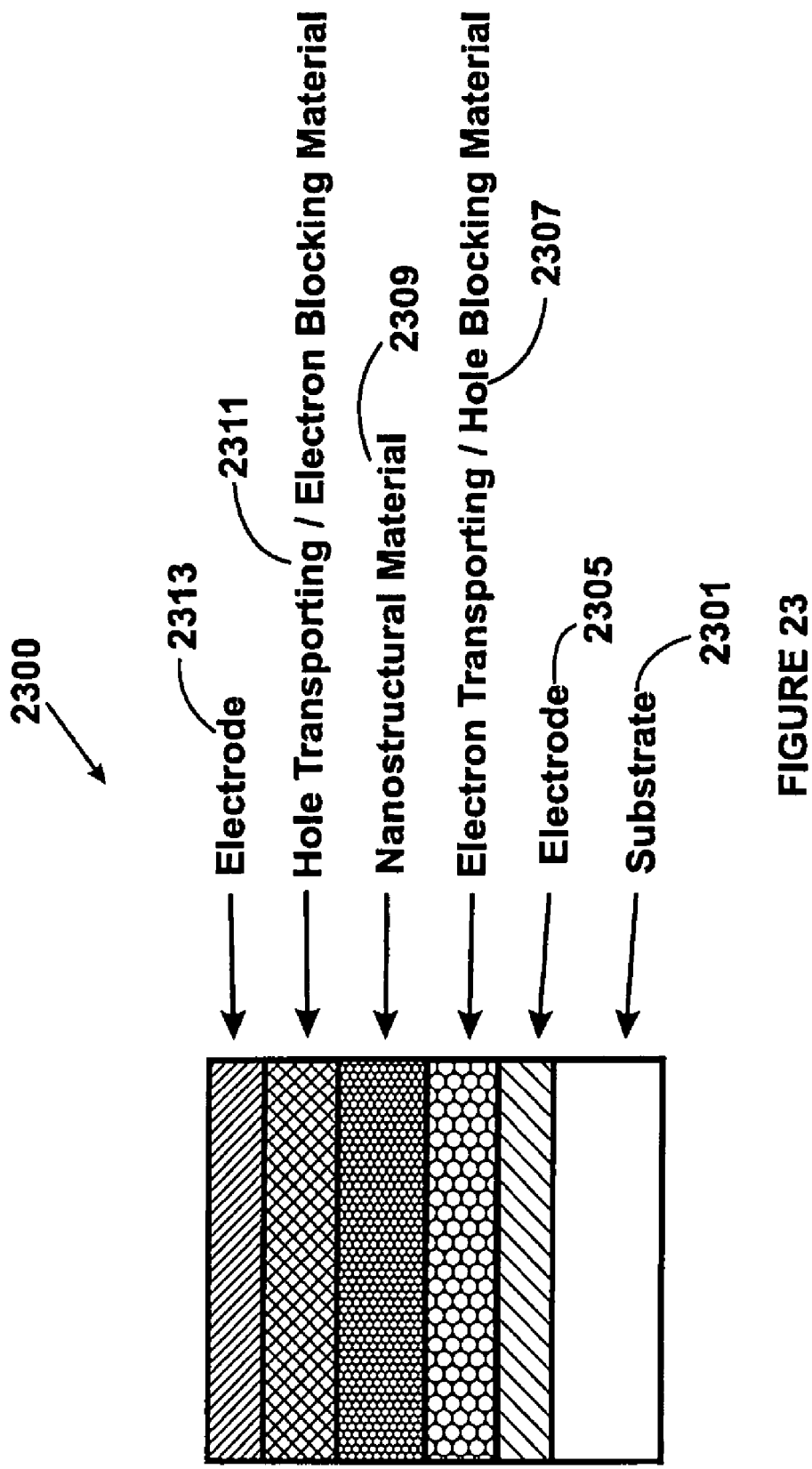
FIG. 23 is a simplified diagram illustrating yet an alternative nanostructured material for a photovoltaic device according to an embodiment of the present invention.

FIG. 23 is a simplified diagram illustrating yet an alternative nanostructured material 2300 for a photovoltaic device according to an embodiment of the present invention. This diagram is merely an example, which should not unduly limit the scope of the claims herein. One of ordinary skill would recognize other variations, modifications, and alternatives. As shown is a photovoltaic device made of a nanostructured material comprised of, e.g., nanoparticles, quantum dots, quantum wires, nano-columns, nanorods, nanotubes, quantum wells, nanoshells, nanobelts, nanoporous materials. In a specific embodiment, the photovoltaic device includes a substrate member 2301. The substrate member includes an overlying surface region. In a specific embodiment, the substrate member can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, or any combination of these, and the like. Alternatively, the substrate member can be a semiconductor material, such as silicon, silicon-germanium alloys, germanium, Group III/V, or Group II/VI materials, and the like. Of course, there can be other variations, modifications, and alternatives.

In a specific embodiment, the photovoltaic device includes an electrode layer 2305 overlying the surface region of the substrate member. In a specific embodiment, the electrode layer can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For optically transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode layer is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

In a preferred embodiment, the photovoltaic device has an overlying electron transporting/hole blocking material 2307. In a specific embodiment, the electron transporting/hole blocking material has suitable properties that facilitate transport of electrons, while also blocking transport of holes. As shown, the electron transporting/hole blocking material is overlying the electrode layer 2305, which is preferably transparent. Additionally, the substrate member is also optically transparent according to a specific embodiment. Alternatively, the electrode layer and the substrate member are not transparent and may also include reflective materials, which allow for electromagnetic radiation to reflect back toward an active region of the photovoltaic device according to a specific embodiment. In a preferred embodiment, the electron transporting/hole blocking material is nanostructured based. That is, the electron transporting hole blocking material can be made of physical structures including, but not limited to, nanoparticles, quantum dots, quantum wires, nano-columns, nanorods, nanotubes, quantum wells, nanoshells, nanobelts, nanoporous materials, including combinations, multilayered structures, and the like. Of course, there can be variations, modifications, and alternatives.

Additionally, the electron transporting/hole blocking material can be made of a suitable species. As merely an example, the electron transporting/hole blocking material can be inorganic semiconductors, metal oxides, organic semiconductors, or any other suitable material, including combinations of materials, layered materials, and the like. In a specific embodiment, the electron transporting/hole blocking material can be a metal oxide including, but not limited to, ZnO, $TiO_2$, $SnO_2$, $WO_3$, $Fe_2O_3$, other metal oxide, and the like. Of course, there can be other variations, modifications, and alternatives.

In a specific embodiment, the photovoltaic device includes a nanostructured material 2309 overlying the electron transporting/hole blocking material 2307. In a preferred embodiment, the nanostructured material is electrically coupled to a surface region of the electrode layer. The nanostructured material has a planar surface region according to a specific embodiment. Depending upon the embodiment, the nanostructured material is comprised of a plurality of nanostructures selected from nanoparticles, quantum dots, quantum wires, nano-columns, nanorods, nanotubes, quantum wells, nanoshells, nanobelts, nanoporous materials, any combination of these, and the like. In a preferred embodiment, the nanostructured material is thin and conforms to the surfaces of the electron transporting/hole blocking material. In a specific embodiment, the nanostructured material is less than about 50 nm for a semiconductor material, e.g., silicon, silicon germanium. Of course, there can be other variations, modifications, and alternatives.

In a specific embodiment, the nanostructured material is made of a suitable composite, homogeneous material, or heterogeneous material, including layered materials, graded materials, and the like. In a specific embodiment, the nanostructured material is comprised of semiconductor materials, e.g., Group IV (e.g., silicon, silicon-germanium alloys, germanium) Group II/VI, Group III/V, combinations of these, and the like. Depending upon the embodiment, the semiconductor material can be an inorganic semiconductor or organic semiconductor material. In other embodiments, the nanostructured material can be made of a metal oxide species. As an example, the metal oxide can be ZnO, $TiO_2$, $SnO_2$, $WO_3$, CuO, $Cu_2O$, FeO, $Fe_2O_3$, combinations of these, and the like. In other general embodiments, the nanostructured material is selected from metal sulfides, e.g., $Cu_2S$, FeS, $FeS_2$, SnS, $SnS_2$, ZnS, a combination of these and the like. Alternatively, the nanostructure material can be a semiconductor material comprises a Group IV semiconductor species, for example, $FeSi_2$ and the like. Of course, there can be variations, alternatives, and modifications.

In other embodiments, the nanostructured materials can have a certain spatial morphology using one or more materials. As an example, the nanostructured material is comprised of nano-columns selected from Group IV semiconductor materials, Group IV-IV semiconductor materials, and metal oxides, and the like. In an alternative embodiment, the nanostructured material is comprised of nano-columns selected from Si, Ge, SiGe alloys. In other embodiments, the nanostructured material is comprised of nano-columns selected from ZnO, FeO, $Fe_2O_3$, CuO, $Cu_2O$. In yet other embodiments, the nanostructured material is comprised of nano-tubes selected from Group IV semiconductor materials, Group IV-IV semiconductor materials, and metal oxides. In other embodiments, the nanostructured material is comprised of nano-tubes comprised of $TiO_2$. In certain embodiments, the nanostructured material can include metal sulfides such as $FeS_2$, SnS, $SnS_2$, ZnS, $Cu_2S$, and others. Alternatively, the nanostructured material may also include a semiconductor material comprises a Group IV semiconductor species such as $FeSi_2$, and others. Of course, there can be other variations, modifications, and alternatives.

Depending upon the embodiment, the nanostructured material conforms to the features of the electron blocking/hole transporting material and can have certain spatial dimensions. As an example, the thickness of the nanostructured material ranges from about 1 nm to about 100 nm. In an alternative embodiment, the thickness of the nanostructured material ranges from about 1 nm to about 75 nm. Still further, the thickness of the nanostructured material ranges from about 1 nm to about 50 nm. Alternatively, the thickness of the nanostructured material ranges from about 1 nm to about 25 nm. Of course, there can be other variations, modifications, and alternatives.

In a specific embodiment, the photovoltaic device also has a first electron affinity and a first ionization potential that characterize the nanostructured material. A second electron affinity and a second ionization potential characterize the electron transporting/hole blocking material, and a third electron affinity and a third ionization potential characterize the hole transporting/electron blocking material according to a specific embodiment. In a preferred embodiment, the third electron affinity and the third ionization potential are less than the first electron affinity and the first ionization potential, respectively, and the first electron affinity and the first ionization potential are less than the second electron affinity and the second ionization potential, respectively. In a preferred embodiment, the second electron affinity is less than the third ionization potential. In a preferred embodiment, the nanostructured material has an optical absorption coefficient of at least $10^3$ $cm^{-1}$ for light comprised of wavelengths within the range of about 400 nm to about 700 nm. Of course, there can be other variations, modifications, and alternatives.

In a specific embodiment, the photovoltaic device has certain electron affinities and ionization potentials characterizing the nanostructure materials and each of the carrier transporting/carrier blocking materials. In a specific embodiment, the electron affinity and the ionization potential of the electron transporting/hole blocking material are greater than the electron affinity and the ionization potential of the nanostructured material, respectively, by at least 100 meV, and the electron affinity and the ionization potential of the nanostructured material are greater than the electron affinity and the ionization potential of the hole transporting/electron blocking material, respectively, by at least 100 meV. In other embodiments, the electron affinity and the ionization potential of the electron transporting/hole blocking material are greater than the electron affinity and the ionization potential of the nanostructured material, respectively, by at least 300 meV, and the electron affinity and the ionization potential of the nanostructured material are greater than the electron affinity and the ionization potential of the hole transporting/electron blocking material, respectively, by at least 300 meV. In other embodiments, the electron affinity and the ionization potential of the electron transporting/hole blocking material are greater than the electron affinity and the ionization potential of the nanostructured material, respectively, by at least 500 meV, and the electron affinity and the ionization potential of the nanostructured material are greater than the electron affinity and the ionization potential of the hole transporting/ electron blocking material, respectively, by at least 500 meV. Of course, there can be other variations, modifications, and alternatives.

The nanostructured material is characterized by a bandgap according to a specific embodiment. The bandgap of the nanostructured material is within the range of about 1.0 eV to about 2.0 eV according to a specific embodiment. In an alternative specific embodiment, the bandgap of the nanostructured material is within the range of about 1.2 eV to about 1.8 eV. Alternatively, the bandgap of the nanostructured material is within the range of about 1.3 eV to about 1.6 eV. Of course, there can be other variations, modifications, and alternatives.

The nanostructured material, the hole transporting/electron blocking material, the electron transporting/hole blocking material can each have a carrier mobility according to a specific embodiment. The carrier mobility of the nanostructured material, the electron mobility of the electron transporting/hole blocking material, and the hole mobility of the hole transporting/electron blocking material are within the range of about $10^{-6}$ cm$^2$/V-s to about 5000 cm$^2$/V-s according to a specific embodiment. In another embodiment, carrier mobility of the nanostructured material, the electron mobility of the electron transporting/hole blocking material, and the hole mobility of the hole transporting/electron blocking material are within the range of about $10^{-3}$ cm$^2$/V-s to about 1000 cm$^2$/V-s. In other embodiments, carrier mobility of the nanostructured material, the electron mobility of the electron transporting/hole blocking material, and the hole mobility of the hole transporting/electron blocking material are within the range of about 1 cm$^2$/V-s to about 100 cm$^2$/V-s. Of course, there can be other variations, modifications, and alternatives.

As shown, the photovoltaic device has positive charge carriers and negative charge carriers generated by optical absorption by the nanostructured material that separate at the interface between the nanostructured material and the electron transporting/hole blocking material, and separate at the interface between the nanostructured material and the hole transporting/electron blocking material according to a specific embodiment. The negative charge carriers transport in the nanostructured material with the larger electron affinity, and the positive charge carriers transport in the nanostructured material with the smaller ionization potential. In a specific embodiment, the charge carriers undergo majority carrier transport within the electron transporting/hole blocking material and the hole transporting/electron blocking material. Of course, there can be other variations, modifications, and alternatives.

In a preferred embodiment, the photovoltaic device has an overlying hole transporting/electron blocking material 2311. In a specific embodiment, the hole transporting/electron blocking material has suitable properties that facilitate transport of holes, while also blocking transport of electrons. As shown, the hole transporting/electron blocking material is overlying the nanostructured material according to a specific embodiment. In a specific embodiment, the hole transporting/electron blocking material can be selected from metal oxides, Group IV semiconductor materials, Group IV-IV semiconductor materials, metal sulfides, copper compounds, organic semiconductors, combinations of these, which may be composites and/or layered, and the like. In a specific embodiment, the hole transporting/electron blocking material is selected from NiO, Cu$_2$O, Si, Ge, SiGe alloys, Cu$_2$S, CuI, CuSCN, CuPc, ZnPc, combinations of these, which may be composites and/or layered, and the like. Of course, there can be other variations, modifications, and alternatives.

In a specific embodiment, the electron transporting/hole blocking material is positioned between the nanostructured material and the electron collecting electrode, which will be described more fully below. Negatively charged carriers generated by optical absorption by the nanostructured material are preferentially separated into the electron transporting/hole blocking material and transport within the electron transporting/hole blocking material in a specific embodiment. In an alternative embodiment, the hole transporting/electron blocking material is positioned between the nanostructured material and the hole collecting electrode; which has been previously described. Positively charged carriers generated by optical absorption by the nanostructured material are preferentially separated into the hole transporting/electron blocking material and transport within the hole transporting/electron blocking material according to a specific embodiment. Of course, there can be other variations, modifications, and alternatives.

In a specific embodiment, the photovoltaic device includes an electrode structure 2313 overlying the surface region of the hole transporting/electron blocking material. In a specific embodiment, the electrode structure can be made of a suitable material or combination of materials. The suitable material can be a metal, an organic material, or a combination of these, and the like. Depending upon the embodiment, the electrode structure can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode structure can be a carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives. Further details of way of making the present device can be found throughout the present specification and more particularly below.

A method according to an alternative embodiment of the present invention for forming a nanocomposite material for a photovoltaic device is briefly describe below.

1. Provide a substrate (e.g., glass) including a surface region;
2. Clean (e.g., RCA, sonic, ultrasonic) the surface region;
3. Form an electrode layer overlying the surface region;
4. Form an electron transporting/hole blocking material overlying the electrode layer;
5. Form a conformal nanostructured material (e.g., nanoparticles, quantum dots, quantum wires, nano-columns, nanorods, nanotubes, quantum wells, nanoshells, nanobelts, nanoporous materials) overlying the electron transporting/hole blocking material;
6. Form a hole transporting/electron blocking material overlying the nanostructured material;
7. Form an electrode structure overlying the hole transporting/electron blocking material;
8. Perform other steps, as desired; and 9. Provide a photovoltaic device having an optical absorption coefficient of at least $10^3$ cm$^{-1}$ for light comprised of wavelengths within the range of about 400 nm to about 700 nm characterizes at least the nanostructured material.

The above sequence of steps provides a method according to an embodiment of the present invention. As shown, the method uses a combination of steps including a way of forming a nanostructured material and hole transporting/blocking and electron transporting/blocking materials for photovoltaic applications according to an embodiment of the present invention. Other alternatives can also be provided where steps are added, one or more steps are removed, or one or more steps are provided in a different sequence without departing from the scope of the claims herein. Further details of the present method according to a specific embodiment can be found throughout the present specification and more particularly below.

Figure 24:
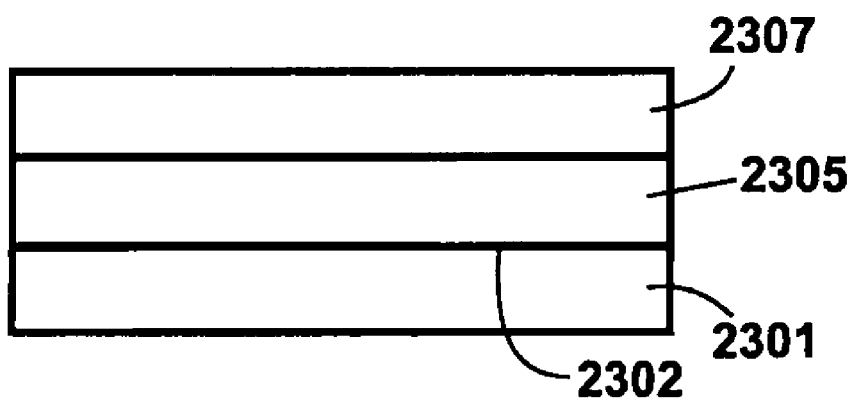
FIGS. 24 through 25 are simplified diagrams of an illustration of yet an alternative method of fabricating a nanostructured material for a photovoltaic device according to an alternative embodiment of the present invention.
Figure 25:
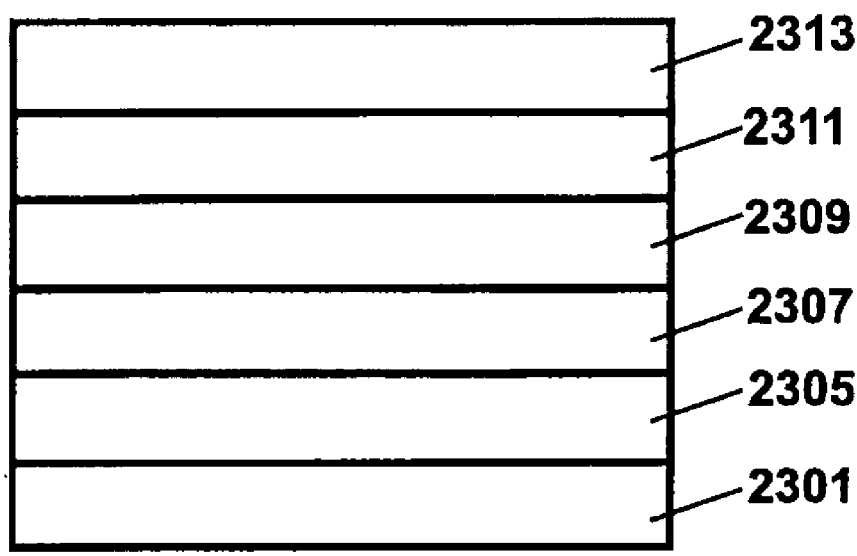

FIGS. 24 through 25 are simplified diagrams of an illustration of yet an alternative method of fabricating a nanostructured material for a photovoltaic device according to an alternative embodiment of the present invention. These diagrams are merely examples, which should not unduly limit the scope of the claims herein. One of ordinary skill would recognize other variations, modifications, and alternatives. As shown, the present method begins by providing a substrate 2301 including a surface region 2302. The substrate member includes an overlying surface region. In a specific embodiment, the substrate member can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, an organic material, or any combination of these, and the like. Alternatively, the substrate member can be a semiconductor material, such as silicon, silicon-germanium alloys, germanium, Group III/V, or Group II/VI materials, and the like. Of course, there can be other variations, modifications, and alternatives.

In a specific embodiment, the method includes a cleaning process to clean the surface region using one or more suitable techniques. In a specific embodiment, the cleaning process can include a wet and/or dry cleaning technique. Examples of such wet cleaning technique include, among others, an RCA clean, a wet dip, an organic wash with solvents such as acetone and/or alcohols, such as isopropyl alcohol, ethanol, any combinations of these and the like. The cleaning process can also include using ultra clean water such as deionized water and/or substantially particle free water. In other embodiments, the cleaning process can include a plasma clean using an oxide and/or inert gas species, such as nitrogen, argon, and other suitable gases, and the like. Once cleaning has occurred, the surface region is substantially free from particulates, organic contaminants, metals, and other chemicals, including combinations of these. Of course, one of ordinary skill in the art would recognize other variations, modifications, and alternatives.

Referring to FIG. 24 again, the method includes forming an electrode layer 2301 overlying the surface region. In some embodiments, the electrode layer may be formed by conventional deposition methods such as sputtering, evaporation, and solution deposition. As shown, the electrode layer is overlying the surface region of the substrate member. In a specific embodiment, the electrode layer can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode layer is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

Optionally, the present method may include a cleaning process after formation of the electrode layer. In a specific embodiment, the cleaning process can include a wet and/or dry cleaning technique. Examples of such wet cleaning technique include, among others, an RCA clean, a wet dip, an organic wash with solvents such as acetone and/or alcohols, such as isopropyl alcohol, ethanol, any combinations of these and the like. The cleaning process can also include using ultra clean water such as deionized water and/or substantially particle free water. In other embodiments, the cleaning process can include a plasma clean using an oxide and/or inert gas species, such as nitrogen, argon, and other suitable gases, and the like. Once cleaning has occurred, the surface region is substantially free from particulates, organic contaminants, metals, and other chemicals, including combinations of these. In a preferred embodiment, the method performs a subsequent deposition process before any contamination of the electrode layer takes place. Of course, one of ordinary skill in the art would recognize other variations, modifications, and alternatives.

In a preferred embodiment, the method forms an overlying electron transporting/hole blocking material 2305, as illustrated again by FIG. 24. In a specific embodiment, the electron transporting/hole blocking material has suitable properties that facilitate transport of electrons, while also blocking transport of holes. As shown, the electron transporting/hole blocking material is overlying the electrode 2301, which is preferably transparent. In a specific embodiment, the electron transporting/hole blocking material is a nanostructured material, which includes a planar surface topography, as shown. Additionally, the substrate member is also optically transparent according to a specific embodiment. Alternatively, the electrode layer and the substrate member are not transparent and may also include reflective materials, which allow for electromagnetic radiation to reflect back toward an active region of the photovoltaic materials according to a specific embodiment. As merely an example, the electron transporting/hole blocking material can be inorganic semiconductors, metal oxides, organic semiconductors, or any other suitable material, including combinations of materials, layered materials, and the like. In a specific embodiment, the electron transporting/hole blocking material can be a metal oxide including, but not limited to, ZnO, TiO$_2$, SnO$_2$, WO$_3$, Fe$_2$O$_3$, other metal oxide, and the like. Of course, there can be other variations, modifications, and alternatives.

In a specific embodiment, the photovoltaic device includes a nanostructured material 2309 overlying the electron transporting/hole blocking material 2307, as illustrated by FIG. 24. In a preferred embodiment, the nanostructured material is electrically coupled to a surface region of the electrode layer. The nanostructured material has a planar surface region according to a specific embodiment. Depending upon the embodiment, the nanostructured material is comprised of a plurality of nanostructures selected from nanoparticles, quantum dots, quantum wires, nano-columns, nanorods, nanotubes, quantum wells, nanoshells, nanobelts, nanoporous materials, any combination of these, and the like. In a specific embodiment, the nanostructured material confirms to the surface of the electron transporting/hole blocking material and does not fill voids within the nanostructured material of the electron transporting/hole blocking material. Of course, there can be other variations, modifications, and alternatives.

In a specific embodiment, the nanostructured material is made of a suitable composite, homogeneous material, or heterogeneous material, including layered materials, graded materials, and the like. In a specific embodiment, the nanostructured material is comprised of semiconductor materials, e.g., Group IV (e.g., silicon, silicon-germanium alloys, germanium) Group II/VI, Group III/V, combinations of these, and the like. Depending upon the embodiment, the semiconductor material can be an inorganic semiconductor or organic semiconductor material. In other embodiments, the material can be made of a metal oxide species. As an example, the metal oxide can be ZnO, $TiO_2$, $SnO_2$, $WO_3$, CuO, $Cu_2O$, FeO, $Fe_2O_3$, combinations of these, and the like. In other general embodiments, the nanostructured material is selected from metal sulfides, e.g., $Cu_2S$, FeS, $FeS_2$, SnS, $SnS_2$, ZnS, a combination of these and the like. Alternatively, the nanostructured material may be a semiconductor material comprises a Group IV semiconductor species, for example, $FeSi_2$. Of course, there can be variations, alternatives, and modifications.

In other embodiments, the nanostructured material can have a certain spatial morphology using one or more materials. As an example, the nanostructured material is comprised of nano-columns selected from Group IV semiconductor materials, Group IV-IV semiconductor materials, and metal oxides, and the like. In an alternative embodiment, the nanostructured material is comprised of nano-columns selected from Si, Ge, SiGe alloys. In other embodiments, the nanostructured material is comprised of nano-columns selected from ZnO, FeO, $Fe_2O_3$, CuO, $Cu_2O$. In yet other embodiments, the nanostructured material is comprised of nanotubes selected from Group IV semiconductor materials, Group IV-IV semiconductor materials, and metal oxides. In other embodiments, the nanostructured material is comprised of nano-tubes comprised of $TiO_2$. Yet alternatively, the nanostructured material may comprise nanostructured metal sulfides such as $FeS_2$, SnS, $SnS_2$, ZnS, $Cu_2S$, among others. The nanostructured material may also include a semiconductor material comprises of a Group IV semiconductor species, for example $FeSi_2$, and the like. Of course, there can be other variations, modifications, and alternatives.

Depending upon the embodiment, the nanostructured material can have certain spatial dimensions. As an example, the thickness of the nanostructured material ranges from about 1 nm to about 5000 nm. In an alternative embodiment, the thickness of the nanostructured material ranges from about 1 nm to about 1000 nm. Still further, the thickness of the nanostructured material ranges from about 1 nm to about 500 nm. Alternatively, the thickness of the nanostructured material ranges from about 1 nm to about 100 nm. In other embodiments, the thickness of the nanostructured material ranges from about 1 nm to about 50 nm. Of course, there can be other variations, modifications, and alternatives.

In a specific embodiment, the photovoltaic device also has a first electron affinity and a first ionization potential that characterize the nanostructured material. A second electron affinity and a second ionization potential characterize the electron transporting/hole blocking material, and a third electron affinity and a third ionization potential characterize the hole transporting/electron blocking material according to a specific embodiment. In a preferred embodiment, the third electron affinity and the third ionization potential are less than the first electron affinity and the first ionization potential, respectively, and the first electron affinity and the first ionization potential are less than the second electron affinity and the second ionization potential, respectively, and the second electron affinity is less than the third ionization potential. In a preferred embodiment, the nanostructured material has an optical absorption coefficient of at least $10^3$ $cm^{-1}$ for light comprised of wavelengths within the range of about 400 nm to about 700 nm. Of course, there can be other variations, modifications, and alternatives.

In a specific embodiment, the photovoltaic device has certain electron affinities and ionization potentials characterizing the nanostructure materials and each of the carrier transporting/carrier blocking materials. In a specific embodiment, the electron affinity and the ionization potential of the electron transporting/hole blocking material are greater than the electron affinity and the ionization potential of the nanostructured material, respectively, by at least 100 meV, and the electron affinity and the ionization potential of the nanostructured material are greater than the electron affinity and the ionization potential of the hole transporting/electron blocking material, respectively, by at least 100 meV. In other embodiments, the electron affinity and the ionization potential of the electron transporting/hole blocking material are greater than the electron affinity and the ionization potential of the nanostructured material, respectively, by at least 300 meV, and the electron affinity and the ionization potential of the nanostructured material are greater than the electron affinity and the ionization potential of the hole transporting/electron blocking material, respectively, by at least 300 meV. In other embodiments, the electron affinity and the ionization potential of the electron transporting/hole blocking material are greater than the electron affinity and the ionization potential of the nanostructured material, respectively, by at least 500 meV, and the electron affinity and the ionization potential of the nanostructured material are greater than the electron affinity and the ionization potential of the hole transporting/electron blocking material, respectively, by at least 500 meV. Of course, there can be other variations, modifications, and alternatives.

The nanostructured material is characterized by a bandgap according to a specific embodiment. The bandgap of the nanostructured material is within the range of about 1.0 eV to about 2.0 eV according to a specific embodiment. In an alternative specific embodiment, the bandgap of the nanostructured material is within the range of about 1.2 eV to about 1.8 eV. Alternatively, the bandgap of the nanostructured material is within the range of about 1.3 eV to about 1.6 eV. Of course, there can be other variations, modifications, and alternatives.

The nanostructured material, the hole transporting/electron blocking material, and the electron transporting/hole blocking material, each can also have a carrier mobility according to a specific embodiment. The carrier mobility of the nanostructured material, the electron mobility of the electron transporting/hole blocking material, and the hole mobility of the hole transporting/electron blocking material are within the range of about $10^{-6}$ cm$^2$/V-s to about 5000 cm$^2$/V-s according to a specific embodiment. In another embodiment, carrier mobility of the nanostructured material, the electron mobility of the electron transporting/hole blocking material, and the hole mobility of the hole transporting/electron blocking material are within the range of about $10^{-3}$ cm$^2$/V-s to about 1000 cm$^2$/V-s. In other embodiments, carrier mobility of the nanostructured material, the electron mobility of the electron transporting/hole blocking material, and the hole mobility of the hole transporting/electron blocking material are within the range of about 1 cm$^2$/V-s to about 100 cm$^2$/V-s. Of course, there can be other variations, modifications, and alternatives.

In a specific embodiment, the photovoltaic device has positive charge carriers and negative charge carriers generated by optical absorption by the nanostructured material that separate at the interface between the nanostructured material and the electron transporting/hole blocking material, and separate at the interface between the nanostructured material and the hole transporting/electron blocking material according to a specific embodiment. The negative charge carriers transport in the nanostructured material with the larger electron affinity, and the positive charge carriers transport in the nanostructured material with the smaller ionization potential. In a specific embodiment, the charge carriers undergo majority carrier transport within the electron transporting/hole blocking material and the hole transporting/electron blocking material. Of course, there can be other variations, modifications, and alternatives.

In a preferred embodiment, the method forms an overlying hole transporting/electron blocking material 2311, as illustrated by FIG. 25. In a specific embodiment, the hole transporting/electron blocking material has suitable properties that facilitate transport of holes, while also blocking transport of electrons. As shown, the hole transporting/electron blocking material is overlying the nanostructured material according to a specific embodiment. In a specific embodiment, the hole transporting/electron blocking material has a planar surface region, and fills an entirety of any voids within the nanostructured material. In a specific embodiment, the hole transporting/electron blocking material can be selected from metal oxides, Group IV semiconductor materials, Group IV-IV semiconductor materials, metal sulfides, copper compounds, organic semiconductors, combinations of these, which may be composites and/or layered, and the like. In a specific embodiment, the hole transporting/electron blocking material is selected from NiO, Cu$_2$O, Si, Ge, SiGe alloys, Cu$_2$S, CuI, CuSCN, CuPc, ZnPc, combinations of these, which may be composites and/or layered, and the like. Of course, there can be other variations, modifications, and alternatives.

In a specific embodiment, the electron transporting/hole blocking material is positioned between the nanostructured material and the electron collecting electrode, which will be described more fully below. Negatively charged carriers generated by optical absorption by the nanostructured material are preferentially separated into the electron transporting/hole blocking material and transport within the electron transporting/hole blocking material in a specific embodiment. In an alternative embodiment, the hole transporting/electron blocking material is positioned between the nanostructured material and the hole collecting electrode; which has been previously described. Positively charged carriers generated by optical absorption by the nanostructured material are preferentially separated into the hole transporting/electron blocking material and transport within the hole transporting/electron blocking material according to a specific embodiment. Of course, there can be other variations, modifications, and alternatives.

Referring to FIG. 25, the method forms an electrode layer 2313 overlying the surface region of the hole transporting/electron blocking material. In a specific embodiment, the electrode structure can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode structure can be carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

The above sequence of steps provides a method according to an embodiment of the present invention. As shown, the method uses a combination of steps including a way of forming a nanostructured material and hole transporting/blocking and electron transporting/blocking materials for photovoltaic applications according to an embodiment of the present invention. Other alternatives can also be provided where steps are added, one or more steps are removed, or one or more steps are provided in a different sequence without departing from the scope of the claims herein. Further details of the present method according to a specific embodiment can be found throughout the present specification and more particularly below.

Figure 26:
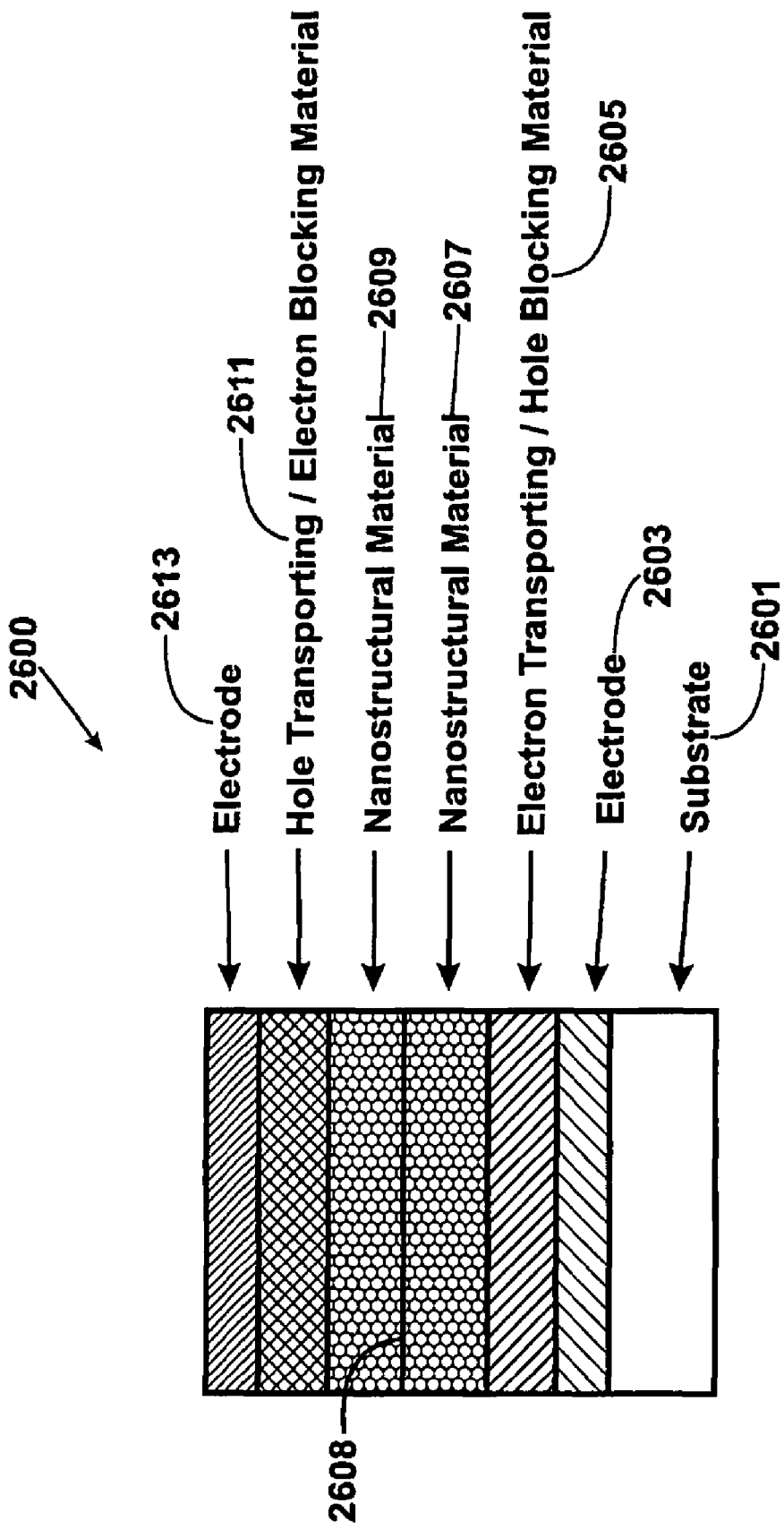
FIG. 26 is a simplified diagram illustrating yet an alternative nanostructured material for a photovoltaic device according to an embodiment of the present invention.

FIG. 26 is a simplified diagram illustrating yet an alternative nanostructured material 2600 for a photovoltaic device according to an embodiment of the present invention. This diagram is merely an example, which should not unduly limit the scope of the claims herein. One of ordinary skill would recognize other variations, modifications, and alternatives. As shown is a photovoltaic device made of a nanostructured material, e.g., nanoparticles, quantum dots, quantum wires, nano-columns, nanorods, nanotubes, quantum wells, nanoshells, nanobelts, nanoporous materials. In a specific embodiment, the device includes a substrate member 2601. The substrate member includes an overlying surface region. In a specific embodiment, the substrate member can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, or any combination of these, and the like. Alternatively, the substrate member can be a semiconductor material, such as silicon, silicon-germanium, germanium, Group III/V, or Group II/VI materials, and the like. Of course, there can be other variations, modifications, and alternatives.

In a specific embodiment, the photovoltaic device includes an electrode layer 2603 overlying the surface region of the substrate member. In a specific embodiment, the electrode structure can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For optically transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

In a preferred embodiment, the photovoltaic device has an overlying electron transporting/hole blocking material 2605. In a specific embodiment, the electron transporting/hole blocking material has suitable properties that facilitate transport of electrons, while also blocking transport of holes. As shown, the electron transporting/hole blocking material is overlying the electrode layer 2603, which is preferably transparent. Additionally, the substrate member is also optically transparent according to a specific embodiment. Alternatively, the electrode layer and the substrate member are not transparent and may also include reflective materials, which allow for electromagnetic radiation to reflect back toward an active region of the photovoltaic materials according to a specific embodiment. As merely an example, the electron transporting/hole blocking material can be inorganic semiconductors, metal oxides, organic semiconductors, or any other suitable material, including combinations of materials, layered materials, and the like. In a specific embodiment, the electron transporting/hole blocking material can be a metal oxide including, but not limited to, ZnO, $TiO_2$, $SnO_2$, $WO_3$, $Fe_2O_3$, other metal oxide, and the like. Of course, there can be other variations, modifications, and alternatives.

In a specific embodiment, the photovoltaic device includes a first nanostructured material 2607 overlying the electron transporting/hole blocking material 2605. In a preferred embodiment, the first nanostructured material 2607 is electrically coupled to a surface region of the electrode layer. As also shown, the first nanostructured material 2607 has a planar surface region. The device also includes a second nanostructured material 2609 overlying the first nanostructured material 2607 according to a specific embodiment. In a specific embodiment, the first and second nanostructured materials form an interface region. The second nanostructured material has a planar surface region according to a specific embodiment. Depending upon the embodiment, the first nanostructured material 2607 and the second nanostructured material 2609 are comprised of a plurality of nanostructures selected from nanoparticles, quantum dots, quantum wires, nano-columns, nanorods, nanotubes, quantum wells, nanoshells, nanobelts, nanoporous materials, any combination of these, and the like. Of course, there can be other variations, modifications, and alternatives.

In a specific embodiment, each of the nanostructured materials is made of a suitable composite, homogeneous material, or heterogeneous material, including layered materials, graded materials, and the like. In a specific embodiment, the first nanostructured material and the second nanostructured material are comprised of semiconductor materials, e.g., Group IV (e.g., silicon, silicon-germanium alloys, germanium) Group II/VI, Group III/V, combinations of these, and the like. Depending upon the embodiment, the semiconductor material can be an inorganic semiconductor or organic semiconductor material. In other embodiments, either one or both of these nanostructured materials can be made of a metal oxide species. As an example, the metal oxide for the first nanostructure material can be CuO, $Cu_2O$, FeO, $Fe_2O_3$, combinations of these, and the like. In an alternative embodiment, the first nanostructure material can be made of metal sulfides such as $FeS_2$, $Cu_2S$, SnS and the like. The first nanostructured material may be a semiconductor material comprises of a Group IV semiconductor species, for example, $FeSi_2$. Of course, there can be variations, alternatives, and modifications.

In a specific embodiment, the second nanostructured material is comprised of metal oxides, e.g., ZnO, $TiO_2$, $SnO_2$, $WO_3$, $Fe_2O_3$. In an alternative embodiment, the second nanostructure material can comprise of metal sulfides such as $SnS_2$, ZnS and the like. In other embodiments, the first nanostructured material can be selected from Si, Ge, ZnO, $TiO_2$, $SnO_2$, $WO_3$, CuO, $Cu_2O$, FeO, $Fe_2O_3$, $Fe_3O_4$, $Cu_2S$, FeS, including combinations, and the like. In other general embodiments, the first nanostructured material is selected from metal sulfides, e.g., $Cu_2S$, FeS, $FeS_2$, SnS, a combination, and the like. Alternatively, the first nanostructures material may include a semiconductor material comprising a Group IV semiconductor species, for example, $FeSi_2$, among others. Of course, there can be variations, alternatives, and modifications.

In other embodiments, the nanostructured materials can have a certain spatial morphology using one or more materials. As an example, the first nanostructured material is comprised of nano-columns selected from Group IV semiconductor materials, Group IV-IV semiconductor materials, and metal oxides, and the like. In an alternative embodiment, the first nanostructured material is comprised of nano-columns selected from Si, Ge, SiGe alloys. In other embodiments, the first nanostructured material is comprised of nano-columns selected from ZnO, FeO, $Fe_2O_3$, CuO, $Cu_2O$. In yet other embodiments, the first nanostructured material is comprised of nano-tubes selected from Group IV semiconductor materials, Group IV-IV semiconductor materials, and metal oxides. In other embodiments, the first nanostructured material is comprised of nano-tubes comprised of $TiO_2$. In other alternative embodiments, the first nanostructured material is selected from Group IV semiconductor materials, Group IV-IV semiconductor materials, and the second nanostructured material is comprised of nano-columns comprised of metal oxides. In certain embodiments, the first nanostructured material may comprise nanostructured metal sulfides such as $FeS_2$, SnS, $Cu_2S$ and the like. The first nanostructured material may also include semiconductor material comprises of a Group IV semiconductor species such as $FeSi_2$, and others.

The second nanostructured material may comprise of metal sulfides such as $SnS_2$, ZnS and the like. Of course, there can be other variations, modifications, and alternatives.

In other embodiments, the first nanostructured material is selected from Si, Ge, SiGe alloys, and the second nanostructured material is comprised of nano-columns comprised of ZnO. In other embodiments, the first nanostructured material is selected from Group IV semiconductor materials, Group IV-IV semiconductor materials, and the second nanostructured material is comprised of nano-tubes comprised of metal oxides. The first nanostructured material is selected from Si, Ge, SiGe alloys, and the second nanostructured material is comprised of nano-tubes comprised of $TiO_2$ according to a specific embodiment. In an alternative embodiment, the first nanostructured material is comprised of inorganic semiconductor, and the second nanostructured material is comprised of organic semiconductor. Of course, there can be other variations, modifications, and alternatives.

In a specific embodiment, the first nanostructured material and the second nanostructured material can have certain spatial dimensions. As an example, the layer thickness of the first nanostructured material and the second nanostructured material ranges from about 1 nm to about 5000 nm. In an alternative embodiment, the layer thickness of the first nanostructured material and the second nanostructured material ranges from about 1 nm to about 1000 nm. Still further, the layer thickness of the first nanostructured material and the second nanostructured material ranges from about 1 nm to about 500 nm. Alternatively, the layer thickness of the first nanostructured material and the second nanostructured material ranges from about 1 nm to about 100 nm. In other embodiments, the layer thickness of the first nanostructured material and the second nanostructured material ranges from about 1 nm to about 50 nm. Of course, there can be other variations, modifications, and alternatives.

In a specific embodiment, the photovoltaic device also has an interface region 2608, which may include one or more portions of the first and second nanostructured materials, provided between the first nanostructured material and the second nanostructured material. That is, the interface region substantially contacts physically and electrically the first and second nanostructure materials, as shown, according to a specific embodiment. In a preferred embodiment, the interface region can be an integrated structure including first and second nanostructured materials. Alternatively, the interface region can be two separate structures that are contacting each other according to an alternative embodiment. Of course, there can be other variations, modifications, and alternatives.

In a specific embodiment, the photovoltaic device also has first electron affinity and a first ionization potential that characterize the first nanostructured material. A second electron affinity and a second ionization potential characterize the second nanostructured material according to a specific embodiment. In a preferred embodiment, the first electron affinity is less than the second electron affinity and the first ionization potential is less than the second ionization potential according to a preferred embodiment. In a preferred embodiment, the second electron affinity is less than the first ionization potential. In a preferred embodiment, the photovoltaic device also has an optical absorption coefficient of at least $10^3$ $cm^{-1}$ for light comprised of wavelengths within the range of about 400 nm to about 700 nm characterizing at least one or both of the first nanostructured material and the second nanostructured material. Of course, there can be other variations, modifications, and alternatives.

In a specific embodiment, the photovoltaic device has certain electron affinity and ionization potentials characterizing each of the nanostructured materials. In a specific embodiment, the electron affinity and the ionization potential of first nanostructured material are less than the electron affinity and the ionization potential of second nanostructured material, respectively, by at least 100 meV. In other embodiments, the electron affinity and the ionization potential of the first nanostructured material are less than the electron affinity and the ionization potential of the second nanostructured material, respectively, by at least 300 meV. In other embodiments, the electron affinity and the ionization potential of the first nanostructured material are less than the electron affinity and the ionization potential of the second nanostructured material, respectively, by at least 500 meV. Of course, there can be other variations, modifications, and alternatives.

The nanostructured materials are characterized by a bandgap according to a specific embodiment. The bandgap of at least one or both of the nanostructured materials is within the range of about 1.0 eV to about 2.0 eV according to a specific embodiment. In an alternative specific embodiment, the bandgap of at least one or both of the nanostructured materials is within the range of about 1.2 eV to about 1.8 eV. Alternatively, the bandgap of at least one or both of nanostructured materials is within the range of about 1.3 eV to about 1.6 eV. Of course, there can be other variations, modifications, and alternatives.

The nanostructured materials also have a carrier mobility according to a specific embodiment. The carrier mobility of one the nanostructured material is within the range of about $10^{-6}$ $cm^2/V\text{-}s$ to about 5000 $cm^2/V\text{-}s$ according to a specific embodiment. In another embodiment, the carrier mobility of one of the nanostructured material is within the range of about $10^{-3}$ $cm^2/V\text{-}s$ to about 1000 $cm^2/V\text{-}s$. In other embodiments, the carrier mobility of one the nanostructured material is within the range of about 1 $cm^2/V\text{-}s$ to about 100 $cm^2/V\text{-}s$. Of course, there can be other variations, modifications, and alternatives.

As shown, the photovoltaic device has positive charge carriers and negative charge carriers generated by optical absorption by the nanostructured material separate at the interface between the first nanostructured material and the second nanostructured material according to a specific embodiment. The negative charge carriers transport in the nanostructured material with the larger electron affinity, and the positive charge carriers transport in the nanostructured material with the smaller ionization potential. In a specific embodiment, the charge carriers undergo majority carrier transport within the first nanostructured material and the second nanostructured material. Of course, there can be other variations, modifications, and alternatives.

In a preferred embodiment, the photovoltaic device has an overlying hole transporting/electron blocking material 2611. In a specific embodiment, the hole transporting/electron blocking material has suitable properties that facilitate transport of holes, while also blocking transport of electrons. As shown, the hole transporting/electron blocking material is overlying the intermixed region and in particular the second nanostructured material according to a specific embodiment. In a specific embodiment, the hole transporting/electron blocking material can be selected from metal oxides, Group IV semiconductor materials, Group IV-IV semiconductor materials, metal sulfides, copper compounds, organic semiconductors, combinations of these, which may be composites and/or layered, and the like. In a specific embodiment, the hole transporting/electron blocking material is selected from NiO, $Cu_2O$, Si, Ge, SiGe alloys, $Cu_2S$, CuI, CuSCN, CuPc, ZnPc, combinations of these, which may be composites and/ or layered, and the like. Of course, there can be other variations, modifications, and alternatives.

In a specific embodiment, an electron transporting/hole blocking material is positioned between the nanostructured material and the electron collecting electrode, which will be described more fully below. Negatively charged carriers generated by optical absorption by the nanostructured material are preferentially separated into the electron transporting/hole blocking material and transport within the electron transporting/hole blocking material in a specific embodiment. In an alternative embodiment, the hole transporting/electron blocking material is positioned between the nanostructured material and the hole collecting electrode; which has been previously described. Positively charged carriers generated by optical absorption by the nanostructured material are preferentially separated into the hole transporting/electron blocking material and transport within the hole transporting/electron blocking material according to a specific embodiment. Of course, there can be other variations, modifications, and alternatives.

In a specific embodiment, the photovoltaic device includes an electrode structure 2613 overlying the surface region of the hole transporting/electron blocking material. In a specific embodiment, the electrode structure can be made of a suitable material or combination of materials. The suitable material can be a metal, an organic material, or a combination of these, and the like. Depending upon the embodiment, the electrode structure can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode structure can be carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For transparent electrode structures, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives. Further details of way of making the present device can be found throughout the present specification and more particularly below.

A method according to an alternative embodiment of the present invention for forming a nanocomposite material for a photovoltaic device is briefly describe below.

1. Provide a substrate (e.g., glass) including a surface region;
2. Clean (e.g., RCA, sonic, ultrasonic) the surface region;
3. Form an electrode layer overlying the surface region;
4. Form an electron transporting/hole blocking material overlying the electrode layer;
5. Form a first nanostructured material (e.g., nanoparticles, quantum dots, quantum wires, nano-columns, nanorods, nanotubes, quantum wells, nanoshells, nanobelts, nanoporous materials) overlying the electron transporting/hole blocking material;
6. Form a second nanostructured material (e.g., nanoparticles, quantum dots, quantum wires, nano-columns, nanorods, nanotubes, quantum wells, nanoshells, nanobelts, nanoporous materials) overlying the first nanostructured material
7. Cause formation of an interface region provided between the first nanostructured material and the second nanostructured material to provide the first nanostructured material to be at a first electron affinity and a first ionization potential and to provide the second nanostructured material to be at a second electron affinity and a second ionization potential;
8. Form a hole transporting/electron blocking material overlying the second nanostructured material;
9. Form an electrode structure overlying the hole transporting/electron blocking material;
10. Perform other steps, as desired; and
11. Provide a photovoltaic device such that the first electron affinity is less than the second electron affinity and the first ionization potential is less than the second ionization potential and such that an optical absorption coefficient of at least $10^3$ cm$^{-1}$ for light comprised of wavelengths within the range of about 400 nm to about 700 nm characterizes at least one or both of the first nanostructured material and the second nanostructured material.

The above sequence of steps provides a method according to an embodiment of the present invention. As shown, the method uses a combination of steps including a way of forming a nanocomposite material and hole transporting/blocking and electron transporting/blocking materials for photovoltaic applications according to an embodiment of the present invention. Other alternatives can also be provided where steps are added, one or more steps are removed, or one or more steps are provided in a different sequence without departing from the scope of the claims herein. Further details of the present method according to a specific embodiment can be found throughout the present specification and more particularly below.

Figure 27:
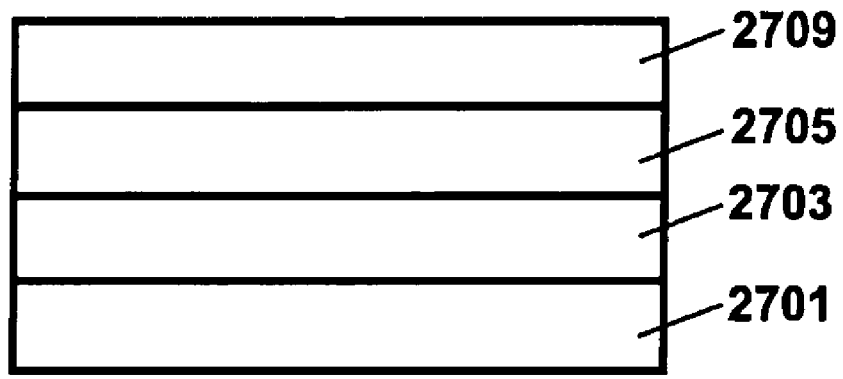
FIGS. 27 through 28 are simplified diagrams of an illustration of yet an alternative method of fabricating a nanostructured material for a photovoltaic device according to an alternative embodiment of the present invention.
Figure 28:
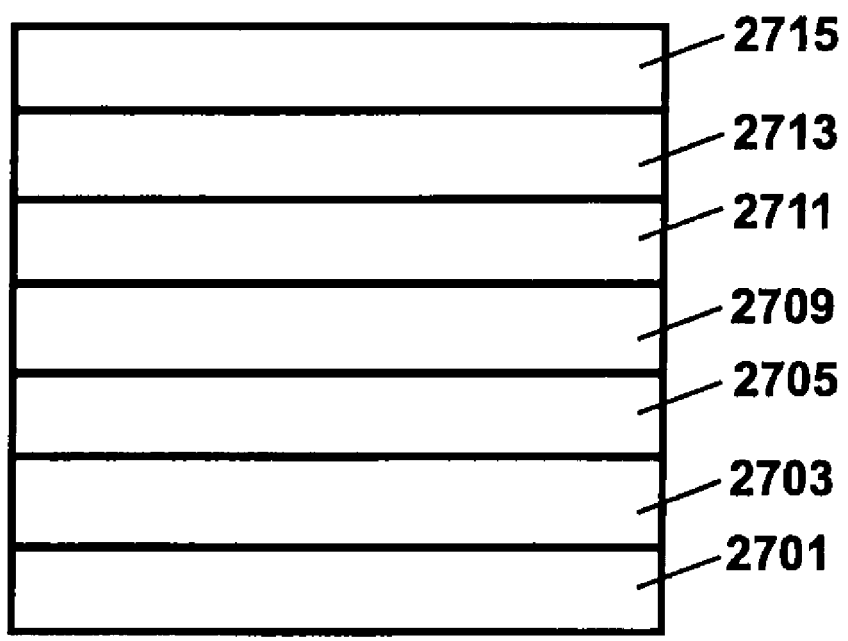

FIGS. 27 through 28 are simplified diagrams of an illustration of yet an alternative method of fabricating a nanostructured material for a photovoltaic device according to an alternative embodiment of the present invention. These diagrams are merely examples, which should not unduly limit the scope of the claims herein. One of ordinary skill would recognize other variations, modifications, and alternatives. As shown is a photovoltaic device made of a nanostructured material, e.g., nanoparticles, quantum dots, quantum wires, nano-columns, nanorods, nanotubes, quantum wells, nanoshells, nanobelts, nanoporous materials. In a specific embodiment, the photovoltaic device includes a substrate member 2701. The substrate member includes an overlying surface region. In a specific embodiment, the substrate member can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, or any combination of these, and the like. Alternatively, the substrate member can be a semiconductor material, such as silicon, silicon-germanium alloys, germanium, Group III/V, or Group II/VI materials, and the like. Of course, there can be other variations, modifications, and alternatives.

In a specific embodiment, the photovoltaic device includes an electrode layer 2703 overlying the surface region of the substrate member. In a specific embodiment, the electrode layer can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode layer can be carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For transparent electrode layers, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives.

In a preferred embodiment, the device has an overlying electron transporting/hole blocking material 2705. In a specific embodiment, the electron transporting/hole blocking material has suitable properties that facilitate transport of electrons, while also blocking transport of holes. As shown, the electron transporting/hole blocking material is overlying the electrode 2703, which is preferably transparent. Additionally, the substrate member is also optically transparent according to a specific embodiment. Alternatively, the electrode layer and the substrate member are not transparent and may also include reflective materials, which allow for electromagnetic radiation to reflect back toward an active region of the photovoltaic materials according to a specific embodiment. As merely an example, the electron transporting/hole blocking material can be an inorganic semiconductor, a metal oxide, organic semiconductors, or any other suitable material, including combinations of materials, layered materials, and the like. In a specific embodiment, the electron transporting/hole blocking material can be a metal oxide including, but not limited to, $ZnO$, $TiO_2$, $SnO_2$, $WO_3$, $Fe_2O_3$, other metal oxide, and the like. In a specific embodiment, the layer is also planar, as shown. Of course, there can be other variations, modifications, and alternatives.

In a specific embodiment, the photovoltaic device includes a first nanostructured material 2709 overlying the electron transporting/hole blocking material 2705. In a preferred embodiment, the first nanostructured material is electrically coupled to a surface region of the electrode layer. The photovoltaic device also includes a second nanostructured material 2711 overlying the first nanostructured material according to a specific embodiment. In a specific embodiment, the first and second nanostructured materials form an intermixed region, which has been described throughout the present specification and more particularly below. The second nanostructured material has a planar surface region according to a specific embodiment. Depending upon the embodiment, the first nanostructured material and the second nanostructured material are comprised of a plurality of nanostructures selected from nanoparticles, quantum dots, quantum wires, nano-columns, nanorods, nanotubes, quantum wells, nanoshells, nanobelts, nanoporous materials, any combination of these, and the like. Of course, there can be other variations, modifications, and alternatives.

In a specific embodiment, each of the nanostructured materials is made of a suitable composite, homogeneous material, or heterogeneous material, including layered materials, graded materials, and the like. In a specific embodiment, the first nanostructured material and the second nanostructured material are comprised of semiconductor materials, e.g., Group IV (e.g., silicon, silicon-germanium alloys, germanium) Group II/VI, Group III/V, combinations of these, and the like. Depending upon the embodiment, the semiconductor material can be an inorganic semiconductor or organic semiconductor material. In other embodiments, either one or both of these nanostructured materials can be made of a metal oxide species. As an example, the metal oxide for the first nanostructure material can be $CuO$, $Cu_2O$, $FeO$, $Fe_2O_3$, combinations of these, and the like. In a alternatively embodiment, the first nanostructured material can be metal sulfides species. For example, the metal sulfide can be $FeS_2$, $SnS$, $Cu_2S$, $FeS$, combinations of these and the like. The first nanostructured material may be a semiconductor material comprising Group IV semiconductor species in a specific embodiment. For example, the semiconductor material can be $FeSi_2$, and the like. Of course, there can be variations, alternatives, and modifications.

In a specific embodiment, the second nanostructured material is comprised of metal oxides, e.g., $ZnO$, $TiO_2$, $SnO_2$, $WO_3$, $Fe_2O_3$. In other embodiments, the first nanostructured material can be selected from $Si$, $Ge$, $ZnO$, $TiO_2$, $SnO_2$, $WO_3$, $CuO$, $Cu_2O$, $FeO$, $Fe_2O_3$, $Fe_3O_4$, $Cu_2S$, $FeS$, $FeS_2$, $SnS$, including combinations, and the like. In other general embodiments, the first nanostructured material may be selected from metal sulfides, e.g., $Cu_2S$, $FeS$, $FeS_2$, $SnS$, combinations of these, and the like. Of course, there can be variations, alternatives, and modifications.

In other embodiments, the nanostructured materials can have a certain spatial morphology using one or more materials. As an example, the first nanostructured material is comprised of nano-columns selected from Group IV semiconductor materials, Group IV-IV semiconductor materials, and metal oxides, and the like. In an alternative embodiment, the first nanostructured material is comprised of nano-columns selected from Si, Ge, SiGe alloys. In other embodiments, the first nanostructured material is comprised of nano-columns selected from $ZnO$, $FeO$, $Fe_2O_3$, $CuO$, $Cu_2O$. In yet other embodiments, the first nanostructured material is comprised of nano-tubes selected from Group IV semiconductor materials, Group IV-IV semiconductor materials, and metal oxides. In other embodiments, the first nanostructured material is comprised of nano-tubes comprised of $TiO_2$. In other alternative embodiments, the first nanostructured material is selected from Group IV semiconductor materials, Group IV-IV semiconductor materials, and the second nanostructured material is comprised of nano-columns comprised of metal oxides. In certain embodiments, the first nanostructured material may include nanostructured metal sulfides such as $FeS_2$, $Cu_2S$, $SnS$, and the likes. Alternatively, the first nanostructured material can include a semiconductor material comprises of Group IV semiconductor species such as $FeSi_2$, and the like. Of course, there can be other variations, modifications, and alternatives.

In other embodiments, the first nanostructured material is selected from Si, Ge, SiGe alloys, and the second nanostructured material is comprised of nano-columns comprised of $ZnO$. In other embodiments, the first nanostructured material is selected from Group IV semiconductor materials, Group IV-IV semiconductor materials, and the second nanostructured material is comprised of nano-tubes comprised of metal oxides. The first nanostructured material is selected from Si, Ge, SiGe alloys, and the second nanostructured material is comprised of nano-tubes comprised of $TiO_2$ according to a specific embodiment. In a specific embodiment, the first nanostructured material is selected from Si, Ge, SiGe alloys, and the second nanostructured material can include nanostructured metal sulfides such as $SnS_2$, ZnS, and the likes. In an alternative embodiment, the first nanostructured material is comprised of inorganic semiconductor, and the second nanostructured material is comprised of organic semiconductor. Of course, there can be other variations, modifications, and alternatives.

In a specific embodiment, the photovoltaic device has an interface region including the first and second nanostructured materials. That is, the interface region substantially contacts physically and electrically the first and second nanostructure materials, as shown, according to a specific embodiment. In a preferred embodiment, the interface region can be an integrated structure including first and second nanostructured materials. Alternatively, the interface region can be two separate structures that are contacting each other according to an alternative embodiment. Of course, there can be other variations, modifications, and alternatives.

In a specific embodiment, the photovoltaic device also has first electron affinity and a first ionization potential that characterize the first nanostructured material. A second electron affinity and a second ionization potential characterize the second nanostructured material according to a specific embodiment. In a preferred embodiment, the first electron affinity is less than the second electron affinity and the first ionization potential is less than the second ionization potential according to a preferred embodiment. In a preferred embodiment, the second electron affinity is less than the first ionization potential. In a preferred embodiment, the material also has an optical absorption coefficient of at least $10^3$ cm$^{-1}$ for light comprised of wavelengths within the range of about 400 nm to about 700 nm characterizing at least one or both of the first nanostructured material and the second nanostructured material. Of course, there can be other variations, modifications, and alternatives.

In a specific embodiment, the photovoltaic device has certain electron affinity and ionization potential characterizing each of the nanostructured materials. In a specific embodiment, the electron affinity and the ionization potential of first nanostructured material are less than the electron affinity and the ionization potential of second nanostructured material, respectively, by at least 100 meV. In other embodiments, the electron affinity and the ionization potential of the first nanostructured material are less than the electron affinity and the ionization potential of the second nanostructured material, respectively, by at least 300 meV. In other embodiments, the electron affinity and the ionization potential of the first nanostructured material are less than the electron affinity and the ionization potential of the second nanostructured material, respectively, by at least 500 meV. Of course, there can be other variations, modifications, and alternatives.

The nanostructured materials are characterized by a bandgap according to a specific embodiment. The bandgap of at least one or both of the nanostructured materials is within the range of about 1.0 eV to about 2.0 eV according to a specific embodiment. In an alternative specific embodiment, the bandgap of at least one or both of the nanostructured materials is within the range of about 1.2 eV to about 1.8 eV. Alternatively, the bandgap of at least one or both of nanostructured materials is within the range of about 1.3 eV to about 1.6 eV. Of course, there can be other variations, modifications, and alternatives.

The nanostructured materials, the electron transporting/hole blocking material, and hole transporting/electron blocking material can each have a carrier mobility according to a specific embodiment. The carrier mobility of one the nanostructured material is within the range of about $10^{-6}$ cm$^2$/V-s to about 5000 cm$^2$/V-s according to a specific embodiment. In another embodiment, the carrier mobility of one of the nanostructured material is within the range of about $10^{-3}$ cm$^2$/V-s to about 1000 cm$^2$/V-s. In other embodiments, the carrier mobility of one the nanostructured material is within the range of about 1 cm$^2$/V-s to about 100 cm$^2$/V-s. Of course, there can be other variations, modifications, and alternatives.

As shown, the photovoltaic device has positive charge carriers and negative charge carriers generated by optical absorption by the nanostructured material separate at the interface between the first nanostructured material and the second nanostructured material according to a specific embodiment. The negative charge carriers transport in the nanostructured material with the larger electron affinity, and the positive charge carriers transport in the nanostructured material with the smaller ionization potential. In a specific embodiment, the charge carriers undergo majority carrier transport within the first nanostructured material and the second nanostructured material. Of course, there can be other variations, modifications, and alternatives.

In a preferred embodiment, the photovoltaic device has an overlying hole transporting/electron blocking material 2711. In a specific embodiment, the hole transporting/electron blocking material has suitable properties that facilitate transport of holes, while also blocks transport of electrons. As shown, the hole transporting/electron blocking material is overlying the intermixed region and in particular the second nanostructured material according to a specific embodiment. In a specific embodiment, the hole transporting/electron blocking material can be selected from metal oxides, Group IV semiconductor materials, Group IV-IV semiconductor materials, metal sulfides, copper compounds, organic semiconductors, combinations of these, which may be composites and/or layered, and the like. In a specific embodiment, the hole transporting/electron blocking material is selected from NiO, $Cu_2O$, Si, Ge, SiGe alloys, $Cu_2S$, CuI, CuSCN, CuPc, ZnPc, combinations of these, which may be composites and/or layered, and the like. Of course, there can be other variations, modifications, and alternatives.

In a specific embodiment, the electron transporting/hole blocking material is positioned between the nanostructured material and the electron collecting electrode, which will be described more fully below. Negatively charged carriers generated by optical absorption by the nanostructured material are preferentially separated into the electron transporting/hole blocking material and transport within the electron transporting/hole blocking material in a specific embodiment. In an alternative embodiment, the hole transporting/electron blocking material is positioned between the nanostructured material and the hole collecting electrode; which has been previously described. Positively charged carriers generated by optical absorption by the nanostructured material are preferentially separated into the hole transporting/electron blocking material and transport within the hole transporting/electron blocking material according to a specific embodiment. Of course, there can be other variations, modifications, and alternatives.

In a specific embodiment, the photovoltaic device includes an electrode structure 2715 overlying the surface region of the hole transporting/electron blocking material. In a specific embodiment, the electrode structure can be made of a suitable material or combination of materials. The suitable material can be a metal, an organic material, or a combination of these, and the like. Depending upon the embodiment, the electrode layer can be optically transparent or a light blocking material or a light reflecting material. Of course, there can be other variations, modifications, and alternatives.

In a specific embodiment, the metal can be molybdenum, tungsten, gold, silver, copper, aluminum, platinum, palladium, cobalt, other suitable metals, including combinations (e.g., alloys), and multilayered structures, and the like. Alternatively, the electrode structure can be carbon based such as graphite or polymer species. In a specific embodiment, the metal can be encased between barrier metal layers or other suitable layers that may have lower or higher resistivity and can also prevent any diffusion of any metal species that can lead to reliability and/or operational failures. For transparent electrode structure, the electrode material can be metal oxides such as indium tin oxide, commonly called ITO, aluminum doped zinc oxide, fluorine doped tin oxide, any combinations of these, and others, depending upon the specific embodiment. In a specific embodiment, the electrode structure is conductive and has a resistivity of less than a desired amount, which is often less than about 0.01 Ohm-centimeter or no greater than about 100 Ohm-centimeter according to a specific embodiment. Of course, there can be other variations, modifications, and alternatives. Further details of way of making the present device can be found throughout the present specification and more particularly below.

Figure 29:
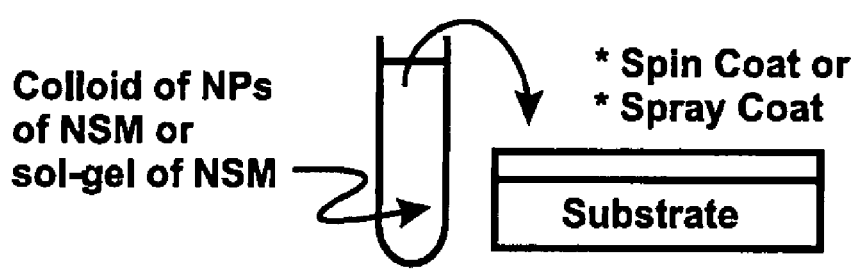
FIGS. 29 through 33 are simplified diagrams illustrating methods for forming nanostructured materials according to embodiments of the present invention.
Figure 29:
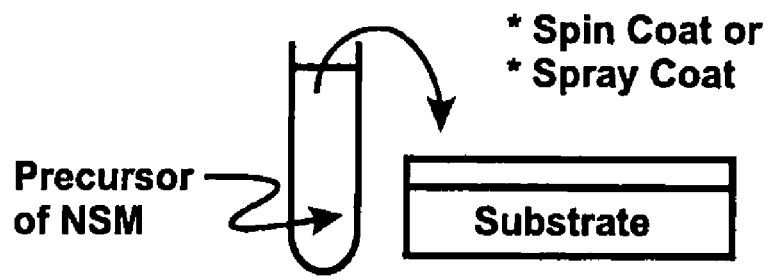
Figure 29:
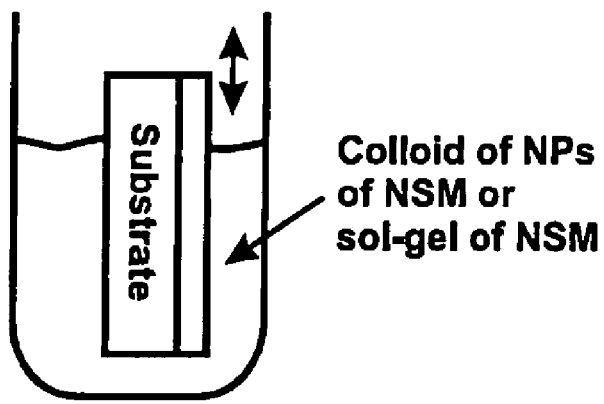
Figure 30:
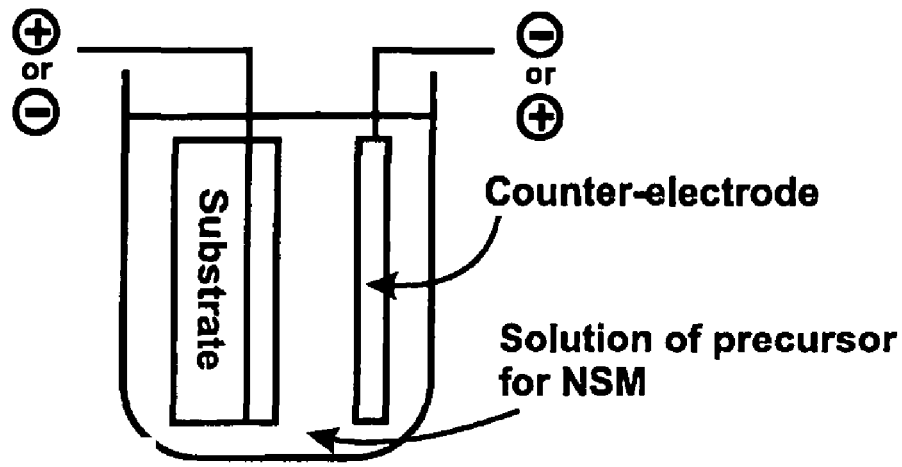
Figure 30:
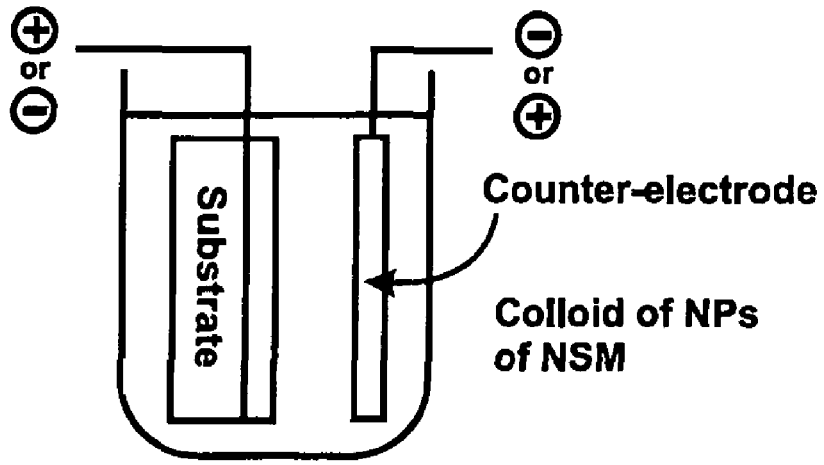
Figure 31:
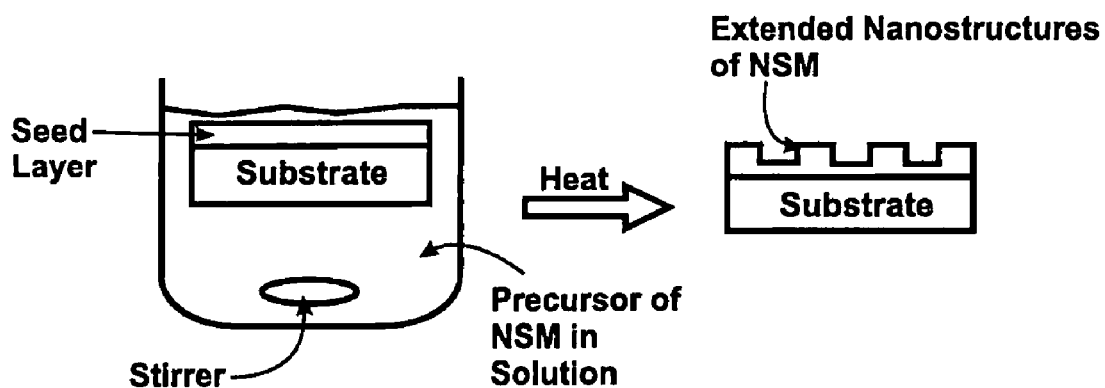
Figure 32:
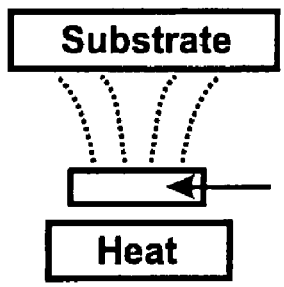
Figure 32:
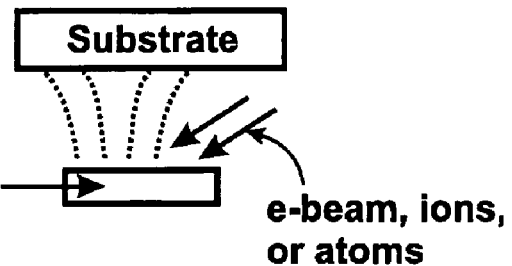
Figure 33:
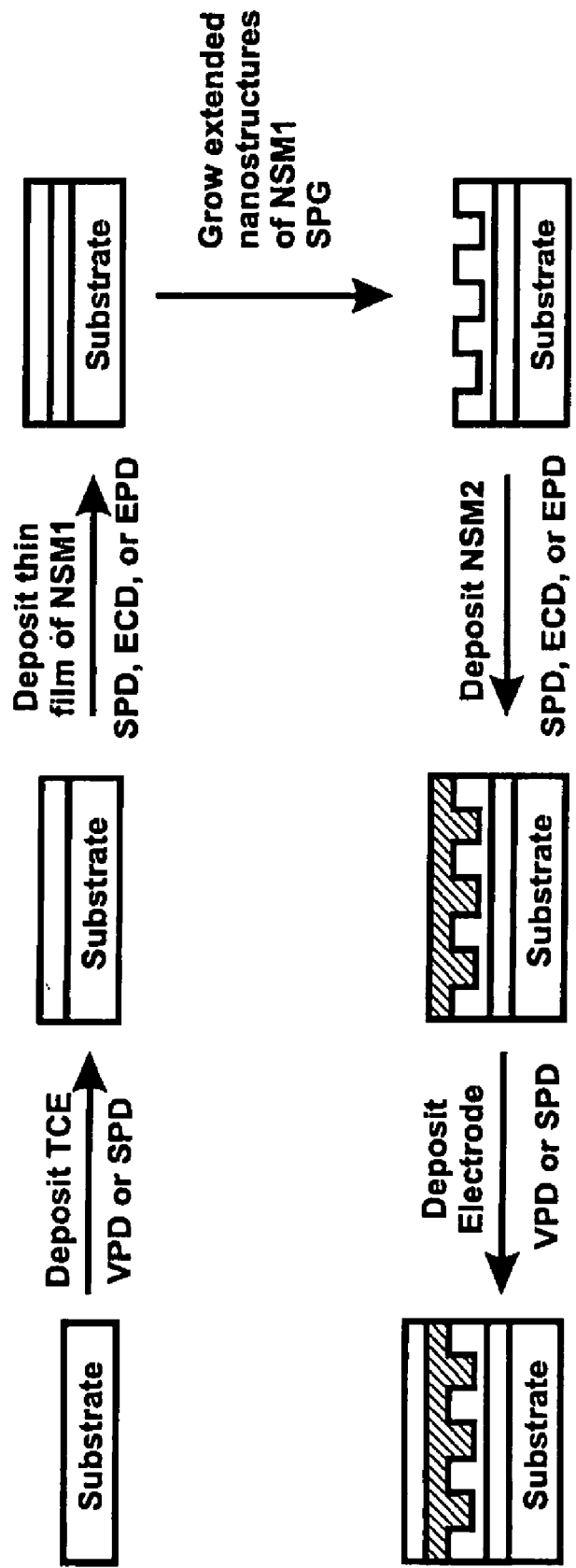

FIGS. 29 through 33 are simplified diagrams illustrating methods for forming nanostructured materials according to embodiments of the present invention. These diagrams are merely examples, which should not unduly limit the scope of the claims herein. One of ordinary skill would recognize other variations, modifications, and alternatives. As shown, a method for solution phase deposition (SPD) is illustrated in FIG. 29. Alternative methods include electrochemical deposition (ECD), solution phase growth (SPG), and vapor phase deposition (VPD) as illustrated by the remaining figures. Referring to FIG. 33, a method using one or more of the methods is illustrated. Of course, there can be other variations, modifications, and alternatives.

In a specific embodiment, the present method and structure can address issues that prevent conventional thin film photovoltaic technologies from achieving high efficiencies at lower costs. In particular, the present method and structure can address the following issues according to one or more specific embodiments:

High absorption coefficient in the range of wavelengths relevant to the solar spectrum;
Effective carrier separation;
Effective carrier transport;
Low cost processing;
Low toxicity materials;
Stable and robust materials; and
Abundant materials.

An important feature in any solar photovoltaic technology is the strong absorption of solar light according to a specific embodiment. Preferably, an active material absorbs as much sunlight as possible. This has many important ramifications. A strong absorber enables very thin films to be used that can still absorb significant sunlight. This in turn minimizes and/or reduces the distance that carriers must often transport to reach the charge separating junction and the collecting electrodes. Since the diffusion length of most carriers is generally short, a thin film mitigates detrimental processes from affecting the carriers through processes such as carrier recombination and trapping. In addition, the costs can be greatly reduced due to the significantly less material and lower quality of material required.

Therefore, an embodiment of this invention includes a method and structure for use of materials that have a high absorption coefficient over as much of the solar spectrum as possible. Generally, the relevant optical transition is direct in nature rather than indirect. Quantum confinement in nanostructured materials offers a method to further increase the absorption coefficient. In general, the oscillator strength of an optical transition increases as the feature size of a nanostructured a material decreases, therefore, the use of nanostructured materials benefits achieving higher absorption coefficients. Many conventional materials may satisfy this criterion, e.g., organic dyes, conjugated oligomers and polymers, small organic molecules, inorganic semiconductors such as GaAs, CdTe, PbSe, PbS, InP, and so forth. Most of these conventional materials generally do not satisfy the other criteria listed above for photovoltaic application that is commercializable and accepted. However, one or more embodiments according to the present invention satisfy the requirement for high absorption coefficient as well as low cost processing, low toxicity, abundance, and stability. This includes materials such as Group IV materials, Group IV-IV materials, metal oxides and metal sulfides in bulk and nanostructured form, examples of which are Si, Ge, Si/Ge Alloys, $CuO$, $Cu_2O$, $FeO$, $Fe_2O$, $Cu_2S$, $FeS$, $FeS_2$, $SnS$, $SnS_2$, $ZnS$, including any combinations, and the like. Alternatively, semiconductor material comprising a Group IV semiconductor species, for example, $FeSi_2$ in bulk form or provided as nanostructured material may also be used. Of course, there can be other variations, modifications, and alternatives.

A feature for high absorption coefficient does not limit the selection of materials to only those with direct optical transitions according to a specific embodiment. Quantum confinement can modify the character of the optical transition such that as the feature size of the nanostructured material decreases, the nature of the optical transition can change from having a substantially indirect character to one that has varying degrees of direct and indirect character to one that can be substantially direct in character. For example, nanostructured silicon and germanium, both of which have indirect optical transitions, can evolve from a material with an indirect optical transition to a material with a substantially direct optical transition as its feature size decreases into the nanometer range. Thus, materials that are indirect in their bulk form can be used in photovoltaic application in their nanostructured form. In a preferred embodiment, the present structure and method can include nanostructured silicon, germanium, and/or silicon germanium alloys, and the like.

Another consideration for the application specifically to solar photovoltaic devices is the optimum and/or improved bandgap of the absorber material. Schottkley and Queisser had earlier calculated the optimum bandgap for single junction solar photovoltaic devices to be ~1.4 eV, resulting in a theoretical power efficiency for diffuse sunlight of ~31%. They demonstrated how the conversion efficiency depends on the absorber bandgap. Very high efficiencies can be achieved theoretically over a broad range of material bandgaps, i.e., from ~1.1 to ~1.6 eV.

In a specific embodiment, the present method and structure include absorber materials with bandgaps that fall into this range for high conversion efficiency, and also satisfy one or more of the other criteria listed above such as high absorption coefficients, low cost processing, relative non-toxicity, abundance, and stability. These embodiments include $CuO$, $FeO$, $Cu_2S$ in bulk form.

Quantum confinement in nanostructured materials offers a convenient and effective method to engineer the bandgap of nanostructured materials to the optimum value for solar photovoltaic. Decreasing the feature size of a nanostructured material (e.g., decreasing the diameter of a quantum dots) increases the energy gap, $E_g$, approximately according to $$E_g(d) = E_g(\infty) + C/d^n \quad (1)$$

where d is the feature size (e.g., diameter of a quantum dot);
C is a material-dependent constant; and
n generally varies between 1 and 2.

A consequence of Equation (1) is that quantum confinement always increases the bandgap from the bulk value. Therefore, only materials with bandgap energies lower than that corresponding to a peak value (i.e., ~1.4 eV) can be tailored to the optimum value in nanostructured form. In a specific embodiment, the present method and structure include Si, Ge, Si/Ge Alloys, CuO, and FeO in nanostructured form since they satisfy the bandgap criteria as well as one or more of the other criteria listed earlier, i.e., high absorption coefficients, low cost processing, relative non-toxicity, abundance, and stability. Though there are conventional materials that may satisfy the bandgap criterion, few conventional materials satisfy all these criteria, which must often be met for high efficiency and commercializable solar photovoltaic. Of course, there can be other variations, modifications, and alternatives.

A method by which charge separation in most conventional photovoltaic devices is achieved represents another limitation to the power conversion efficiency. The charge separation occurs at a limited number of physical sites in the device. For typical p-n junction devices, charge separation occurs only when the carriers are within a carrier diffusion length of the planar interface or junction between a p-type material and an n-type material. Since the diffusion length is typically in the nanometer range or few tens of nanometers to a hundred nanometer, most of the photo-generated carriers are created outside of this region, particularly for materials with small absorption coefficients and thus require films or wafers that are thicker than the carrier diffusion length. This is particularly the case with conventional photovoltaic devices manufactured from crystalline Si in a p-n junction configuration. The conventional crystalline Si wafer is typically 200 microns to 300 microns thick, orders of magnitude longer than the carrier diffusion length. As a result, most of the photo-generated carriers are lost to recombination, trapping, etc., which cause limitations with the conventional devices.

For the carriers that do separate, they must often transport over very long distances (longer than their diffusion length) to reach the carrier collection electrodes. As a result, even if the carriers successfully undergo charge separation, many of them do not reach the electrodes due to detrimental processes such as carrier recombination and trapping. This is exacerbated by the design of current devices that use minority carrier transport.

In a specific embodiment, the present method and structure can overcome some if not all of these limitations through a number of methods and structures, which have been described herein and throughout the present specification. An embodiment of the present invention may be enabled by the large absorption coefficient of the materials used by the present method and structures. The large absorption coefficient allows much thinner films to be used, ranging from about 100 nm to about 500 nm, while still absorbing a substantial portion of the sunlight. This film thickness is significantly thinner (orders of magnitude thinner) than conventional crystalline silicon photovoltaic devices and is also much thinner than conventional thin film photovoltaic devices. In a specific embodiment, the present method and structure can include a thickness of the active material comparable to or only a few times longer than the carrier diffusion length in these present nanostructured materials. As a result, most of the photo-generated carriers successfully transport through the thin film according to a specific embodiment. This benefits carrier transport to the carrier separation regions or junctions and transport of the separated carriers to the collection electrodes.

In an alternative embodiment of the invention, the present method and structure can increases the likelihood of charge separation by using a configuration that further minimizes and/or reduces the distance that carriers transport to reach a carrier separation region. This is achieved by creating "nano-junctions" located throughout the film such that all carriers are within approximately a diffusion length of a charge separating nano-junction. In this way, nearly all optically generated carriers are able to transport the short distance to a nano-junction and undergo charge separation. Of course, there are other variations, modifications, and alternatives.

Certain mechanisms for charge separation have been described. In a conventional p-n junction, the electric field that is generated in the depleted p-n junction region separates carriers that are within a diffusion length of this region. A variation of a p-n junction is a pin junction. In this case, the insertion of an intrinsic region between the p-type and n-type material creates a larger depletion region for charge separation to occur. Both of these types of junctions are typically used in conventional devices comprised of conventional bulk semiconductor materials, which are limiting.

With nanostructured materials, quantum confinement generally causes the energy levels to be less band-like and more molecular-like, accompanied by the localization of the electronic wavefunction. In this case, rather than a description based on the conduction band minimum (CBM) or the valence band maximum (VBM) as in bulk semiconductors, the relevant energy levels may be more appropriately described as the Lowest Unoccupied Molecular Orbital (LUMO) and the Highest Occupied Molecular Orbital (HOMO) as in molecular species. Charge separation occurs between two nanostructured materials that have different electron affinities (as represented by the different energetic positions of the LUMO level) or different ionization potentials (as represented by the different energetic positions of the HOMO levels), and is driven by the drive towards the lowest free energy according to a specific embodiment. In a preferred embodiment, a first nanostructured material has a lower electron affinity and lower ionization potential than a second nanostructured material sharing an interface with the first nanostructured material, as explained before. In other words, the HOMO-LUMO levels of one nanostructured material are "staggered" with respect to the HOMO-LUMO levels of the second material in a manner similar to Type II semiconductor heterojunctions. In this case, carriers generated in the materials separate or arrange the charge distribution such that electrons or negative carriers reside in the nanostructured material with the highest electron affinity or with the lower energy LUMO level, and the hole or positive carrier reside in the nanostructured material with the lowest ionization potential or with the higher energy HOMO level according to a specific embodiment.

Another consideration is the energy offset between the HOMO levels and the energy offset between the LUMO levels of the two materials according to a specific embodiment. For rapid and effective charge separation to occur, the energy offsets must often be sufficiently large. If the kinetics or rate of charge separation is not sufficiently rapid, carrier recombination or trapping may dominate, leading to loss processes that decrease the power conversion efficiency. On the other hand, if the energy offsets are too large, the power conversion efficiency also suffers. Therefore, the energy offsets must often be optimized and/or improved.

Quantum confinement in nanostructured materials offers a convenient and effective method to develop the energy of the HOMO and LUMO levels and thus optimize and/or improve the energy offsets. Decreasing the feature size of a nanostructured material (e.g., decreasing the diameter of a quantum dots) increases the energy gap, $E_g$, approximately according to Equation (1). The increase in $E_g$ with smaller feature size arises from an increase in the energy of the LUMO level and a decrease of the energy of the HOMO level. Thus, by size engineering, the energy of the HOMO and LUMO levels of a nanostructured material can be tailored to optimize the energy offsets.

According to one or more embodiments, the present method and structure include the suitable and/or desired selection of groups or pairs of materials in which through their bulk properties or through size engineering of their nanostructured properties, the energy offsets between pairs of materials can be optimized and/or improved for efficient charge separation. The present method and structure include combining or pairing materials from a first group with materials from a second group according to a specific embodiment. In a specific embodiment, the first group include materials selected from CuO, FeO, and $Cu_2S$ in bulk form, and Si, Ge, Si/Ge Alloys, CuO, FeO, and $Cu_2S$ in nanostructured form. In a specific embodiment, the second group include materials such as ZnO, $TiO_2$, $SnO_2$, $WO_3$, $Fe_2O_3$, NiO, $Cu_2O$, CuI, CuPc, ZnPc, and CuSCN in bulk or nanostructured form. Of course, there can be other variations, modifications, and alternatives.

There are one or more methods to create nano-junctions as described above throughout the film according to a specific embodiment. In a specific embodiment, the present method forms a nanostructured morphology between the two or more materials involved in generating the photovoltaic effect. As an example, such method combines and/or mixes nanoparticles of the two or more nanostructured materials on a nanometer scale to form a nanocomposite film. An interface between nanoparticles of different materials with the appropriate energetics as described above forms such a nano-junction, many of which are located throughout the nanocomposite film. The nanoparticles can also be of any shape: spherical, oblate, rods, tubes, belts, rings, plates, etc. Of course, there can be other variations, modifications, and alternatives.

In a specific embodiment, the present method and structure can also be formed to overcome any limitations that the carrier transport may not be as efficient as possible, relying to a degree on ineffective hopping transport from one nanoparticle to another nanoparticle. As an example, the present method and structure is provided to increase the contact or interfacial area between nanoparticles to overcome many if not all of these limitations. In a specific embodiment, the present method can include a process of sintering the resultant nanoparticle film, which can be done significantly below the melting point, such that the constituent nanoparticles are more connected and over a larger interfacial area. Another method according to a specific embodiment includes application of force (e.g., pressure) to the film, which achieves results similar to sintering. Heat and pressure can also be applied in combination to achieve the desired morphology under milder conditions according to a method of the present invention. These methods increase the contact between nanoparticles by providing a larger interfacial area and a more spatially extended nanostructure, which in turn enables more effective carrier transport and higher carrier mobilities. In addition, by controlling the sintering conditions and/or the pressure conditions, the carrier mobilities can be engineered to desired values. Of course, there can be other variations, modifications, and alternatives.

Another method to significantly improve carrier transport is to use more extended nanoparticles, e.g., spatially extended from others. In a specific embodiment, the extended nanoparticles and/or nanostructures can include, but are not limited to, nano-columns, nanotubes, etc. that are directed largely in the direction of the desired carrier transport, which is often perpendicular to the film surface, and are ideally sufficiently long to extend nearly through the film thickness. These extended nanostructures enable carriers to transport effectively through a single, spatially extended nanostructure, thus eliminating the need for hopping transport to a large degree. Also, the interface between the extended nanostructures and the other materials with the proper energetics as described above, form a nano-junction, which can exist throughout the film. The other materials of this nanocomposite can also be extended nanostructures and/or nanoparticles that are greatly connected by sintering and/or through the application of pressure. Thus, extended nanostructures significantly improves carrier transport, particularly transport to the collection electrodes. Of course, there can be other variations, modifications, and alternatives.

Depending upon the embodiment, other benefits may be achieved. That is, an added advantage of one or more of these methods to create nano-junctions located every few nanometers in the film is the enhanced absorption. The nanostructured morphology scatters light and provides multiple passes through the absorber, essentially leading to an effectively larger optical density or absorption. Of course, there can be other variations, modifications, and alternatives.

In another embodiment, the absorption coefficient of the absorber material is sufficiently large such that the film thickness required to absorb substantially all of the solar light is comparable to or is a few times the carrier diffusion length. In this embodiment, nanojunctions throughout the film may not be necessary. The film is sufficiently thin to allow efficient carrier transport from one side of the film to the other to be collected by the electrode. For this to occur, the absorption coefficient of the absorber material should be about $10^4$ cm$^{-1}$ or $10^5$ cm$^{-1}$ or larger over as much of the solar spectrum as possible (~400 nm to ~1000 nm). Examples of such materials include nanostructured Si, Ge, Si/Ge alloys, CuO, FeO, $Cu_2S$, $Cu_2O$, $FeS_2$, SnS, $SnS_2$, ZnS, $FeSi_2$, etc. In this embodiment, the device includes a simple bi-layer film that has minimal nanostructuring of the interface between the materials of the nanocomposite. This method and structure according to a specific embodiment would be comprised of the substantially bi-layer nanocomposite sandwiched by the collection electrodes. Of course, there can be other variations, modifications, and alternatives.

Another embodiment of the invention, which improves the performance of many if not all embodiments of PV devices described thus far, includes a carrier blocking material, which prevents carriers from transporting to the wrong electrode. The carrier blocking material can be placed on the appropriate side of the photoactive nanocomposite materials described above. The hole blocking layer is placed between the photoactive nanocomposite and the electron collection electrode, and the electron blocking layer is placed between the nanocomposite and the hole collection electrode. This increases the asymmetry of carrier collection, which improves PV performance such as increasing $V_{OC}$. Either or both carrier blocking layers can be used. The barriers that effect the carrier blocking can be engineered through quantum size effects that shift the LUMO and HOMO levels as described above. Of course, there can be other variations, modifications, and alternatives.

In a preferred embodiment, the carrier blocking layers also transport the appropriate carrier, i.e., the hole blocking layer also transport electrons and thus forms an electron transporting hole blocking material (ETHBM), and the electron blocking layer also transports hole and thus forms a hole transporting electron blocking material (HTEBM). Examples of ETHBM that are appropriate to the embodiments described above include $ZnO$, $TiO_2$, $SnO_2$, $WO_3$, $Fe_2O_3$, etc. Examples of HTEBM that are appropriate to the embodiments described above include NiO, $Cu_2O$, CuI, CuPc, ZnPc, CuSCN, etc. Of course, there can be other variations, modifications, and alternatives.

In another embodiment, the carrier blocking and/or carrier transporting layers also function as a buffer layer to prevent unwanted diffusion of materials such as metals from the electrodes or other materials in the device across the device into other regions of the device. In another embodiment, the carrier blocking and/or carrier transporting layers also function as buffers to mitigate electrical shorting or shunting of the device. Thus, in the most preferred embodiment, the carrier blocking/transporting materials serve multiple functions: transporting carriers, blocking undesired carriers, preventing material diffusion through the device, and mitigating electrical shorting or shunts through the device.

Further, all materials described or selected above in various embodiments of this invention can be synthesized and processed into thin films or other structures required for PV using low cost processing that includes solution techniques that include solution syntheses, electrochemistry, electrophoresis, sol-gel processing, doctor blading, ink jet printing, dipping, etc.

Further, all materials described or selected above in various embodiments of this invention are relatively non-toxic, stable, and exist in abundant supply in the Earth's crust.

It is also understood that the examples and embodiments described herein are for illustrative purposes only and that various modifications or changes in light thereof will be suggested to persons skilled in the art and are to be included within the spirit and purview of this application and scope of the appended claims. Further details of other examples can be found throughout the present specification and more particularly below.

EXAMPLES

To prove the principle and operation of the present invention, various examples have been described. These examples have been prepared to demonstrate methods and structures according to specific embodiments. These methods and structures are not intended to be limiting in any manner. One of ordinary skill in the art would recognize other modifications, alternatives, and variations. Before discussing the examples, the following list of definitions have been prepared. Like the examples, these definitions are not intended to be limiting and should be given meanings consistent with those interpretation made by one of ordinary skill in the art. That is, for a given word, a short description is provided in ( ) below.

Electron Transporting Material (ETM)
Hole Transporting Material (HTM)
Electron Blocking Material (EBM)
Hole Blocking Material (HBM)
Electron Transporting Hole Blocking Material (ETHBM)
Hole Transporting Electron Blocking Material (HTEBM)
Absorbing Electron Transporting Material (AETM)
Absorbing Hole Transporting Material (AHTM)
Absorbing Electron Blocking Material (AEBM)
Absorbing Hole Blocking Material (AHBM)
Absorbing Electron Transporting Hole Blocking Material (AETHBM)
Absorbing Hole Transporting Electron Blocking Material (AHTEBM)

In specific embodiments according to the present invention, both the substrate and superstrate device configuration can be implemented. In the following examples, the fabrication of only the superstrate configuration will be described, but this is not intended to be limiting and one skilled in the art will recognize that the substrate configuration can also be implemented in a manner that is a straightforward application of these examples. Of course, there can be other variations, modifications, and alternatives.

In addition, in the device configurations that are described in the examples below, a transparent conducting electrode (TCE) will be used to allow light to be transmitted to the absorber material. Two types of TCE can be used, which are n-type and p-type, i.e., those that transport or conduct negative carriers and those that transport or conduct positive carriers, respectively. Some examples of TCEs are indium tin oxide (ITO), zinc oxide doped with Al (ZnO:Al), and tin oxide doped with fluorine ($SnO_2$:F). ITO is an example of an p-type TCE, while ZnO:Al and $Sn_2O$:F are examples of n-type TCEs. In examples of device configurations where a transporting material is placed next to the TCE, an electron transporting material (such as a ETM or ETHBM, which may be undoped or n-doped) is place next to an n-type TCE, while a hole transporting material (such as a HTM or HTEBM, which may be undoped or p-doped) is placed next to a p-type TCE. For example, if a n-type material such as ZnO:Al is used as the TCE, then an electron transporting material is used, while if a p-type materials such as ITO is used as the TCE, then a hole transporting material is used. In the examples described below, an n-type TCE such as ZnO:Al will be used. This is not intended to be limiting. Other n-type TCEs and p-type TCEs can also be used, and one skilled in the art will recognize that the carrier transporting layers will switch positions, and the type of doping used will also switch, depending on the nature of the TCE.

Example 1

On a substrate, which can be any optically clear material such as glasses, fused silica, plastic, etc., a transparent conducting electrode (TCE) is deposited, which can be performed with a variety of vacuum methods such as sputtering, evaporation, and solution deposition methods. Examples of TCEs are indium tin oxide (ITO), zinc oxide doped with Al (ZnO:Al), and tin oxide doped with fluorine ($SnO_2$:F). In these examples, we use ZnO:Al.

A layer of nanoparticles (NPs) of a first material is then deposited on the TCE. The thickness of this film can range from about 50 nm to about 1000 nm. This is performed using a colloidal suspension of the NPs and with various types of solution deposition processes such as spin coating, spraying, ink jet printing, dipping, doctor blading, electrophoresis, electrochemical deposition, etc. The first material deposited can be metal oxides such as $ZnO$, $TiO_2$, $SnO_2$, $WO_3$, $Fe_2O_3$, etc. Alternatively, the first material can be metal sulfide such as $FeS_2$, SnS, $Cu_2S$. The metal oxide NPs or the metal sulfide NPs are then sintered for a period of time ranging from about 5 minutes to about 3 hours at a temperature ranging from about 100° C. to about 700° C., or preferably from about 100° C. to about 600° C., or more preferably from about 100° C. to about 500° C. This sintering process can be performed either in an oven or via programmed rapid thermal annealing, the goal of which is to slightly fuse or interconnect together the NPs. Instead of heat sintering, the interconnection of the NPs can also be achieved by applying pressure to the film. The applied pressure can range from 100 kg/cm$^2$ to 2000 kg/cm$^2$ and can be applied to the film with a mechanical press or with an isostatic press.

NPs of a second material is then deposited, infusing these NPs of a second material within the nanopores formed by NPs of the first material deposited. These NPs of a second material can be deposited in a similar fashion as the NPs of the first material. The second material can be Si, Ge, SiGe alloys, metal oxides such as CuO, $Cu_2O$, FeO, $Fe_2O_3$, metal sulfides such as $Cu_2S$, $SnS_2$, ZnS and the like. NPs of the second material are then sintered in a manner similar to that performed on NPs of the first material. The combination of NPs of the first material and NPs of the second material sintered comprises a nanocomposite film.

Finally, a top electrode is deposited on the nanocomposite film. This top electrode can be deposited by methods such as sputtering, evaporation, screen printing, painting, foil lamination, etc.

Example 2

In another embodiment of Example 1, NPs of the first material and NPs of the second material are deposited together in a fashion similar to the deposition of NPs of the first material in Example 1. As in Example 1, both are then sintered for the specified time and temperature or by applying pressure.

Example 3

Begin with the TCE coated substrate of Example 1. A film of electron transporting hole blocking material (ETHBM) is deposited using vacuum techniques such as sputtering or evaporation or solution deposition techniques with a thickness ranging from about 100 nm to about 1000 nm. The ETHBM can be metal oxides such as ZnO, $TiO_2$, $SnO_2$, $WO_3$, $Fe_2O_3$, etc, and can be undoped or n-doped. The nanocomposite film described in Example 1 is then processed on the ETHBM. Finally, a top electrode is deposited on the nanocomposite film. This top electrode can be deposited by methods such as sputtering, evaporation, screen printing, painting, foil lamination, etc.

Example 4

Begin with the device in Example 3 before deposition of the top electrode. A layer of hole transporting electron blocking material (HTEBM) is deposited on the nanocomposite layer using vacuum techniques such as sputtering or evaporation or solution deposition techniques with a thickness ranging from about 100 nm to about 1000 nm. Examples of HTEBM are NiO, $Cu_2O$, CuI, CuSCN, CuPc, ZnPc, etc and can be p-doped or undoped. Finally, a top electrode is deposited on the HTEBM. This top electrode can be deposited by methods such as sputtering, evaporation, screen printing, painting, foil lamination, etc.

Example 5

Begin with the device in Example 1 before deposition of the top electrode. A layer of hole transporting electron blocking material (HTEBM) is deposited on the nanocomposite layer using vacuum techniques such as sputtering or evaporation or solution deposition techniques with a thickness ranging from about 100 nm to about 1000 nm. Examples of HTEBM are NiO, $Cu_2O$, CuI, CuSCN, CuPC, ZnPc, etc and can be undoped or p-doped. Finally, a top electrode is deposited on the HTEBM. This top electrode can be deposited by methods such as sputtering, evaporation, screen printing, painting, foil lamination, etc.

Example 6

Begin with the TCE coated substrate of Example 1. A layer comprised of a mixture of NPs of a first material, NPs of a second material, and NPs of a third material is deposited, with this layer comprising a nanocomposite. The first material is an ETHBM, the second material is an absorber, and the third material is a HTEBM. These three types of NPs can be deposited with a variety of methods. One embodiment involves forming a colloidal suspension of NPs of all three materials. NPs of all three materials are then deposited on the TCE coated substrate through a variety of solution deposition techniques such as spin coating, spraying, dipping, ink jet printing, doctor blading, electrophoresis, electrochemical deposition, etc. Finally, a top electrode is deposited on the nanocomposite film. This top electrode can be deposited by methods such as sputtering, evaporation, screen printing, painting, foil lamination, etc.

Example 7

In another embodiment of Example 6, a ETHBM is placed between the TCE and the nanocomposite using vacuum techniques such as sputtering or evaporation or solution deposition techniques. Examples of ETHBM are ZnO, $TiO_2$, $SnO_2$, $WO_3$, etc., and can be undoped or n-doped.

Example 8

In another embodiment of Example 6, a HTEBM is placed between the nanocomposite and the top electrode using vacuum techniques such as sputtering or evaporation or solution deposition techniques. Examples of HTEBM are NiO, $Cu_2O$, CuI, CuSCN, CuPc, ZnPc, etc and can be undoped or p-doped.

Example 9

In another embodiment of Example 6, an ETHBM is placed between the TCE and nanocomposite, and a HTEBM is placed between the nanocomposite and the top electrode using vacuum techniques such as sputtering or evaporation or solution deposition techniques. Examples of ETHBM are ZnO, $TiO_2$, $SnO_2$, $WO_3$, $Fe_2O_3$, etc., and can be undoped or n-doped. Examples of HTEBM are NiO, $Cu_2O$, CuI, CuSCN, CuPc, ZnPc, etc and can be undoped or p-doped.

Example 10

Begin with the TCE coated substrate of Example 1. A layer comprised of NPs of an ETHBM is deposited on the TCE using solution deposition methods. Examples of ETHBM are ZnO, $TiO_2$, $SnO_2$, $WO_3$, $Fe_2O_3$, etc., and can be undoped or n-doped. A second layer of NPs of an absorbing material is deposited on the layer of ETHBM using solution deposition methods. Examples of absorbing materials are Si, Ge, SiGe alloys, CuO, $Cu_2O$, FeO, $Fe_2O_3$, $Cu_2S$, etc. A third layer of NPs of a HTEBM is deposited on the layer of absorbing material using solution deposition methods. Examples of HTEBM are NiO, CuI, CuSCN, CuPc, ZnPc, etc and can be undoped or p-doped. The combination of these three layers comprises a multilayer nanocomposite. The thickness of each of these layers range from about 50 nm to about 5000 nm, more preferably from about 50 nm to about 1000 nm, and most preferably from about 50 nm to about 500 nm. Each of these layers of NPs can be sintered sequentially after deposition of each layer of NPs. A sintering process can also be performed after two of the layers are deposited, then another sintering process following the deposition of the third layer. A sintering process can also be performed after the deposition of all three layers. Finally, a top electrode is deposited on the nanocomposite film. This top electrode can be deposited by methods such as sputtering, evaporation, screen printing, painting, foil lamination, etc.

Example 11

In another embodiment of Example 10, a ETHBM is placed between the TCE and the multilayer nanocomposite using vacuum methods such as sputtering or evaporation, or solution deposition methods. Examples of ETHBM are ZnO, $TiO_2$, $SnO_2$, $WO_3$, $Fe_2O_3$ etc, and can be undoped or n-doped.

Example 12

In another embodiment of Example 10, a HTEBM is placed between the multilayer nanocomposite and the top electrode using vacuum methods such as sputtering or evaporation, or solution deposition methods. Examples of HTEBM are NiO, $Cu_2O$, CuI, CuSCN, CuPc, ZnPc, etc and can be undoped or p-doped.

Example 13

In another embodiment of Example 10, an ETHBM is placed between the TCE and the multilayer nanocomposite, and a HTEBM is placed between the multilayer nanocomposite and the top electrode using vacuum methods such as sputtering or evaporation, or solution deposition methods. Examples of ETHBM are ZnO, $TiO_2$, $SnO_2$, $WO_3$, $Fe_2O_3$, etc, and can be undoped or n-doped. Examples of HTEBM are NiO, $Cu_2O$, CuI, CuSCN, CuPc, ZnPc, etc and can be undoped or p-doped.

Example 14

Begin with the TCE coated substrate of Example 1. Deposit a layer of extended nanostructures such as nano-columns, nanotubes, etc. that are substantially vertical but are not required to be exactly vertical to the film. Examples of materials that can be used for these extended nanostructures include metal oxides such as ZnO, $TiO_2$, $SnO_2$, $WO_3$, and $Fe_2O_3$, metal sulfides such as $FeS_2$, SnS, semiconductor materials comprising Group IV semiconductor species such as $FeSi_2$, and can be undoped or n-doped. A thin film comprised of the same material as the extended nanostructures may also be first deposited on the TCE, then the extended nanostructures are grown on this thin film. This thin film may be formed by sintering a layer of NPs of the material or by vacuum methods such as sputtering or evaporation, or solution deposition methods. This thin film and/or the extended nanostructures also serve as the ETHBM. The extended nano-structures can be grown or deposited by a variety of methods. One embodiment involves solution growth techniques. One example of such a method (preferred embodiment) involves dipping the TCE coated substrate, with or without a thin film of the material comprising the extended nanostructures, into an appropriate growth medium such as that comprised of an aqueous alkaline solution (e.g., an aqueous NaOH solution) containing metal salt precursor such as zinc acetate to deposit ZnO nano-columns.

A second material is then infused into the nanovoids formed by the extended nanostructures, and the second material extends beyond the extended nanostructures or completely covers the extended nanostructures. This second material can be Si, Ge, SiGe alloys, CuO, $Cu_2O$, FeO, $Fe_2O_3$, $Cu_2S$, $SnS_2$, ZnS, etc. This second material can be deposited with a number of methods. One method uses a colloidal suspension of NPs of the material. The colloidal suspension can be used to infuse the second material into the nanovoids by methods such as spin coating, spraying, dipping, ink jet printing, doctor blading, electrophoresis, electrochemical deposition, etc. After the second material is infused, the second material is sintered for a period of time ranging from about 5 minutes to about 3 hours at a temperature ranging from about 100° C. to about 700° C., or preferably from about 100° C. to about 600° C., or more preferably from about 100° C. to about 500° C. This sintering process can be performed either in an oven or via programmed rapid thermal annealing, the goal of which is to slightly fuse or interconnect together the NPs. Instead of heat sintering, the interconnection of the NPs can also be achieved by applying pressure to the film. Pressure can range from about 100 $kg/cm^2$ to about 2000 $kg/cm^2$ and can be applied to the film with a mechanical press or with an isostatic press.

Another method to deposit the second material involves electrochemical deposition using an aqueous solution of the appropriate precursor material. A standard three-electrode or two-electrode electrochemical cell can be used. One electrode, or the working electrode is comprised of the extended nanostructures of the first material, which has been coated on the TCE layer on the substrate. The reference electrode is a standard saturated calomel electrode (SCE) or a standard hydrogen electrode (SHE). The counter electrode is a metal such as platinum, gold, etc. The precursor material can be a variety of materials. In the case of Si, it could be various silanes such as halo-silanes and organo-silanes, poly-silanes. In the case of Ge, it could be various germanes such as halo-germanes and organo-germanes, or poly-germanes. In the case of CuO, it could be various copper (II) salts such as copper (II) acetate and copper (II) sulfate, and Cu (II) tartrate. In the case of $Cu_2O$, it could be various copper (I) salts such as copper (I) chloride and copper (I) nitrate. In the case of FeO, it could be various iron (II) salts such as iron (II) chloride. In the case of $Fe_2O_3$, it could be various iron (III) salts such as iron (III) chloride. In the case of copper (I) sulfide, it could be various copper (I) salts such as copper (I) chloride and copper (I) nitrate.

Finally, a top electrode is deposited on the second material. This top electrode can be deposited by methods such as sputtering, evaporation, screen printing, painting, foil lamination, etc.

Example 15

A device similar to that described in Example 14 is constructed except that a third material that is a hole transport electron blocking material (HTEBM) is deposited on the second material before the top electrode is deposited. This is deposited using vacuum methods such as sputtering or evaporation, or solution deposition methods. This third material can be a variety of materials such as NiO, $Cu_2O$, CuI, CuSCN, CuPc, ZnPc, etc. Finally, a top electrode is deposited on the third material. This top electrode can be deposited by methods such as sputtering, evaporation, screen printing, painting, foil lamination, etc.

Example 16

A device similar to that described in Example 14 is constructed except that the second material does not fill the nanovoids completely, but rather is deposited to coat the extended nanostructures with a thin film of the second material, leaving nanovoids still remaining between or within the extended nanostructures. A third material that is a HTEBM such as described in Example 15 is then deposited within these nanovoids to a level above that of the extended nanostructures. Finally, a top electrode is deposited on the third material. This top electrode can be deposited by methods such as sputtering, evaporation, screen printing, painting, foil lamination, etc.

Example 17

Begin with the TCE coated substrate of Example 1. A film of electron transporting hole blocking material (ETHBM) is deposited using vacuum methods such as sputtering or evaporation, or solution deposition methods with a thickness ranging from about 100 nm to about 1000 nm. The ETHBM can be metal oxides such as ZnO, $TiO_2$, $SnO_2$, $WO_3$, $Fe_2O_3$, etc, and can be undoped or n-doped. A thin absorbing film is deposited on the ETHBM. This absorbing material can be Si, Ge, SiGe alloys, CuO, $Cu_2O$, FeO, $Fe_2O_3$, $Cu_2S$, $FeS_2$, SnS, etc. This thickness of this absorbing material can range from about 50 nm to about 5000 nm. This material can be deposited with a number of methods as described in Example 14. A film of hole transporting electron blocking material (HTEBM) is deposited on the absorbing material using vacuum methods such as sputtering or evaporation, or solution deposition methods with a thickness ranging from about 100 nm to about 1000 nm. The HTEBM and can be a variety of materials such as NiO, $Cu_2O_3$, CuI, CuSCN, CuPC, etc. Finally, a top electrode is deposited on the third material. This top electrode can be deposited by methods such as sputtering, evaporation, screen printing, painting, foil lamination, etc.

Example 18

Device of Example 17 but without the ETHBM.

Example 19

Device of Example 17 but without the HTEBM.

Example 20

This device configuration is similar to Example 3 except for the nanocomposite material. In this example, the nanocomposite material is comprised of a first material that is nanoporous in which its nanopores are filled with a second material using solution deposition methods. Examples of the first material that can be made nanoporous are Si, Ge, SiGe alloys, metal oxides such as ZnO, $TiO_2$, $SnO_2$, $WO_3$, $Fe_2O_3$, metal sulfides such as $FeS_2$, SnS, $Cu_2S$, semiconductor material comprising Group IV semiconductor species such as $FeSi_2$, etc. In one embodiment, the nanopores of nanoporous Si are filled with Ge. In another embodiment, the nanopores of nanoporous Ge are filled with Si. In another embodiment, the nanopores of nanoporous Si or nanoporous Ge are filled with metal oxides such as ZnO, $TiO_2$, $SnO_2$, $WO_3$, $Fe_2O_3$, etc. In another embodiment, the nanopores of nanoporous metal oxides such as ZnO, $TiO_2$, $SnO_2$, $WO_3$, $Fe_2O_3$, etc. are filled with one of the following: Si, Ge, SiGe alloys, CuO, $Cu_2O$, FeO, $Fe_2O_3$, $Cu_2S$.

Example 21

This device configuration is similar to Example 20 except that a layer of hole transporting electron blocking material (HTEBM) is placed between the nanocomposite and the top electrode. This HTEBM is deposited using vacuum methods such as sputtering or evaporation, or solution deposition methods with a thickness ranging from about 100 nm to about 1000 nm. Examples of HTEBM are NiO, $Cu_2O_3$, CuI, CuSCN, CuPc, ZnPc, etc. Finally, a top electrode is deposited on the HTEBM. This top electrode can be deposited by methods such as sputtering, evaporation, screen printing, painting, foil lamination, etc.

Example 22

Device of Example 21 but without the ETHBM.

It is also understood that the examples and embodiments described herein are for illustrative purposes only and that various modifications or changes in light thereof will be suggested to persons skilled in the art and are to be included within the spirit and purview of this application and scope of the appended claims. That is, although the invention has been described in terms of nanocomposites and/or materials, it would be appreciated that bulk materials can also be used.

What is claimed is:

1. A photovoltaic composite material, comprising:
a first structured material disposed directly on an underlying electrode and having a planar first surface and an opposing second surface, wherein the first structured material is disposed such that the first surface of the first structured material is in direct contact with an upper surface of the underlying electrode along the entire upper surface;
a second structured material disposed directly on the first structured material; and
a third structured material disposed directly on the second structured material, the third structured material having a planar top surface and an opposing bottom surface, wherein the top surface of the third structured material is in direct contact with a second electrode along an entire lower surface of the second electrode;
an intermixed region provided by the first structured material, the second structured material and the third structured material;
a first electron affinity and a first ionization potential characterizing the first structured material; a second electron affinity and a second ionization potential characterizing the second structured material; a third electron affinity and a third ionization potential characterizing the third structured material, whereupon the first electron affinity being less than the second electron affinity being less than the third electron affinity, and the first ionization potential being less than the second ionization potential being less than the third ionization potential, and the third electron affinity being less than the first ionization potential; and
an optical absorption coefficient of at least $10^3$ cm$^{-1}$ for light comprised of wavelengths within the range of about 400 nm to about 700 nm characterizing at least one, two or all three of the first structured material, the second structured material, and the third structured material.

2. The photovoltaic composite material of claim 1 wherein the first structured material comprises at least one of nano-particles, quantum dots, quantum wires, nano-columns, nanorods, nanotubes, quantum wells, nanoshells, or nano-belts.

3. The photovoltaic composite material of claim 1 wherein the intermixed region is characterized by a thickness in the range of between 1 nanometer and 50 nanometers.

4. The photovoltaic composite material of claim 1 wherein a thickness of the first structured material is more than a carrier diffusion length of a carrier in the first structured material.

5. The photovoltaic composite material of claim 1 wherein each of the first structured material, the second structured material, and the third structured material has one or more nano-junctions such that all optically generated carriers are within a diffusion length of a nano-junction, wherein each of the nano junctions is configured to provide charge separation for the optically generated carriers.

6. The photovoltaic composite material of claim 1 wherein the underlying electrode layer comprises a light blocking material.

7. The photovoltaic composite material of claim 1 wherein the underlying electrode layer comprises a light reflecting material.

* * * * *